(12) United States Patent
Kawamura et al.

(10) Patent No.: US 6,331,375 B1
(45) Date of Patent: Dec. 18, 2001

(54) PHOTOSENSITIVE LITHOGRAPHIC FORM PLATE USING AN IMAGE-FORMING MATERIAL

(75) Inventors: Koichi Kawamura; Hidekazu Oohashi, both of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/525,169

(22) Filed: Mar. 14, 2000

Related U.S. Application Data

(63) Continuation-in-part of application No. 09/259,345, filed on Mar. 1, 1999.

(30) Foreign Application Priority Data

| Feb. 27, 1998 | (JP) | 10-47713 |
| Mar. 23, 1998 | (JP) | 10-74630 |
| Dec. 25, 1998 | (JP) | 10-371209 |
| Jan. 14, 1999 | (JP) | 11-8488 |

(51) Int. Cl.[7] ..................................... G03C 1/00
(52) U.S. Cl. ........................ 430/270.1; 430/926
(58) Field of Search .................. 430/270.1, 302, 430/915, 920, 926

(56) References Cited

U.S. PATENT DOCUMENTS

| 5,605,780 | 2/1997 | Burberry et al. ................. 430/278.1 |
| 5,976,658 | 11/1999 | Tomizawa et al. ................. 428/64.1 |
| 6,159,657 | * 12/2000 | Fleming et al. .................... 430/270.1 |

FOREIGN PATENT DOCUMENTS

| 0566103A1 | 10/1993 | (EP) . |
| 0652483A1 | 5/1995 | (EP) . |
| 0703499A1 | 3/1996 | (EP) . |
| 0784233A1 | 7/1997 | (EP) . |
| 0 938 972 A1 | * 9/1999 | (EP) . |

OTHER PUBLICATIONS

Narayanan, Narasimhachari, and Gabor Patonay. "A New Method for the Synthesis of Heptamethine Cyanine Dyes: Synthesis of New Near–Infrared Fluorescent Labels." J. Org. Chem. 60 (1995): 2391–2395.*

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A photosensitive lithographic form plate that can be directly prepared by using digital signals from a computer or the like by using an infrared laser or the like (i.e., a photosensitive lithographic form plate that can be directly prepared), through using an image-forming material that can be directly inscribed with heat generated by irradiation of a laser light and is suitable for use in a lithographic form plate. The image-forming material used in the present invention comprises an infrared light absorbing agent having a hydrophobic group which changes to hydrophilic due to heat. The image-forming material may further contain a macromolecular binder insoluble in water and soluble in an aqueous solution of an alkali, or a macromolecular binder that is decomposed by heat or with an acid and becomes soluble in water or an alkali. In an exposed portion of the photosensitive layer, the infrared light absorbing agent is decomposed due to heat by irradiation of infrared light, and an acid is generated.

10 Claims, No Drawings

PHOTOSENSITIVE LITHOGRAPHIC FORM PLATE USING AN IMAGE-FORMING MATERIAL

The present application is a Continuation-In-Part of application Ser. No. 09/259,345, filed on Mar. 1, 1999, the contents of which are hereby incorporated by reference.

FIELD OF THE INVENTION

The present invention relates to a photosensitive lithographic form plate using an image-forming material, and more particularly, to a photosensitive lithographic form plate which uses an image-forming material, which can be inscribed by light such as a laser light and by heat generated by irradiation of a laser light and is suitable as a material for the lithographic form plate, and which plate can be used for direct preparation of plates from digital signals of a computer or the like by using an infrared laser, i.e., a photosensitive lithographic form plate that can be directly prepared.

DESCRIPTION OF THE RELATED ART

In preparation of a form plate for printing, a developing step and a finishing step must be conducted as wet processes after the step of exposure to light. In the developing step, a portion of an image-recording layer disposed on the surface of a substrate is removed to leave the remaining portion in an image form. In the finishing step, the developed form plate is washed with water and treated with a rinsing liquid containing a surfactant and with a desensitizing liquid containing gum arabic and a starch derivative.

In the field of form plate preparation and printing, a problem of environmental pollution arises because the waste water is alkaline. At the same time, streamlining of operations for preparation of form plates is being promoted. Therefore, a form plate that does not require the complicated wet developing processes described above and can be used as a machine plate for printing directly after exposure to light, i.e., a form plate that can be directly prepared, has been desired.

Progress in laser technology in recent years has been remarkable. In particular, solid lasers and semiconductor lasers, which can emit infrared light of a wavelength in a range of 760 to 1200 nm and which have a high output and are of a small size, are easily available. When a form plate is prepared directly from digital data of a computer or the like, the above laser is very useful as the light source for recording. Instruments for preparation of form plates using a semiconductor laser that generates light of about 830 nm and a YAG laser that generates light of about 1064 nm are commercially available.

However, many photosensitive recording materials of practical use have sensitive wavelengths in the region of visible light, i.e., 760 nm or less, and infrared lasers cannot be used for recording images with such materials. Therefore, developing a material that can be used for recording images with an infrared laser has been desired.

As the image-forming material that can be used for recording by an infrared laser, a positive-type recording material using a tetrahydropyranyl ester as a macromolecular compound soluble in an alkali solution is described in European Patent No. 703499A1. A positive-type recording material based on abrasion by an ultraviolet laser is described in Japanese Patent Application Laid-Open No. (hereinafter, abbreviated as JP-A) 8-310148. However, form plates using the above image-forming materials have a problem in that image-forming property markedly deteriorates when the form plates are kept in a condition of a high temperature and a high humidity.

Heat sensitive positive-type image-forming materials that contain a macromolecular compound soluble in an alkali (solution) and an infrared light absorbing agent and can be inscribed by an infrared laser have also been proposed.

As examples in which the above heat sensitive positive-type image-forming material is used in a positive-type lithographic form plate sensitive to an infrared laser light, a carboxylic ester which can be decomposed with an acid is used with an infrared light absorbing colorant in an example disclosed in JP-A 7-186562 and an abrasion-type polymer and an infrared light absorbing colorant are used in an example disclosed in U.S. Pat. No. 5,605,780.

As examples in which the above material is used in a negative-type lithographic form plate sensitive to an infrared laser light, combinations of resol resins which can be thermally crosslinked, agents that generate an acid and infrared light absorbing agents are used in examples disclosed in JP-A 56-69193, JP-A 7-20629 and JP-A 7-271029.

In the above image-forming materials, images are formed by utilizing a difference in the rate of dissolution of the material in an exposed portion and in an unexposed portion. Therefore, to obtain good positive images, it is necessary that the difference in the rate of dissolution be increased. Particularly, it is necessary that the rate of dissolution in the exposed portion be increased.

However, conventional infrared light absorbing agents have a problem in that the infrared light absorbing agent does not completely lose its ability to suppress the rate of dissolution in the exposed portion because decomposition of the infrared light absorbing agent itself does not proceed so much in the exposed portion, although the infrared light absorbing agent can remarkably suppress the rate of dissolution of an alkali-soluble macromolecular compound into the alkali in the unexposed portion. In other words, the difference in the rate of dissolution in the exposed portion and in the unexposed portion is not large and excellent image formation cannot be achieved.

In short, the conventional lithographic form plates such as those described above do not have a sufficient sensitivity from a practical point of view and further improvement in sensitivity has been desired.

SUMMARY OF THE INVENTION

The present invention has been made in view of the above problems. An object of the present invention is to provide a photosensitive lithographic form plate which uses an image-forming material having properties suitable for preparing a lithographic form plate for printing (machine plate) by directly writing digital data of a computer or the like using a solid laser or a semiconductor laser emitting infrared light (that is, suitable for direct preparation of a form plate) and which shows excellent image-forming properties (sensitivity and developing latitude) and to provide a photosensitive lithographic form plate that is highly sensitive and forms no stains.

As the result of extensive studies by the present inventors, it was found that the above-mentioned disadvantages of the prior art can be overcome by using a photosensitive layer which is disposed on a (hydrophilic) substrate and which contains an infrared absorbing agent having a hydrophobic functional group which changes to hydrophilic due to heat.

Aspects of the present invention are as follows.

A first aspect of the present invention is a photosensitive lithographic form plate comprising: a substrate; and a photosensitive layer disposed on the substrate, the photosensitive layer containing an infrared light absorbing agent having a hydrophobic functional group which changes to hydrophilic due to heat.

A second aspect of the present invention is a photosensitive lithographic form plate comprising: a hydrophilic substrate; and a photosensitive layer disposed on the substrate, the photosensitive layer containing an infrared light absorbing agent having a hydrophobic functional group which changes to hydrophilic due to heat.

A third aspect of the present invention is a photosensitive lithographic form plate wherein, in the first aspect, the hydrophobic functional group which changes to hydrophilic due to heat is bound to an aromatic ring within the infrared light absorbing agent directly or via a binding group.

A fourth aspect of the present invention is a photosensitive lithographic form plate wherein, in the first aspect, the infrared light absorbing agent is represented by following general formula (1):

General Formula (1)

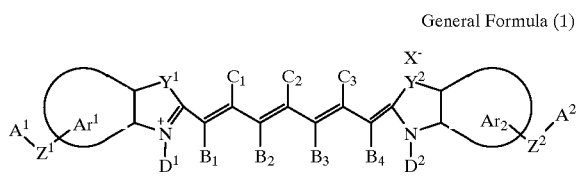

wherein $A^1$ and $A^2$ each independently represents the hydrophobic functional group which changes to hydrophilic due to heat; $Ar^1$ and $Ar^2$ each independently represents an aryl group; $B^1$, $B^2$, $B^3$, $B^4$, $C^1$, $C^2$, $C^3$ each independently represents hydrogen, a halogen, an alkyl group, an aryl group, an alkenyl group or an alkynyl group, and any two of $B^1$, $B^2$, $B^3$, $B^4$, $C^1$, $C^2$, $C^3$ may form a ring; $D^1$ and $D^2$ each independently represents an alkyl group, an aryl group, an alkenyl group, or an alkynyl group; $X^-$ represents a counter anion; and $Y^1$, $Y^2$, $Z^1$, $Z^2$ each independently represents a divalent binding group formed from nonmetal atoms.

A fifth aspect of the present invention is a photosensitive lithographic form plate wherein, in the first aspect, the photosensitive layer includes a macromolecular compound which is decomposable by at least one of heat and an acid and as a result becomes soluble in at least one of water and an alkali.

A sixth aspect of the present invention is a photosensitive lithographic form plate comprising: a substrate; and a photosensitive layer disposed on the substrate, wherein the photosensitive layer includes an image-forming material which comprises: a macromolecular binder insoluble in water and soluble in an aqueous solution of an alkali; and an infrared light absorbing agent having a thermally decomposable sulfonic ester group.

A seventh aspect of the present invention is a photosensitive lithographic form plate wherein, in the sixth aspect, before the infrared light absorbing agent is decomposed by heating, the infrared light absorbing agent has a function to decrease a rate of dissolution of the macromolecular binder into the aqueous solution of an alkali.

An eighth aspect of the present invention is a photosensitive lithographic form plate wherein, in the sixth aspect, the infrared light absorbing agent is decomposed with heating by irradiation of infrared light to form the sulfonic acid in portions of the photosensitive layer exposed to the infrared light.

A ninth aspect of the present invention is a photosensitive lithographic form plate wherein, in the sixth aspect, the thermally decomposable sulfonic ester group has a structure in which a sulfonic acid is bonded to an ester group and the ester group includes a substituted or unsubstituted primary, secondary or tertiary alkyl group, a substituted or unsubstituted aryl group, a substituted or unsubstituted alkenyl group, or a cyclic imide group.

A tenth aspect of the present invention is a photosensitive lithographic form plate comprising: a substrate and a photosensitive layer disposed on the substrate, wherein the photosensitive layer is formed with an image-forming material, the image-forming material comprising: an infrared light absorbing agent having a thermally decomposable sulfonic ester group; and a macromolecular compound which decomposes due to heat or an acid and is soluble in water or an alkali.

An eleventh aspect of the present invention is a photosensitive lithographic form plate wherein, in the tenth aspect, in the exposed portions of the photosensitive layer, decomposition of the macromolecular compound which is decomposed due to heat or an acid and becomes soluble in water or an alkali is accelerated by the sulfonic acid formed by exposure to the infrared light.

A twelfth aspect of the present invention is a photosensitive lithographic form plate wherein, in the tenth aspect, the macromolecular compound which is decomposed due to heat or an acid and becomes soluble in water or an alkali comprises a polymer of a sulfonic ester or a polymer of a carboxylic ester.

A thirteenth aspect of the present invention is a radiation-sensitive lithographic form plate comprising: a binder having a crosslinked structure which has a functional group that changes from hydrophobic to hydrophilic due to at least one of an acid, radiation and heat; and an infrared light absorbing agent having a hydrophobic functional group which changes to hydrophilic due to heat.

A fourteenth aspect of the present invention is a radiation-sensitive lithographic form plate wherein, in the thirteenth aspect, the hydrophobic functional group which changes to hydrophilic due to heat is bound to an aromatic ring within the infrared light absorbing agent directly or via a binding group.

A fifteenth aspect of the present invention is a radiation-sensitive lithographic form plate wherein, in the fourteenth aspect, the infrared light absorbing agent is represented by following general formula (1):

General Formula (1)

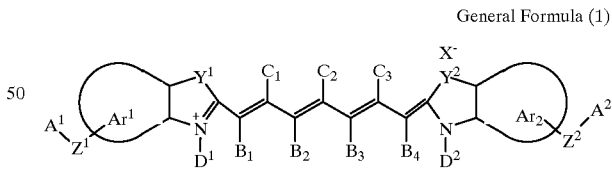

wherein $A^1$ and $A^2$ each independently represents the hydrophobic functional group which changes to hydrophilic due to heat; $Ar^1$ and $Ar^2$ each independently represents an aryl group; $B^1$, $B^2$, $B^3$, $B^4$, $C^1$, $C^2$, $C^3$ each independently represents hydrogen, a halogen, an alkyl group, an aryl group, an alkenyl group or an alkynyl group, and any two of $B^1$, $B^2$, $B^3$, $B^4$, $C^1$, $C^2$, $C^3$ may form a ring; $D^1$ and $D^2$ each independently represents an alkyl group, an aryl group, an alkenyl group, or an alkynyl group; $X^-$ represents a counter anion; and $Y^1$, $Y^2$, $Z^1$, $Z^2$ each independently represents a divalent binding group formed from nonmetal atoms.

A sixteenth aspect of the present invention is a radiation-sensitive lithographic form plate wherein, in the thirteenth aspect, the photosensitive layer includes a plurality of water-insoluble solid particles.

A seventeenth aspect of the present invention is a radiation-sensitive lithographic form plate wherein, in the sixteenth aspect, the photosensitive layer is structured such that the water-insoluble solid particles are covered by the binder and are bound together by the binder such that each particle is contacted by others at some portions and gaps are formed between the water-insoluble particles.

An eighteenth aspect of the present invention is a radiation-sensitive lithographic form plate wherein, in the thirteenth aspect, the binder is a compound which is obtained by reacting: a compound having, in the same molecule, a functional group which changes from hydrophobic to hydrophilic due to at least one of an acid, radiation and heat, and a functional group which reacts with a hydrolysis polymerizible compound represented by following general formula (2); and the hydrolysis polymerizible compound represented by following general formula (2):

$(Q^1)_n-X-(OQ^2)_{4-n}$  General Formula (2)

wherein $Q^1$ and $Q^2$ each represents an alkyl group or an aryl group and may be the same or different; X represents Si, Al, Ti, or Zr; and n is an integer of from 0 to 2.

A nineteenth aspect of the present invention is a photosensitive or radiation-sensitive lithographic form plate wherein, the infrared light absorbing agent is represented by following general formula (16):

General Formula (16)

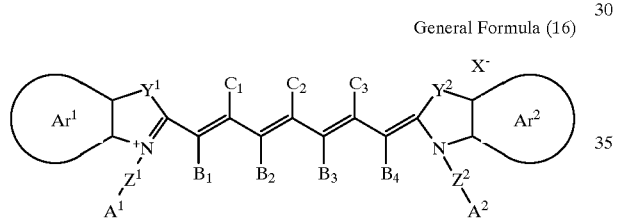

wherein $A^1$ and $A^2$ each independently represents the hydrophobic functional group which changes to hydrophilic due to heat; $Ar^1$ and $Ar^2$ each independently represents an aryl group; $B^1$, $B^2$, $B^3$, $B^4$, $C^1$, $C^2$, $C^3$ each independently represents hydrogen, a halogen, an alkyl group, an aryl group, an alkenyl group or an alkynyl group, and any two of $B^1$, $B^2$, $B^3$, $B^4$, $C^1$, $C^2$, $C^3$ may form a ring; $X^-$ represents a counter anion; and $Y^1$, $Y^2$, $Z^1$, $Z^2$ each independently represents a divalent binding group formed from nonmetal atoms.

Specifically, for example, the inventors have found that an infrared light absorbing agent (a colorant) having a specific sulfonic ester group generates a sulfonic acid by thermal decomposition and the sulfonic acid thus formed remarkably increases the rate of dissolution of a macromolecular binder soluble in an alkali. The photosensitive lithographic form plate using the image-forming material of the present invention has been completed by forming a photosensitive layer comprising the infrared light absorbing agent having such a thermally decomposable sulfonic ester group on a substrate.

A first image-forming material which contains the infrared absorbing agent of the present invention and is used in a first embodiment, comprises (A) a macromolecular binder insoluble in water and soluble in an aqueous solution of an alkali and (B) an infrared light absorbing agent having a thermally decomposable sulfonic ester group.

A second image-forming material which contains the infrared absorbing agent of the present invention and is used in a second embodiment, comprises (C) a macromolecular compound which is decomposed by heating or with an acid and becomes soluble in water or an alkali and (B) an infrared light absorbing agent having a thermally decomposable sulfonic ester group.

A third image-forming material which contains the infrared absorbing agent of the present invention and is used in a third embodiment (for a radiation-sensitive lithographic form plate), comprises: a binder having a crosslinked structure which has a functional group that changes from hydrophobic to hydrophilic due to at least one of an acid, radiation and heat; and an infrared light absorbing agent having a hydrophobic functional group which changes to hydrophilic due to heat.

The present invention may further include the following aspect.

That is, a nineteenth aspect of the present invention is a photosensitive lithographic form plate wherein, in the first aspect, the hydrophobic functional group which changes to hydrophilic due to heat is selected from the group consisting of the following structures represented by general formulas (3) through (7):

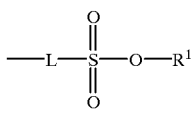 (3)

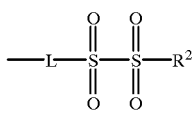 (4)

 (5)

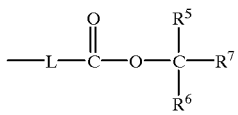 (6)

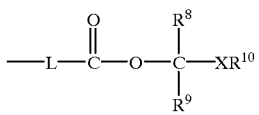 (7)

wherein L represents a polyvalent binding group formed form nonmetal atoms; $R^1$ represents an alkyl group, an aryl group, an alkenyl group, an alkynyl group, or a cyclic imide group; $R^2$ and $R^3$ represent an alkyl group, an aryl group, an alkenyl group, or an alkynyl group; $R^4$ represents an alkyl group, an aryl group, an alkenyl group, an alkynyl group, or $-SO_2-R^{11}$; $R^5$, $R^6$ and $R^7$ each independently represents an alkyl group, an aryl group, an alkenyl group, or an alkynyl group; one of $R^8$ and $R^9$ represents hydrogen, and the other represents hydrogen, an alkyl group, an aryl group, an alkenyl group, or an alkynyl group; $R^{10}$ represents an alkyl group, an alkenyl group, or an alkynyl group; $R^{11}$ represents an alkyl group, an aryl group, an alkenyl group, or an alkynyl group; of $R^5$, $R^6$ and $R^7$, any two or three may form a ring; $R^8$ and $R^{10}$, or $R^9$ and $R^{10}$, may form a ring; and X represents O or S.

In a photosensitive lithographic form plate in which the first image-forming material described above is used, the rate of dissolution of the macromolecular binder soluble in an alkali is suppressed in an unexposed portion by the infrared light absorbing agent having a thermally decomposable sulfonic ester group and the rate of dissolution of the macromolecular binder soluble in an alkali is increased in an exposed portion by the sulfonic acid formed by decomposition of the infrared light absorbing agent (a dye or a pigment). Therefore, the difference in the rate of dissolution between the two portions is large and an excellent image can be formed.

In a photosensitive lithographic form plate in which the second image-forming material described above is used, the rate of dissolution of the macromolecular compound which is decomposed by heating or with an acid and becomes soluble in water or an alkali is increased by the sulfonic acid which is formed by decomposition of the infrared light absorbing agent (the dye or the pigment) in an exposed portion. Therefore, the difference in the height of the surface in the exposed portion and in the unexposed portion increases and an excellent image can be formed.

The second image-forming material described above may further comprise an agent for generating an acid where necessary.

In summary, the photosensitive (radiation-sensitive) lithographic form plate of the present invention can directly be prepared from digital data from a computer or the like by recording by using a solid-state laser or a semiconductor laser emitting infrared light. After image recording, there is no need for special processings such as wet developing processing or rubbing or the like, and further, the sensitivity is high. Moreover, the photosensitive layer of the photosensitive lithographic form plate of the present invention includes an infrared light absorbing agent which contains a hydrophobic functional group which changes to hydrophilic due to heat. Thus, no residual film remains at the exposed portions, no scum-like solids are left in the wetting water used during printing, and stains are not formed.

Further, in the radiation-sensitive lithographic form plate of the sixteenth and seventeenth aspects of the present invention, a plurality of water-insoluble solid particles exist in the photosensitive layer. The respective water-insoluble solid particles are covered by the binder, and are bound together by the binder such that each particle is contacted by others at some portions and gaps are formed between the water-insoluble particles. As a result, the surface of the radiation-sensitive lithographic form plate is not smooth. With such a structure, if the binder covering the water-insoluble solid particles is hydrophilic, moisture is held at the gap portions between the particles and the surface of the form plate is hydrophilic, and if the binder is hydrophobic, water does not seep into the gaps between the water-insoluble solid particles, and the surface is lipophilic. Accordingly, because the surface of the radiation-sensitive lithographic form plate of the sixteenth and seventeenth aspects of the present invention changes from hydrophobic to hydrophilic due to heat, radiation or an acid, printing is possible without the need for conducting developing processing after image formation, and satisfactory printed matter can be obtained.

Further, in the radiation-sensitive lithographic form plate of the eighteenth aspect of the present invention, the hydrolysis polymerizible compound is hydrolysis polymerized, and an inorganic matrix (hydrolysis polymerization reaction product) is formed within the coated film. Thus, the film strength of the photosensitive layer on the whole improves. As a result, this radiation-sensitive lithographic form plate is extremely durable.

The mechanism of decomposition of the infrared light absorbing agent having a thermally decomposable sulfonic ester group is not clear at present. As described in a reference about thermal decomposition of sulfonic esters (T. ENDO Macromolecules 1996, 29, 3317), it can be considered that the ester portion is removed by heat via a carbocation to form the sulfonic acid.

DETAILED DESCRIPTION OF THE PREFERRED EMBODIMENTS

A photosensitive lithographic form plate in which a first image-forming material of the present invention is used is described in accordance with a first embodiment of the present invention.

First, a composition of the first image-forming material will be described in detail.

The first image-forming material described in the present embodiment comprises (A) a macromolecular binder insoluble in water and soluble in an aqueous solution of an alkali and (B) an infrared light absorbing agent having a thermally decomposable sulfonic ester group.

[(B) Infrared light absorbing agent]

The infrared light absorbing agent (hereinafter referred to as the IR absorbing agent, occasionally in the present invention) is a dye or a pigment, and has a structure in which a hydrophobic group which changes to hydrophilic due to heat is bonded to a colorant portion.

This change must be a change to the extent that, when heat is generated by light-heat conversion at the time of laser exposure, in the infrared light absorbing agent which does not exhibit affinity to water (e.g., is not soluble in water) at room temperature, the hydrophobic functional group capable of changing to hydrophilic within the infrared light absorbing agent molecule changes to a hydrophilic functional group, such that the infrared light absorbing agent exhibits affinity to water (e.g., becomes soluble in water).

The hydrophobic functional group which changes to hydrophilic due to heat is a functional group which changes to a hydrophilic functional group through either of the following processes: a process in which a side chain functional group which is originally hydrophobic reacts and changes to hydrophilic due to heat, or a process in which a side chain functional group which is originally hydrophobic decomposes and loses the hydrophobic functional group portion due to heat.

As the examples of the hydrophobic functional group which change to hydrophilic due to heat and which can be preferably used in the present invention, the hydrophobic functional group represented by the following general formulas (3)–(7) may be included.

(3)

(4)

-continued

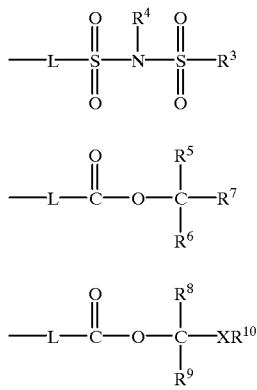

(5)

(6)

(7)

wherein L represents a polyvalent binding group formed form nonmetal atoms; $R^1$ represents an alkyl group, an aryl group, an alkenyl group, an alkynyl group, or a cyclic imide group; $R^2$ and $R^3$ represent an alkyl group, an aryl group, an alkenyl group, or an alkynyl group; $R^4$ represents an alkyl group, an aryl group, an alkenyl group, an alkynyl group, or —$SO_2$—$R^{11}$; $R^5$, $R^6$ and $R^7$ each independently represents an alkyl group, an aryl group, an alkenyl group, or an alkynyl group; one of $R^8$ and $R^9$ represents hydrogen, and the other represents hydrogen, an alkyl group, an aryl group, an alkenyl group, or an alkynyl group; $R^{10}$ represents an alkyl group, an alkenyl group, or an alkynyl group; $R^{11}$ represents an alkyl group, an aryl group, an alkenyl group, or an alkynyl group; of $R^5$, $R^6$ and $R^7$, any two or three may form a ring; $R^8$ and $R^{10}$, or $R^9$ and $R^{10}$, may form a ring; and X represents O or S.

As the colorant portion, any compound that can absorb light of wavelengths in a region of 700 to 1200 nm can be used. Preferable examples include polymethine colorants, cyanine colorants, squalilium colorants, pyrylium colorants, diimmonium colorants, phthalocyanine compounds, triarylmethane colorants, metal dithiole and carbon black. Among these compounds, polymethine colorants, cyanine colorants, squalilium colorants, pyrylium colorants, diimmonium colorants, phthalocyanine compounds and carbon black are more preferable. From the standpoint of synthesis suitability, polymethine colorants, cyanine colorants, phthalocyanine compounds and carbon black are most preferable.

As mentioned above, the change of the hydrophobic functional group to a hydrophilic state due to heat must be a change to the extent that, when heat is generated by light-heat conversion at the time of laser exposure, in the infrared light absorbing agent which does not exhibit affinity to water (e.g., is not soluble in water) at room temperature, the hydrophobic functional group capable of changing to hydrophilic within the infrared light absorbing agent molecule changes to a hydrophilic functional group, such that the infrared light absorbing agent exhibits affinity to water (e.g., becomes soluble in water).

Also as mentioned above, the hydrophobic functional group which changes to hydrophilic due to heat is to be a functional group which changes to a hydrophilic functional group through either of the following processes: a process in which a side chain functional group which is originally hydrophobic reacts and changes to hydrophilic due to heat, or a process in which a side chain functional group which is originally hydrophobic decomposes and loses the hydrophobic functional group portion due to heat.

The examples of such hydrophobic functional group which change to hydrophilic due to heat and which can be preferably used in the present invention may include the hydrophobic functional group represented by the following general formulas (3)–(7).

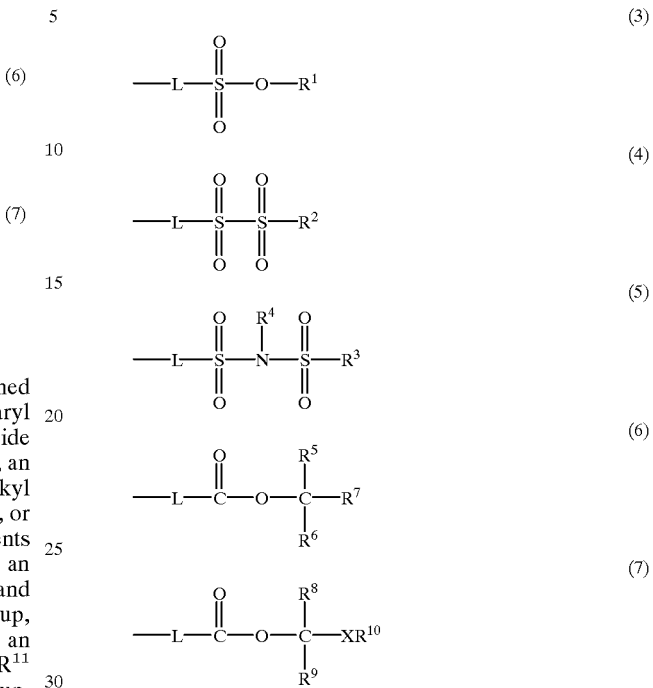

wherein L represents a polyvalent binding group formed form nonmetal atoms; $R^1$ represents an alkyl group, an aryl group, an alkenyl group, an alkynyl group, or a cyclic imide group; $R^2$ and $R^3$ represent an alkyl group, an aryl group, an alkenyl group, or an alkynyl group; $R^4$ represents an alkyl group, an aryl group, an alkenyl group, an alkynyl group, or —$SO_2$—$R^{11}$; $R^5$, $R^6$ and $R^7$ each independently represents an alkyl group, an aryl group, an alkenyl group, or an alkynyl group; one of $R^8$ and $R^9$ represents hydrogen, and the other represents hydrogen, an alkyl group, an aryl group, an alkenyl group, or an alkynyl group; $R^{10}$ represents an alkyl group, an alkenyl group, or an alkynyl group; $R^{11}$ represents an alkyl group, an aryl group, an alkenyl group, or an alkynyl group; of $R^5$, $R^6$ and $R^7$, any two or three may form a ring; $R^8$ and $R^{10}$, or $R^9$ and $R^{10}$, may form a ring; and X represents O or S.

Among hydrophobic functional groups which change to hydrophilic due to heat, a functional group which is particularly preferable from the standpoints of reactivity, storage stability, and hydrophilicity/hydrophobicity is thermally-decomposable sulfonic ester group.

The thermally decomposable sulfonic ester group described above has a structure in which a sulfonic acid is bonded to an ester group. The ester group is, for example, a substituted or unsubstituted primary, secondary or tertiary alkyl group, a substituted or unsubstituted aryl group, a substituted or unsubstituted alkenyl group, or a cyclic imide group. Among these groups, a primary alkyl group which is substituted with electron-donating groups such as the alkyl group and the alkoxy group or with electron-withdrawing groups such as the carbonyl group, the alkoxycarbonyl group, the cyano group and the halogens, secondary alkyl groups such as the cyclohexyl group, the isopropyl group and the 1-methoxy-2-propyl group and tertiary alkyl groups such as the t-butyl group are preferable.

Preferable examples of the alkyl group described as an example of the ester group of the thermally decomposable sulfonic ester group include linear, branched and cyclic alkyl groups having 1 to 20 carbon atoms. Specific examples thereof include: the methyl group, the ethyl group, the propyl group, the butyl group, the pentyl group, the hexyl group, the heptyl group, the octyl group, the nonyl group, the decyl group, the undecyl group, the dodecyl group, the tridecyl group, the hexadecyl group, the octadecyl group, the eicosyl group, the isopropyl group, the isobutyl group, the s-butyl group, the t-butyl group, the isopentyl group, the neopentyl group, the 1-methylbutyl group, the isohexyl group, the 2-ethylhexyl group, the 2-methylhexyl group, the cyclohexyl group, the cyclopentyl group and the 2-norbornyl group. Among these groups, linear alkyl groups having 1 to 12 carbon atoms, branched alkyl groups having 3 to 12 carbon atoms and cyclic alkyl groups having 5 to 10 carbon atoms are more preferable.

The alkyl group described as an example of the ester group of the thermally decomposable sulfonic ester group may be substituted. The substituent group may be a group of monovalent non-metallic atoms excluding hydrogen. Preferable examples of the group of monovalent non-metallic atoms include: halogen atoms (—F, —Br, —Cl and —I), the hydroxyl group, the alkoxy group, the aryloxy group, the mercapto group, the alkylthio group, the arylthio group, the alkyldithio group, the aryldithio group, the amino group, the N-alkylamino group, the N,N-dialkylamino group, the N-arylamino group, the N,N-diarylamino group, the N-alkyl-N-arylamino group, the acyloxy group, the carbamoyloxy group, the N-alkylcarbamoyloxy group, the N-arylcarbamoyloxy group, the N,N-dialkylcarbamoyloxy group, the N,N-diarylcarbamoyloxy group, the N-alkyl-N-arylcarbamoyloxy group, the alkylsulfoxy group, the arylsulfoxy group, the acylthio group, the acylamino group, the N-alkylacylamino group, the N-arylacylamino group, the ureido group, the N'-alkylureido group, the N',N'-dialkylureido group, the N'-arylureido group, the N',N'-diarylureido group, the N'-alkyl-N'-arylureido group, the N-alkylureido group, the N-arylureido group, the N'-alkyl-N-alkylureido group, the N'-alkyl-N-arylureido group, the N',N'-dialkyl-N-alkylureido group, the N', N'-dialkyl-N-arylureido group, the N'-aryl-N-alkylureido group, the N'-aryl-N-arylureido group, the N',N'-diaryl-N-alkylureido group, the N',N'-arylureido group, the N'-alkyl-N'-aryl-N-alkylureido group, the N'-alkyl-N'-aryl-N-arylureido group, the alkoxycarbonylamino group, the aryloxycarbonylamino group, the N-alkyl-N-alkoxycarbonylamino group, the N-alkyl-N-aryloxycarbonylamino group, the N-aryl-N-alkoxycarbonylamino group, the N-aryl-N-aryloxycarbonylamino group, the formyl group, the acyl group, the carboxyl group, the alkoxycarbonyl group, the aryloxycarbonyl group, the carbamoyl group, the N-alkylcarbamoyl group, the N,N-dialkylcarbamoyl group, the N-arylcarbamoyl group, the N,N-diarylcarbamoyl group, the N-alkyl-N-arylcarbamoyl group, the alkylsulfinyl group, the arylsulfinyl group, the alkylsulfonyl group, the arylsulfonyl group, the sulfonic group (—SO$_3$H) and groups of conjugate bases thereof (hereinafter referred to as the sulfonato group), the alkoxysulfonyl group, the aryloxysulfonyl group, the sulfinamoyl group, the N-alkylsulfinamoyl group, the N,N-dialkylsufinamoyl group, the N-arylsulfinamoyl group, the N,N-diarylsulfinamoyl group, the N-alkyl-N-arylsulfinamoyl group, the sulfamoyl group, the N-alkylsulfamoyl group, the N,N-dialkylsufamoyl group, the N-arylsulfamoyl group, the N,N-diarylsulfamoyl group, the N-alkyl-N-arylsulfamoyl group, the phosphono group (—PO$_3$H$_2$) and groups of conjugate bases thereof (hereinafter referred to as the phosphonato group), the dialkylphosphono group (—PO$_3$(alkyl)$_2$), the diarylphosphono group (—PO$_3$(aryl)$_2$), the alkylarylphosphono group (—PO$_3$(alkyl)(aryl)), the monoalkylphosphono group (—PO$_3$H(alkyl)) and groups of conjugate bases thereof (hereinafter referred to as the alkylphosphonato group), the monoarylphosphono group (—PO$_3$H(aryl)) and groups of conjugate bases thereof (hereinafter referred to as the arylphosphonato group), the phosphonoxy group (—OPO$_3$H) and groups of conjugate bases thereof (hereinafter referred to as the phosphonatoxy group), the dialkylphosphonoxy group (—OPO$_3$(alkyl)$_2$), the diarylphosphonoxy group (—PO$_3$(aryl)$_2$), the alkylarylphosphonoxy group (—OPO$_3$(alkyl)(aryl)), the monoalkylphosphonoxy group (—OPO$_3$H(alkyl)) and groups of conjugate bases thereof (hereinafter referred to as the alkylphosphonatoxy group), the monoarylphosphonoxy group (—OPO$_3$H(aryl)) and groups of conjugate bases thereof (hereinafter referred to as the arylphosphonatoxy group), the cyano group, the nitro group, the aryl group, the alkyl group, the alkenyl group, the alkynyl group, the acyl group and the alkylene group.

Preferable examples of the alkyl group described above as an example of the substituent of the alkyl group as the thermally decomposable ester group are the same as those described as the preferable examples of the alkyl groups described as the ester group of the thermally decomposable sulfonic ester group.

Preferable examples of the aryl group described above as an example of the substituent include: the phenyl group, the biphenyl group, the naphthyl group, the tolyl group, the xylyl group, the mesityl group, the cumenyl group, the chlorophenyl group, the bromophenyl group, the chloromethylphenyl group, the hydroxyphenyl group, the methoxyphenyl group, the ethoxyphenyl group, the phenoxyphenyl group, the acetoxyphenyl group, the benzoyloxyphenyl group, the methylthiophenyl group, the phenylthiophenyl group, the methylaminophenyl group, the dimethylaminophenyl group, the acetylaminophenyl group, the carboxyphenyl group, the methoxycarbonyl-phenyl group, the ethoxyphenylcarbonyl group, the phenoxycarbonylphenyl group, the N-phenylcarbamoylphenyl group, the cyanophenyl group, the sulfophenyl group, the sulfonatophenyl group, the phosphonophenyl group and the phosphonatophenyl group.

Preferable examples of the alkenyl group described above as an example of the substituent of the alkyl group as the thermally decomposable ester group include: the vinyl group, 1-propenyl group, 1-butenyl group, cinnamyl group and 2-chloro-1-ethenyl group.

Preferable examples of the alkynyl group described above as an example of the substituent of the alkyl group as the thermally decomposable ester group include the ethynyl group, 1-propynyl group, 1-butynyl group and trimethylsilylethynyl group.

In the acyl groups (G$^1$CO—) described above as examples of the substituent of the alkyl group as the thermally decomposable ester group, G$^1$ represents hydrogen or one of the alkyl groups and the aryl groups described above as preferable examples.

Preferable examples of the alkylene group described above as an example of the substituent of the alkyl group as the thermally decomposable ester group include divalent organic group obtained by replacing any one hydrogen atom of the above alkyl groups having 1 to 20 carbon atoms with a substituent. Linear alkylene groups having 1 to 12 carbon atoms, branched alkylene groups having 3 to 12 carbon atoms and cyclic alkylene groups having 5 to 10 carbon atoms are more preferable. Specific examples of preferable substituted alkyl groups which are obtained as combinations of the above substituents and the above alkyl groups include: the chloromethyl group, the bromomethyl group, the 2-chloroethyl group, the trifluoromethyl group, the methoxymethyl group, the methoxyethoxyethyl group, the allyloxymethyl group, the phenoxymethyl group, the methylthiomethyl group, the tolylthiomethyl group, the ethylaminoethyl group, the diethylaminopropyl group, the morpholinopropyl group, the acetyloxymethyl group, the benzoyloxylmethyl group, the N-cyclohexylcarbamoyloxyethyl group, the N-phenylcarbamoyloxyethyl group, the acetylaminoethyl group, the N-methylbenzoylaminopropyl group, the 2-oxoethyl group, the 2-oxopropyl group, the carboxypropyl group, the methoxycarbonylethyl group, the allyloxycarbonylbutyl group, the chlorophenoxylcarbonylmethyl group, the carbamoymethyl group, the N-methylcarbamoylethyl group, the N,N-dipropylcarbamoylmethyl group, the N-(methoxyphenyl)carbamoylethyl group, the N-methyl-N-(sulfophenyl)carbamoylmethyl group, the sulfobutyl group, the sulfonatobutyl group, the sulfamoylbutyl group, the N-ethylsulfamoylmethyl group, the N,N-dipropylsulfamoylpropyl group, the N-tolylsulfamoylpropyl group, the N-methyl-N-(phosphonophenyl)sulfamoyloctyl group, the phosphonobutyl group, the phosphonatohexyl group, the diethylphosphonobutyl group, the diphenylphosphonopropyl the group, the methylphosphonobutyl group, the methylphosphonatobutyl group, the tolylphosphonohexyl group, the tolylphosphonatohexyl group, the phosphonoxypropyl group, the phosphonatoxybutyl group, the benzyl group, phenetyl group, the α-methylbenzyl group, the 1-methyl-1-phenylethyl group, the p-methylbenzyl group, the cinnamyl group, the allyl group, the 2-propenylmethyl group, the 2-butenyl group, the 2-methylallyl group, the 2-methylpropenylmethyl group, the 2-propynyl group, the 2-butynyl group and the 3-butynyl group.

More preferable examples of the substituent of the alkyl group which was described as an example of the ester group of the above thermally decomposable sulfonic ester group include: halogen atoms (—F, —Br, —Cl and —I), the alkoxy group, the aryloxy group, the alkylthio group, the arylthio group, the N-alkylamino group, the N,N-dialkylamino group, the acyloxy group, the N-alkylcarbamoyloxy group, the N-arylcarbamoyloxy group, the acylamino group, the formyl group, the acyl group, the carboxyl group, the alkoxycarbonyl group, the aryloxycarbonyl group, the carbamoyl group, the N-alkylcarbamoyl group, the N,N-dialkylcarbamoyl group, the N-arylcarbamoyl group, the N-alkyl-N-arylcarbamoyl group, the sulfonic group, the sulfonato group, the sulfamoyl group, the N-alkylsulfamoyl group, the N,N-dialkylsulfamoyl group, the N-arylsulfamoyl group, the N-alkyl-N-arylsulfamoyl group, the phosphono group, the phosphonato group, the dialkylphosphono group, the diarylphosphono group, the monoalkylphosphono group, the alkylphosphonato group, the monoarylphosphono group, the arylphosphonato group, the phosphonoxy group, the phosphonatoxy group, the aryl group and the alkenyl group.

Examples of the aryl group which is described as an example of the ester group of the above thermally decomposable sulfonic ester group include: that having a single benzene ring, that having a condensed ring formed with 2 or 3 benzene rings and that having condensed rings formed with benzene rings and five-membered unsaturated rings. Preferable specific examples of such aryl groups include: the phenyl group, the naphthyl group, the anthryl group, the phenanthryl group, the indenyl group, the acenaphthenyl group and the fluorenyl group. Among these groups, the phenyl group and the naphthyl group are more preferable. The aryl groups include heterocyclic aryl groups in addition to the above aryl groups made of carbon rings. Examples of the heterocyclic aryl groups include: heterocyclic aryl groups having 3 to 20 carbon atoms and 1 to 5 hetero atoms such as the pyridyl group, the furyl group and groups in which a benzene ring is condensed such as the quinolyl group, the benzofuryl group, the thioxanthone group and the carbazole group.

The above aryl group as the ester group of the thermally decomposable sulfonic ester group may have a substituent on carbon atoms forming the ring of the aryl group and the substituent may be a group of non-metallic atoms excluding hydrogen. Specific examples of the group of non-metallic atoms are the same as those described as examples of the alkyl group which is described as an example of the ester group in the above thermally decomposable sulfonic ester group and the substituents therefor. Preferable examples of the above substituted aryl group include: the biphenyl group, the tolyl group, the xylyl group, the mesityl group, the cumenyl group, the chlorophenyl group, the bromophenyl group, the fluorophenyl group, the chloromethylphenyl group, the trifluoromethylphenyl group, the hydroxyphenyl group, the methoxyphenyl group, the methoxyethoxyphenyl group, the allyloxyphenyl group, the phenoxyphenyl group, the methylthiophenyl group, the tolylthiophenyl group, the ethylaminophenyl group, the diethylaminophenyl group, the morpholinophenyl group, the acetyloxyphenyl group, the benzoyloxyphenyl group, the N-cyclohexylcarbamoyloxyphenyl group, the N-phenylcarbamoyloxyphenyl group, the acetylaminophenyl group, the N-methylbenzoylaminophenyl group, the carboxyphenyl group, the methoxycarbonylphenyl group, the allyloxycarbonyl-phenyl group, the chlorophenoxycarbonylphenyl group, the carbamoylphenyl group, the N-methylcarbamoylphenyl group, the N,N-dipropylcarbamoylphenyl group, the N-(methoxyphenyl)-carbamoylphenyl group, the N-methyl-N-(sulfophenyl)carbamoylphenyl group, the sulfophenyl group, the sulfonatophenyl group, the sulfamoylphenyl group, the N-ethylsulfamoylphenyl group, the N,N-dipropylsulfamoylphenyl group, the N-tolylsulfamoylphenyl group, the N-methyl-N-(phosphonophenyl)sulfamoylphenyl group, the phosphonophenyl group, the phosphonatophenyl group, the diethylphosphonophenyl group, the diphenylphosphonophenyl group, the methylphosphonophenyl group, the methylphosphonatophenyl group, the tolylphosphonophenyl group, the tolylphosphonatophenyl group, the allyl group, the 1-propenylmethyl group, the 2-butenyl group, the 2-methylallylphenyl group, the 2-methylpropenylphenyl group, 2-propynylphenyl group, 2-butynylphenyl group and 3-butynylphenyl group.

The alkenyl group described above as an example of the ester group of the thermally decomposable sulfonic ester group is preferably an alkenyl group having a carbonyl group such as the cyclohexenyl group or the oxycylohexenyl group. The 3-oxycyclohexenyl group and the 5,5-dimethyl-3-oxycyclohexenyl group are more preferable.

The alkenyl group described above as an example of the ester group of the thermally decomposable sulfonic ester group may have a substituent. Examples of the substituent are the same as those described as the substituent of the alkyl group described as an example of the ester group of the thermally decomposable sulfonic ester group.

Examples of the cyclic imide group described above as an example of the ester group of the thermally decomposable sulfonic ester group include: cyclic imides having 4 to 20 carbon atoms such as succinimide, phthalimide, cyclohexanedicarboxylic acid imide and norbornene-dicarboxylic acid imide.

Among the substituents of alkyl groups, aryl groups and alkenyl groups described as examples of the ester group of the thermally decomposable sulfonic ester group, primary or secondary alkyl groups are more preferable from the standpoint of storage stability and thermal decomposition.

Specific examples of the thermally decomposable sulfonic ester group are shown in the following (1m-1 to 1m-34). However, the present invention is not limited to these examples.

(1m-1)
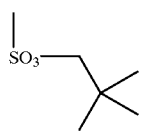

(1m-2)
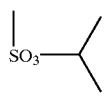

(1m-3)
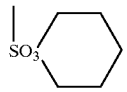

(1m-4)
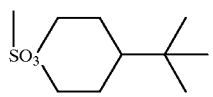

(1m-5)
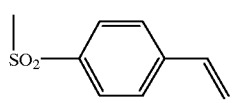

(1m-6)
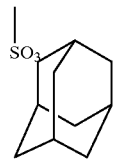

(1m-7)
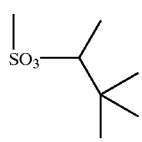

(1m-8)
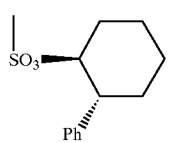

-continued (1m-9)
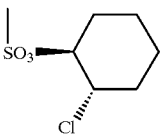

(1m-10)
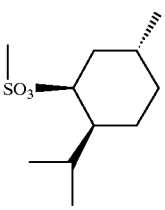

(1m-11)
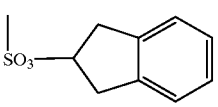

(1m-12)
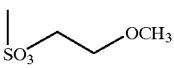

(1m-13)
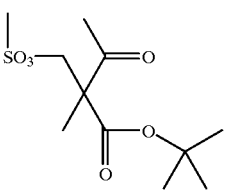

(1m-14)
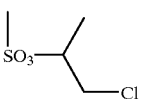

(1m-15)
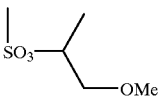

(1m-16)
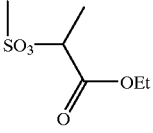

(1m-17)
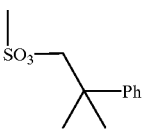

(1m-18)
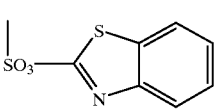

(1m-19)
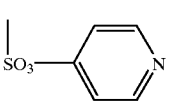

(1m-20) 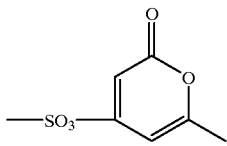
(1m-21) 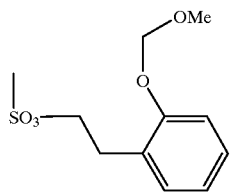
(1m-22) 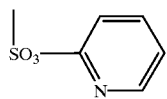
(1m-28) 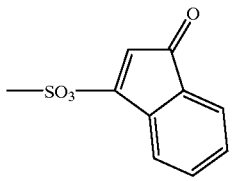
(1m-29) 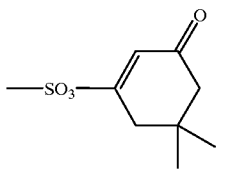
(1m-30) 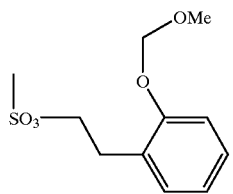
(1m-23) 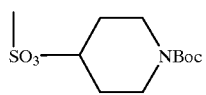
(1m-24) 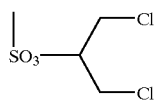
(1m-25) 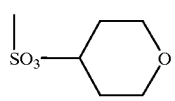
(1m-26) 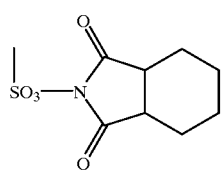
(1m-27) 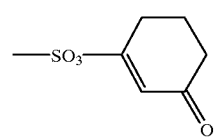
(1m-31) 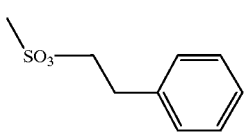
(1m-32) 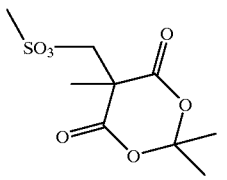
(1m-33) 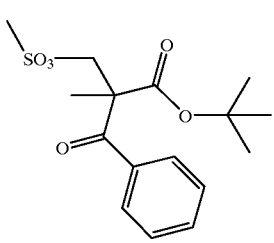
(1m-34) 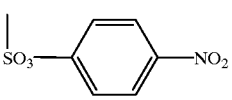
Specific examples of the infrared light absorbing agent having a hydrophobic functional group which changes to hydrophilic due to heat are shown in the following (Compounds 1 to 72). However, the present embodiment is not limited to these examples.

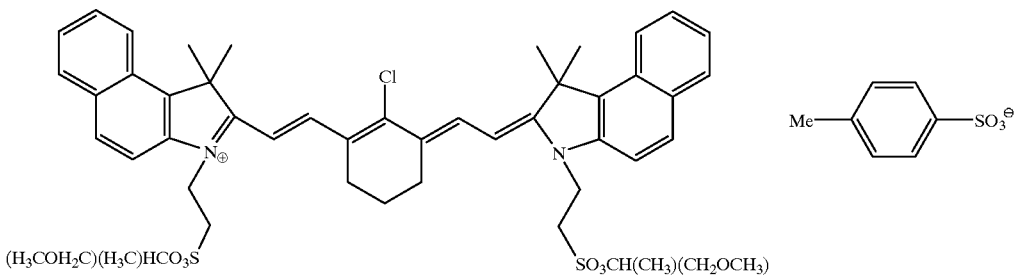
Compound 1
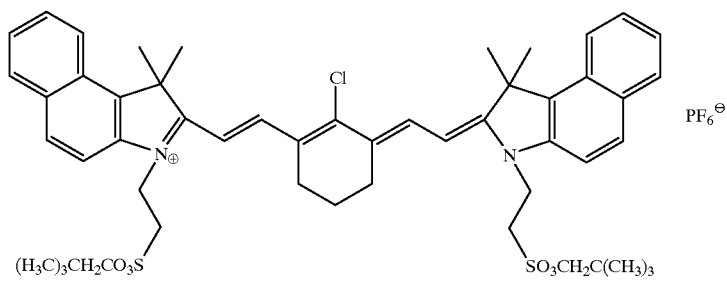
Compound 2
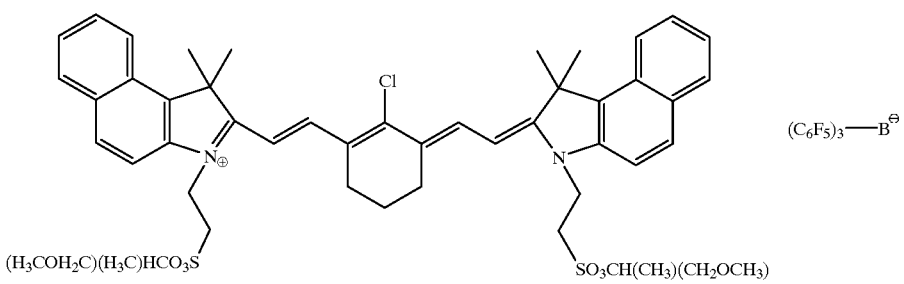
Compound 3
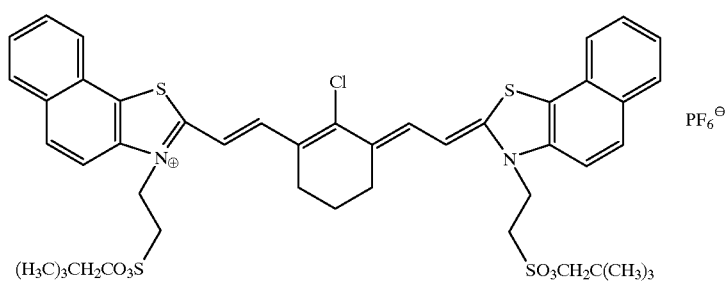
Compound 4
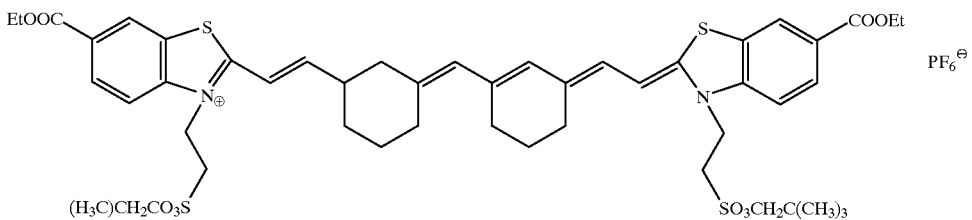
Compound 5

-continued
Compound 6
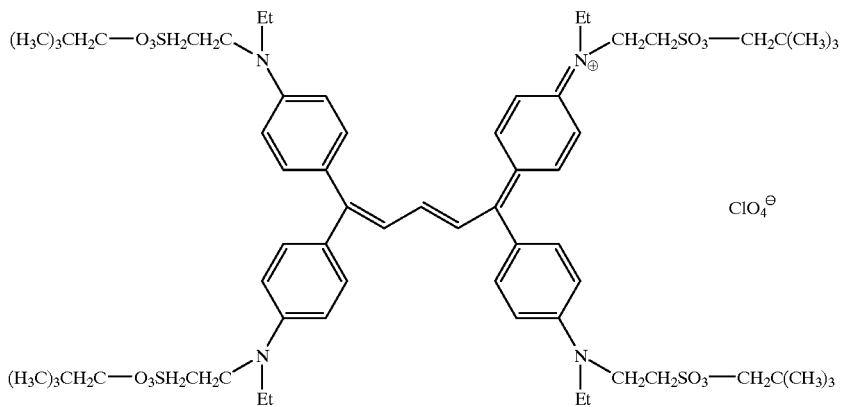
Compound 7
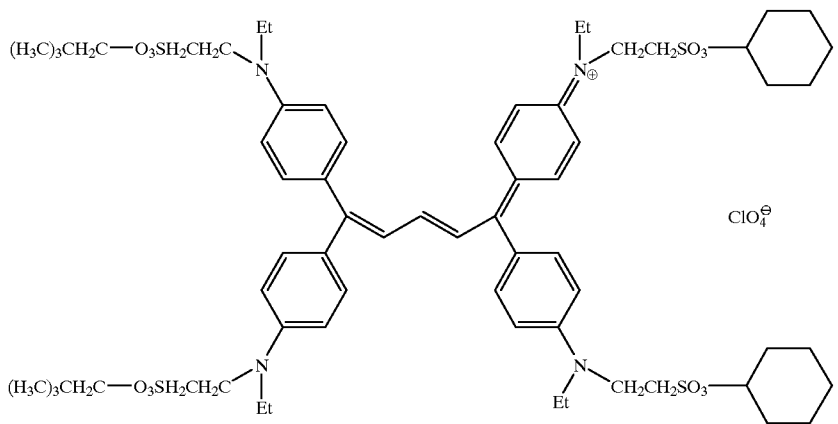
Compound 8
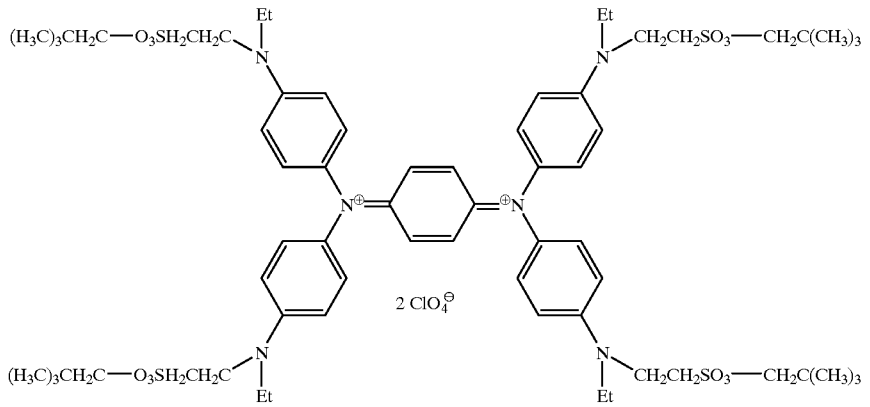

-continued
Compound 9
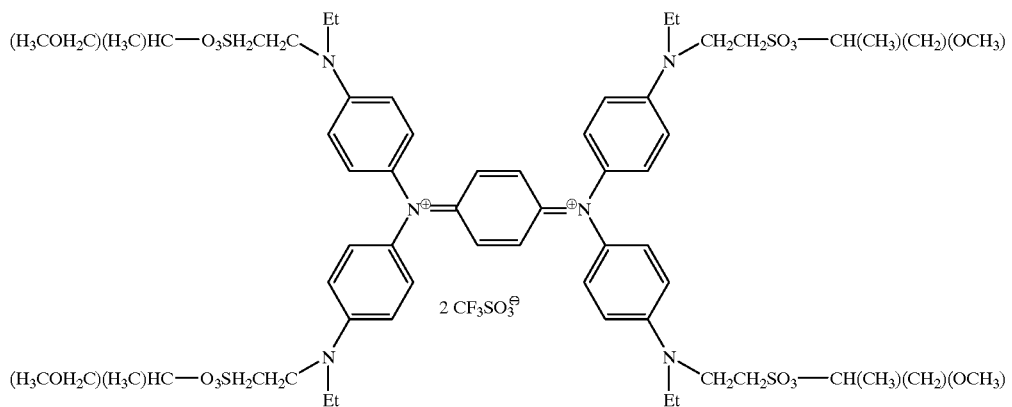
Compound 10
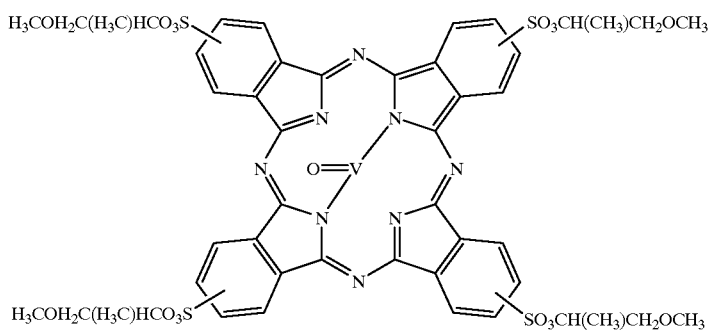
Compound 11
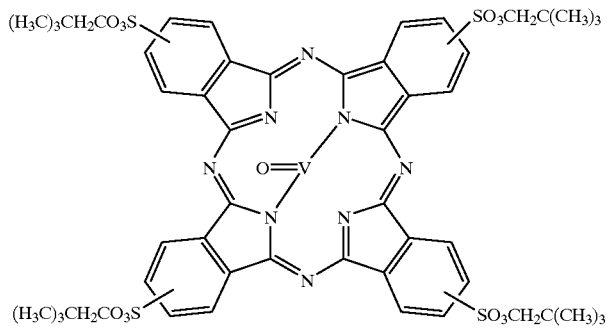
Compound 12
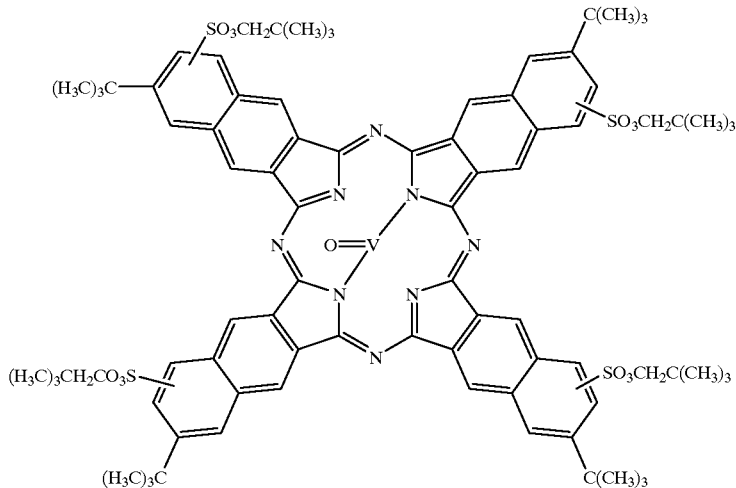

Compound 13
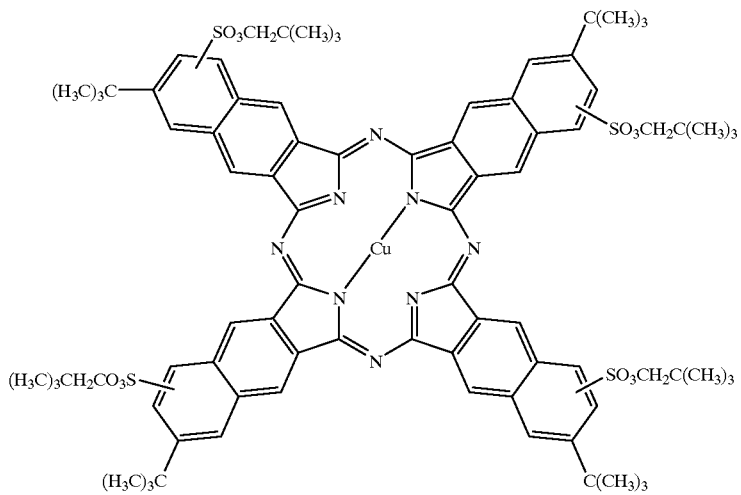
Compound 14
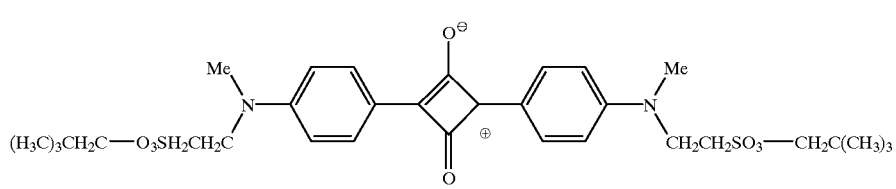
Compound 15
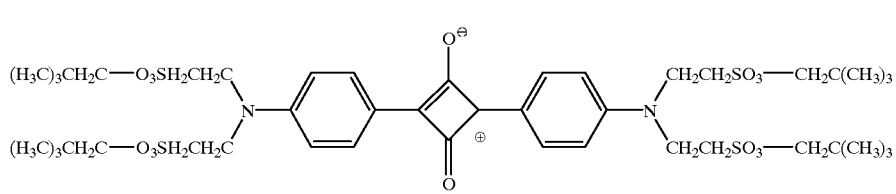
Compound 16
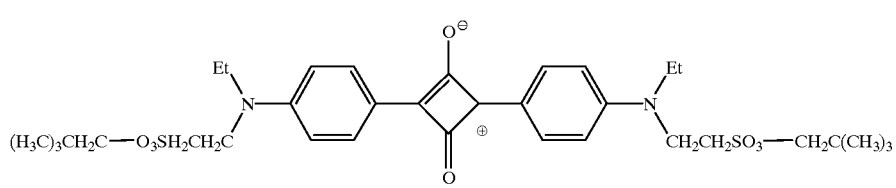
Compound 17
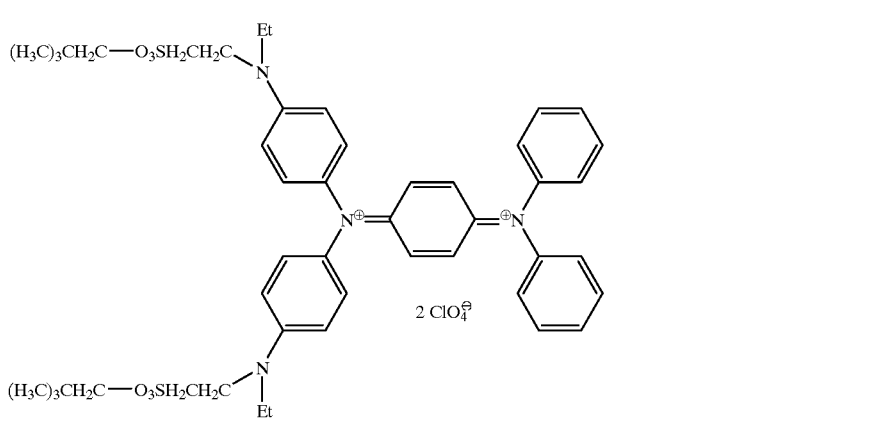

Compound 18
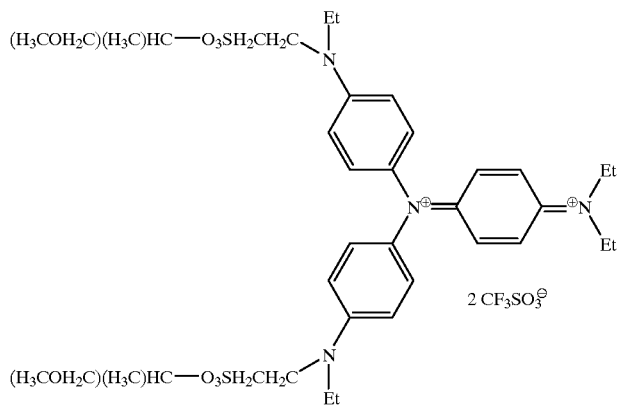
Compound 19
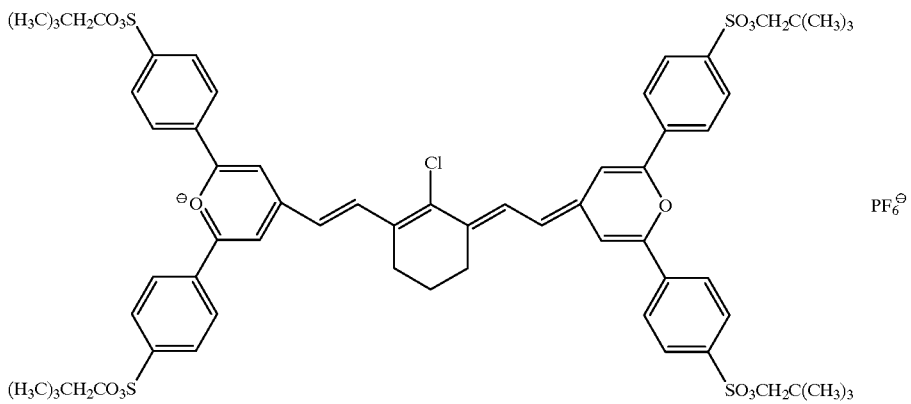
Compound 20
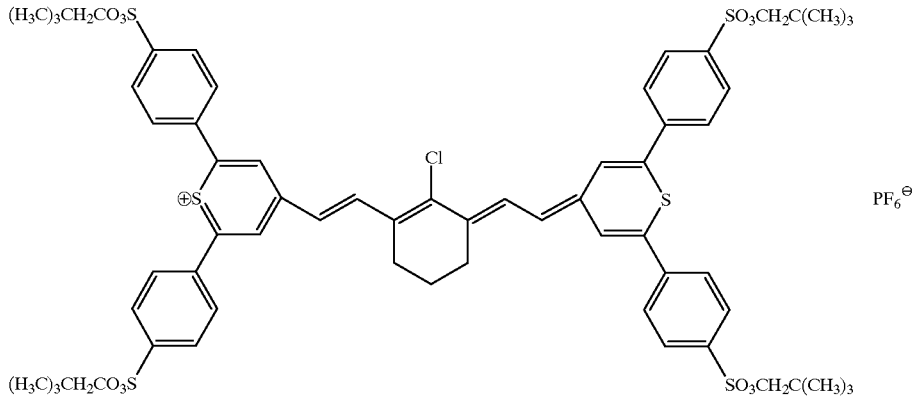

Compound 21
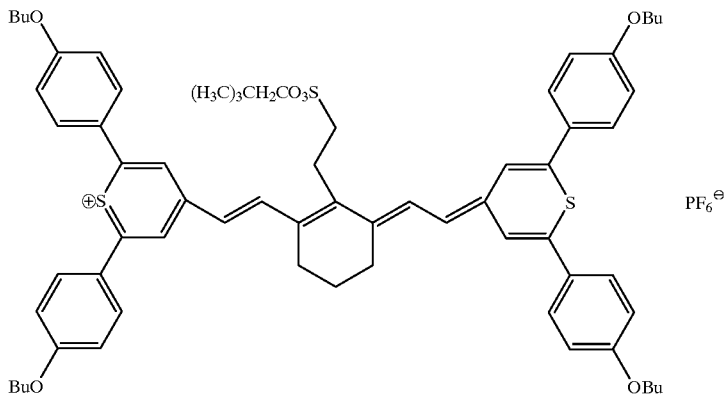
Compound 22
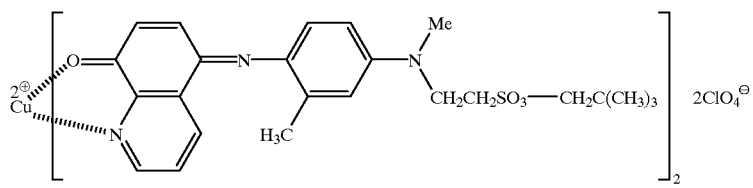
Compound 23
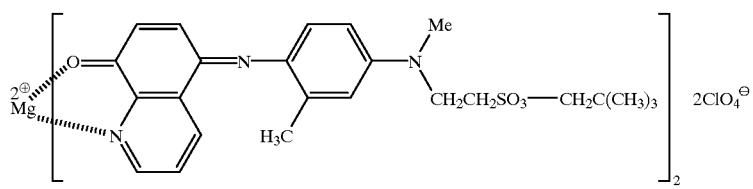
Compound 24
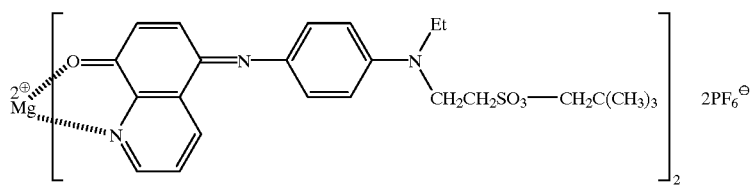
Compound 25
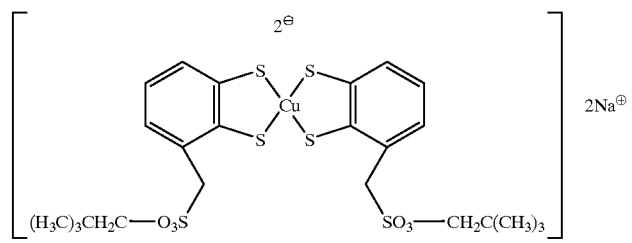
Compound 26
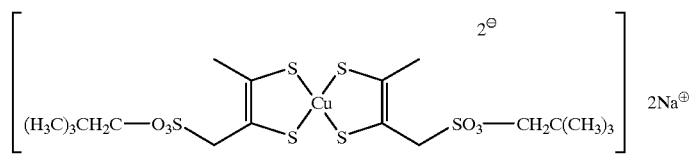

-continued
Compound 27
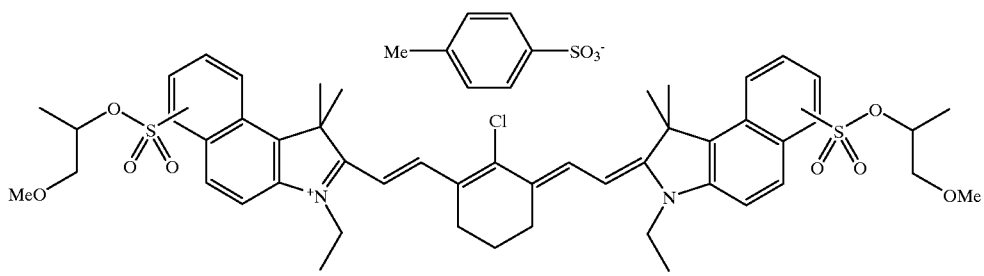
Compound 28
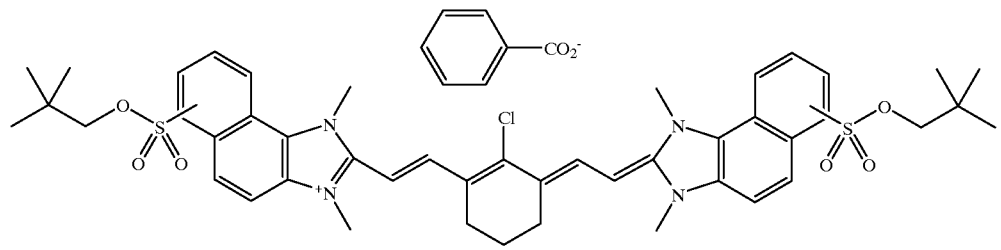
Compound 29
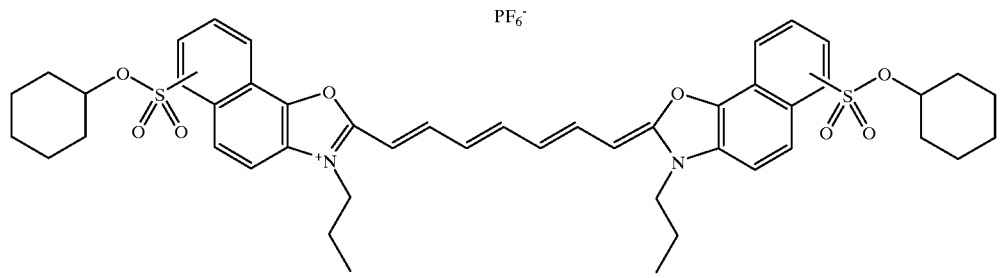
Compound 30
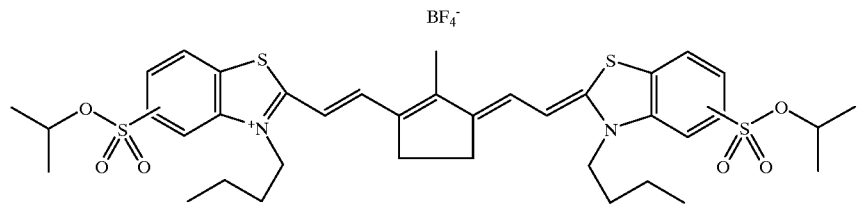
Compound 31
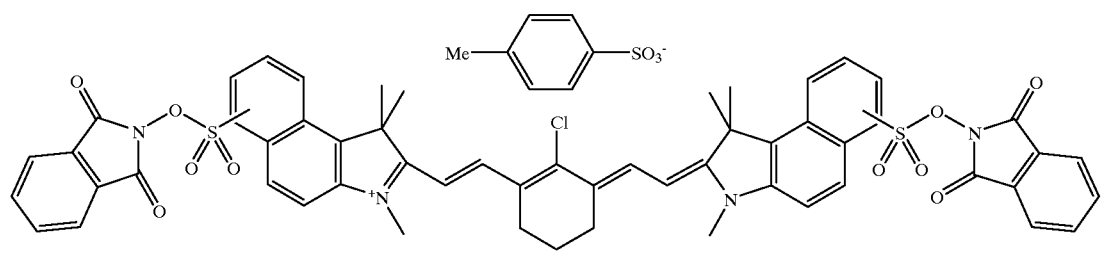
Compound 32
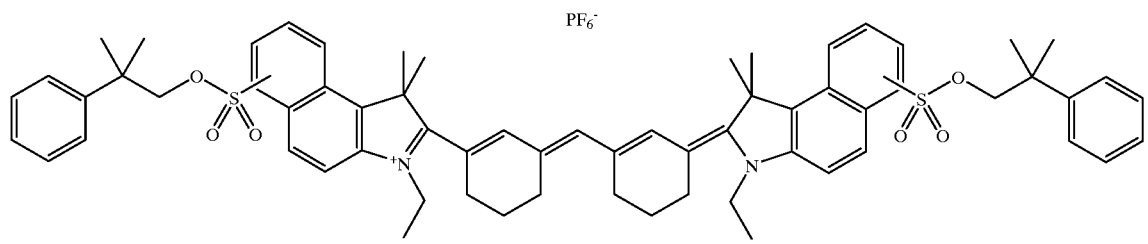

-continued
Compound 33
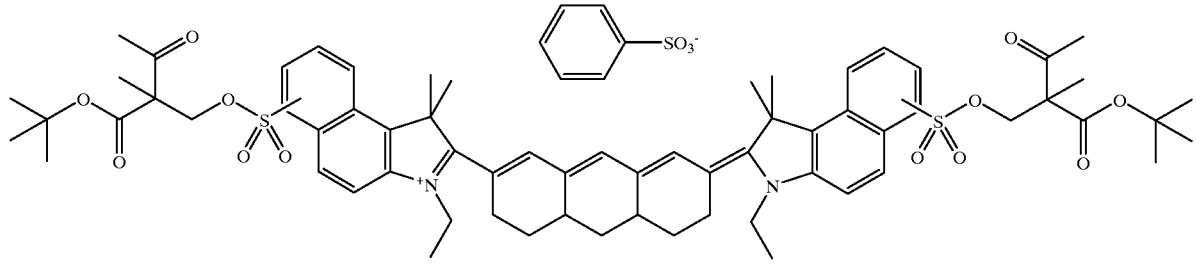
Compound 34
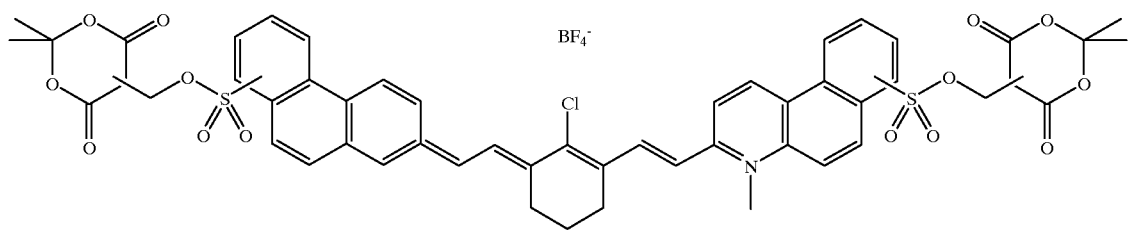
Compound 35
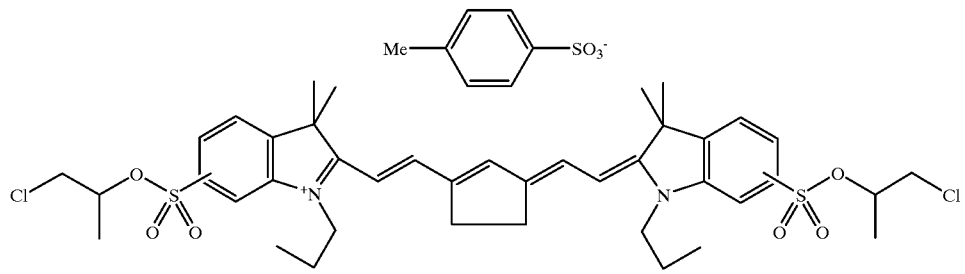
Compound 36
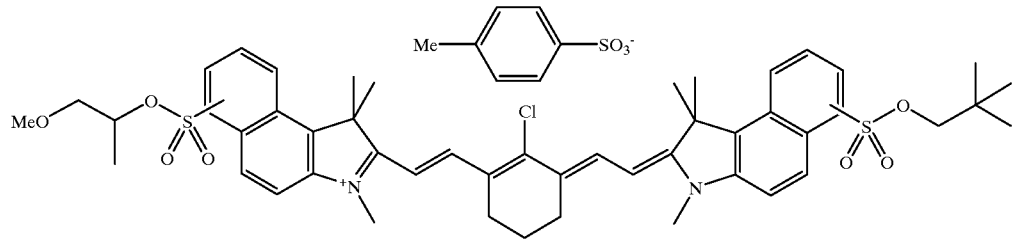
Compound 37
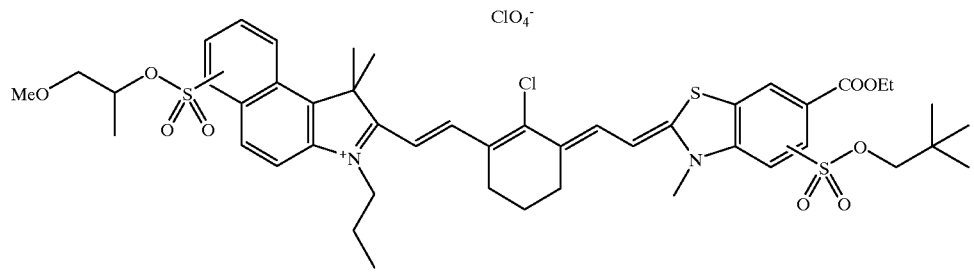

-continued
Compound 38
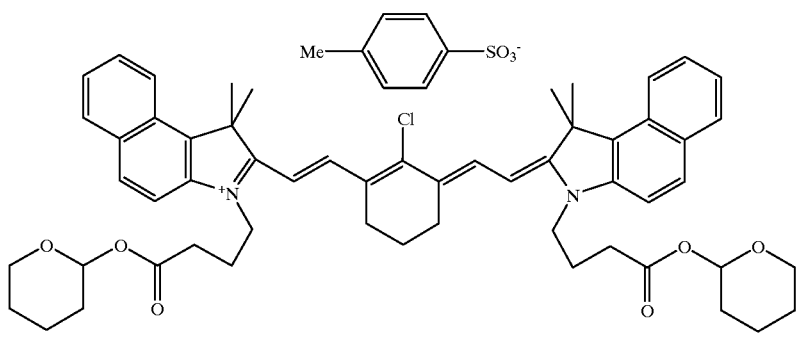
Compound 39
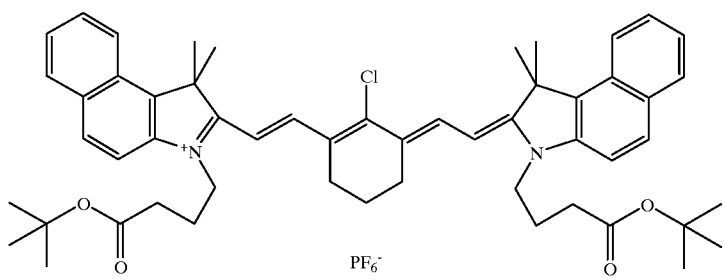
Compound 40
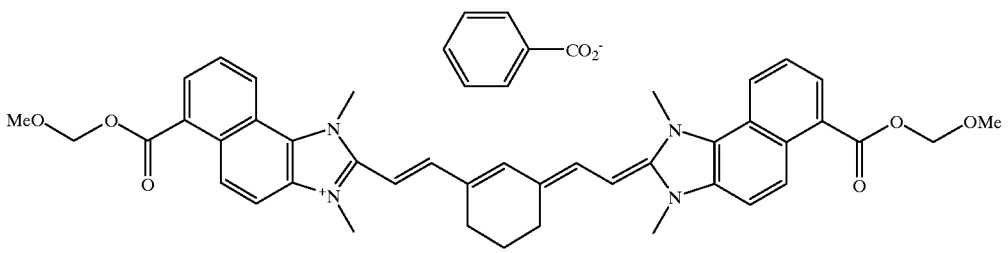
Compound 41
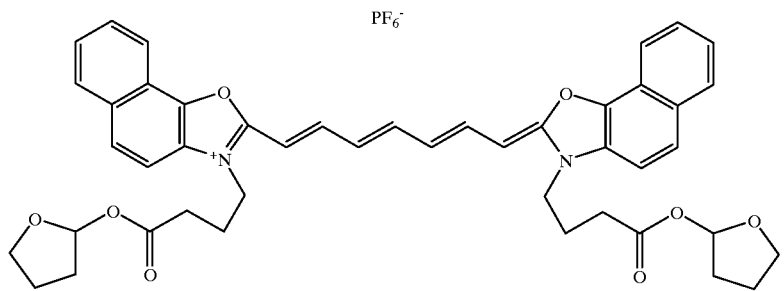

Compound 42
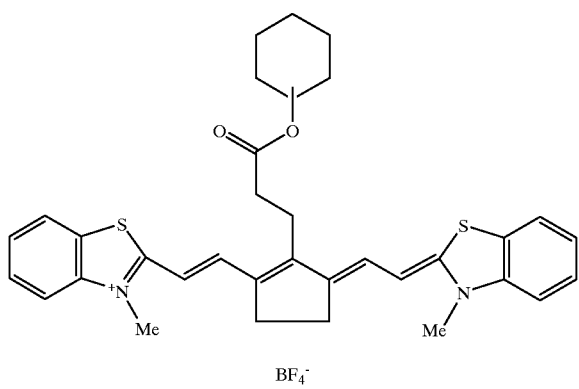
Compound 43
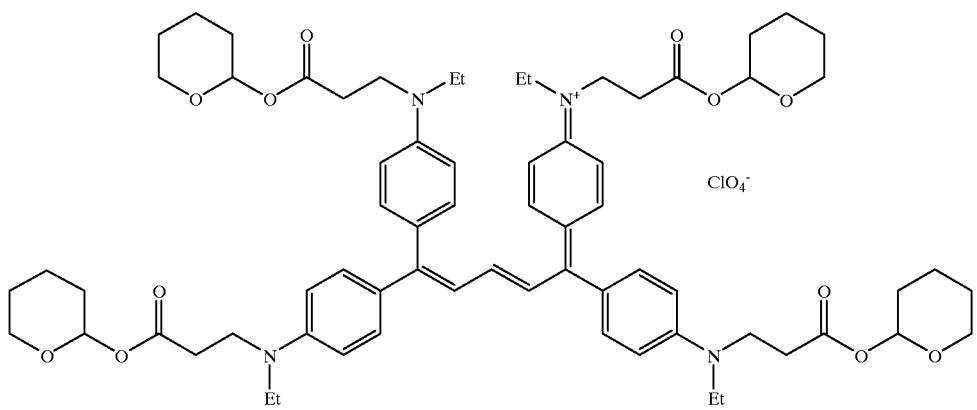
Compound 44
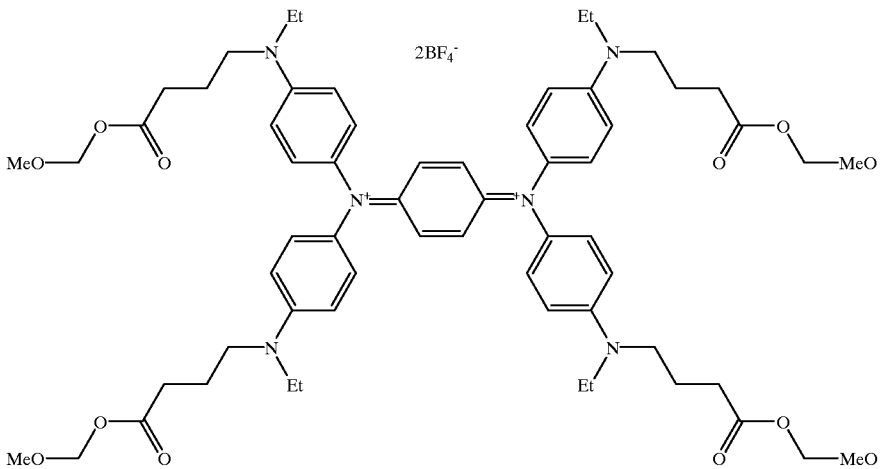

Compound 45
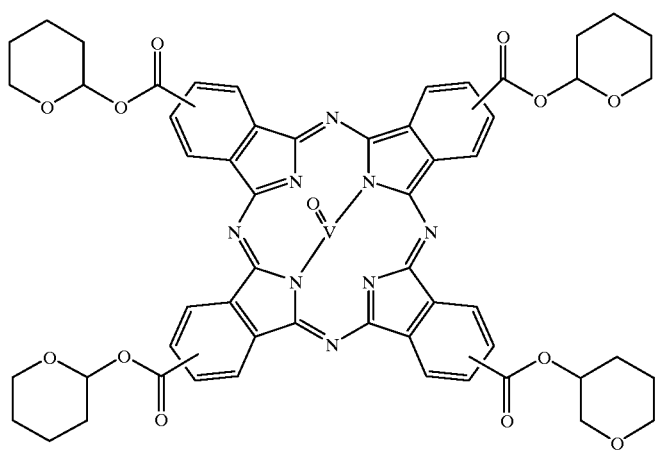
Compound 46
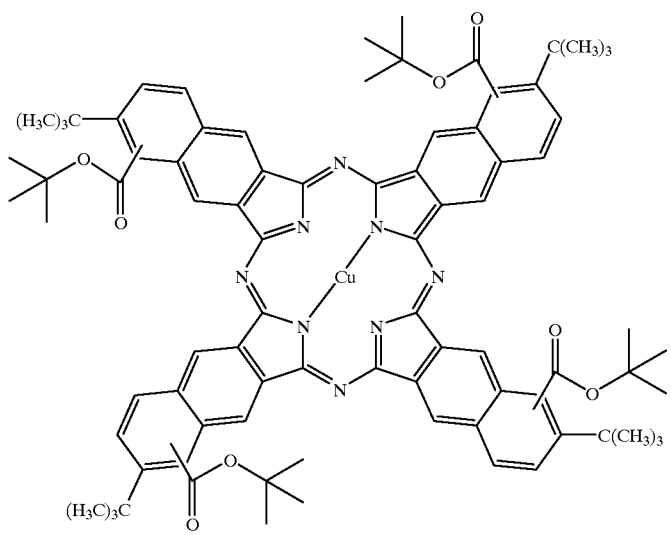
Compound 47
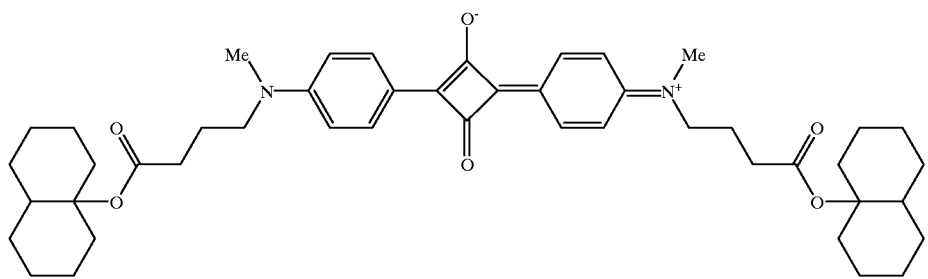
Compound 48
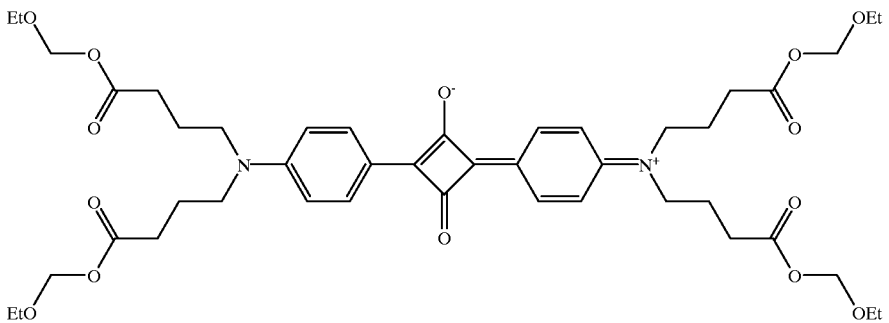

-continued
Compound 49
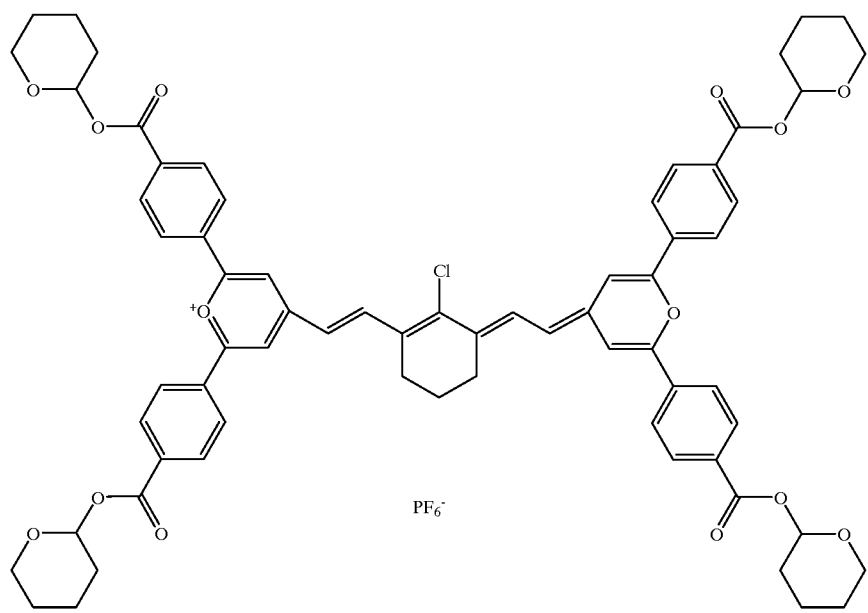
Compound 50
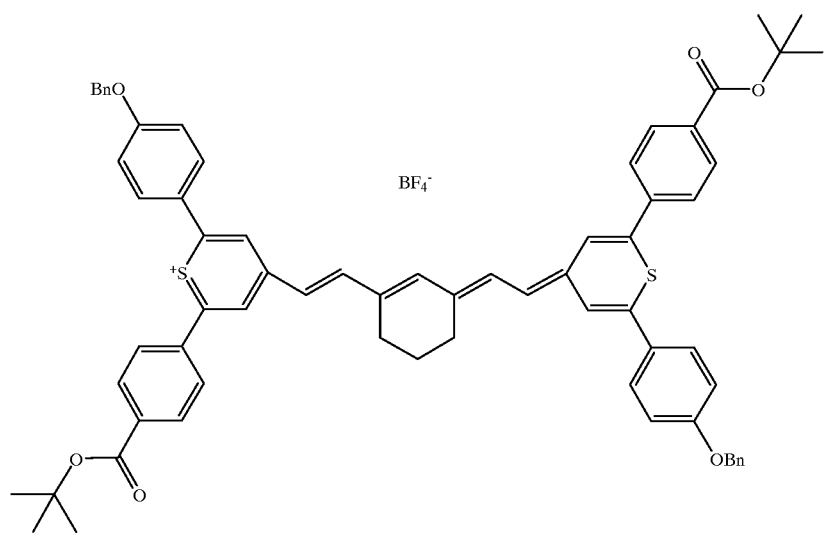
Compound 51
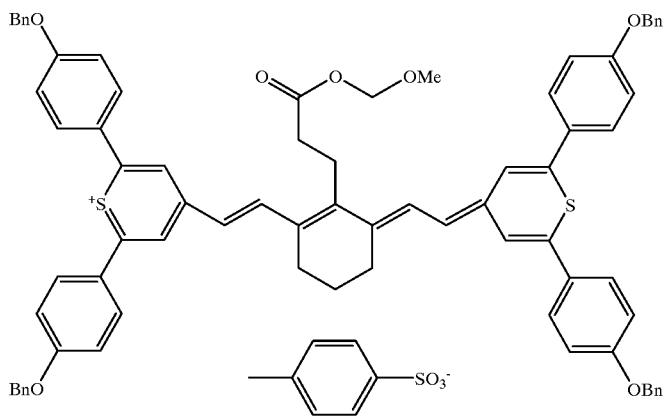

Compound 52
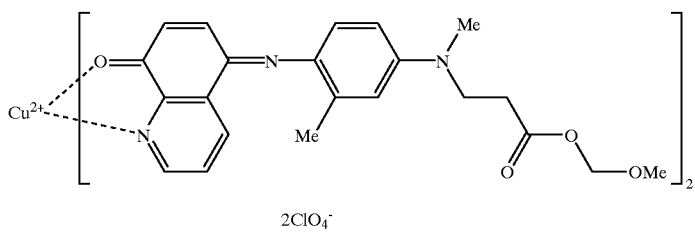
Compound 53
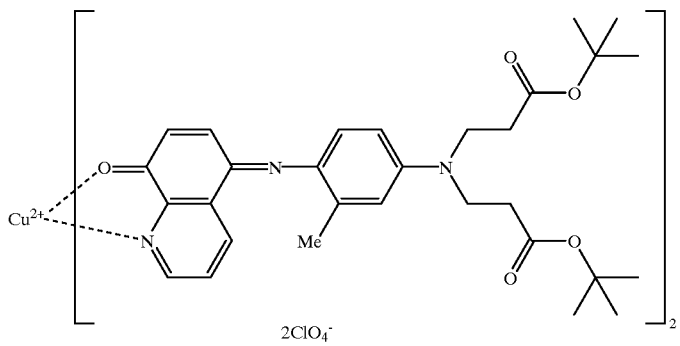
Compound 54
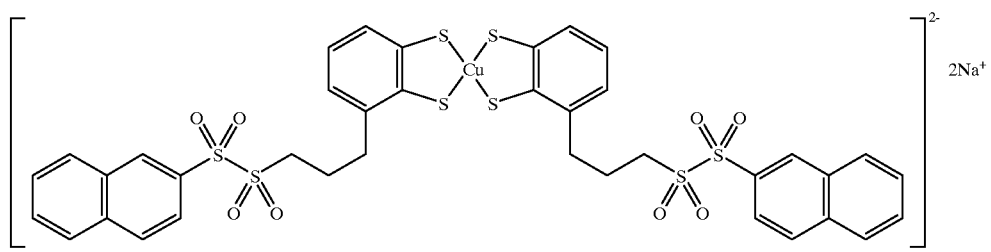
Compound 55
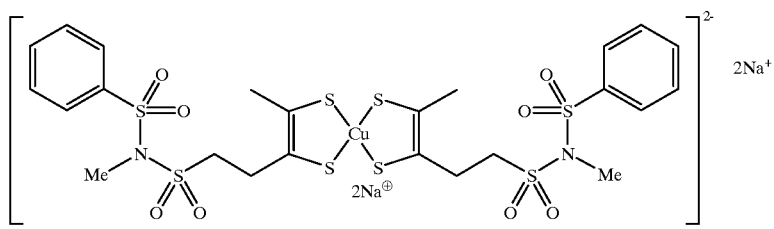
Compound 56
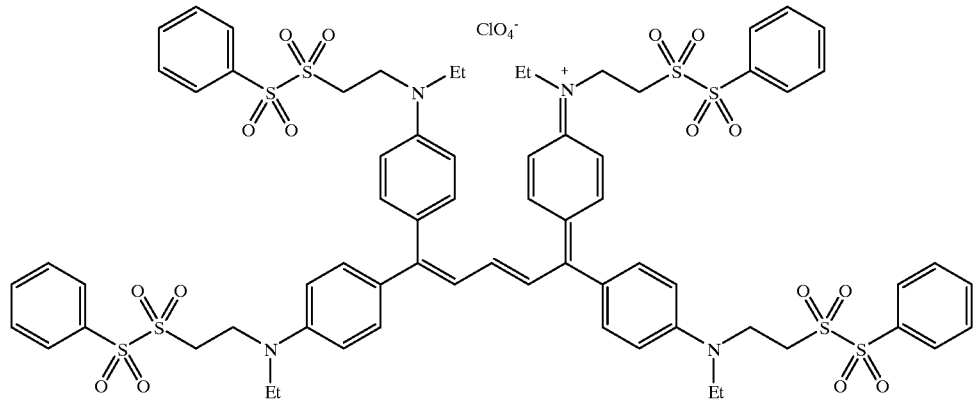

Compound 57
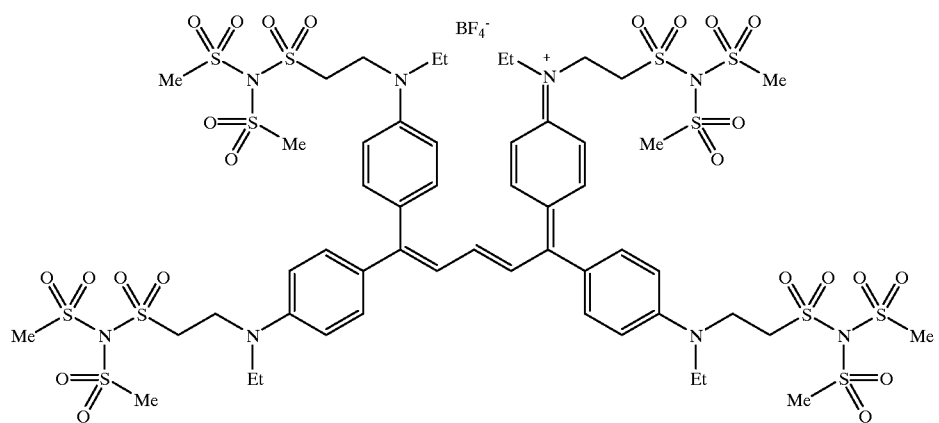
Compound 58
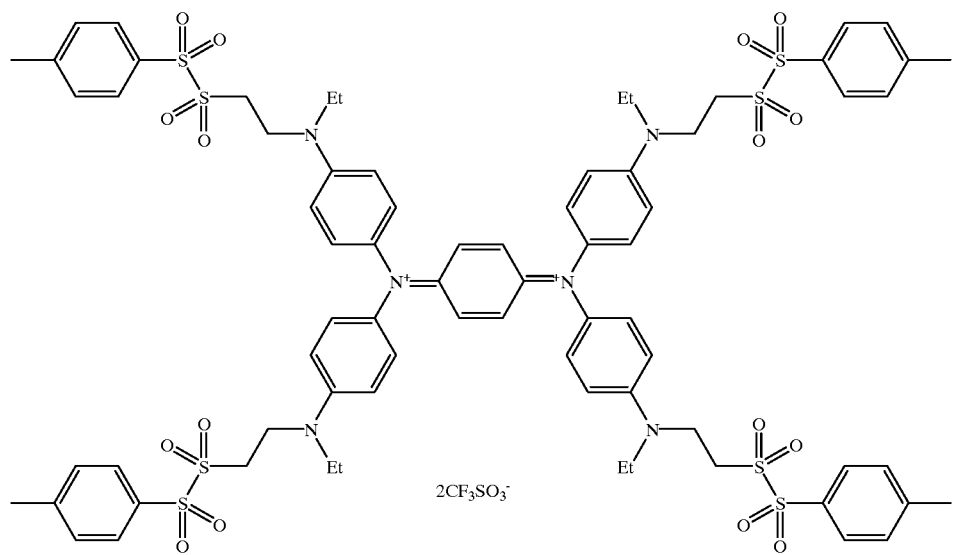

Compound 59
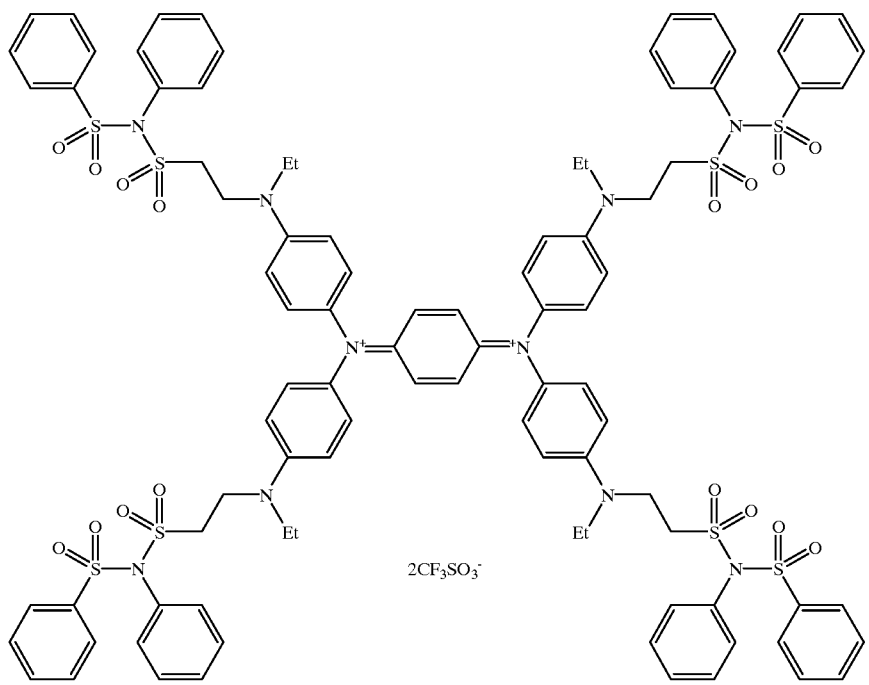
2CF₃SO₃⁻
Compound 60
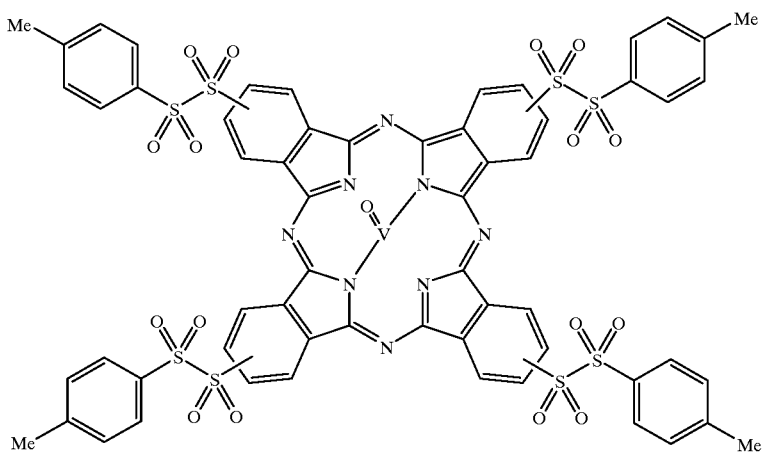

Compound 61
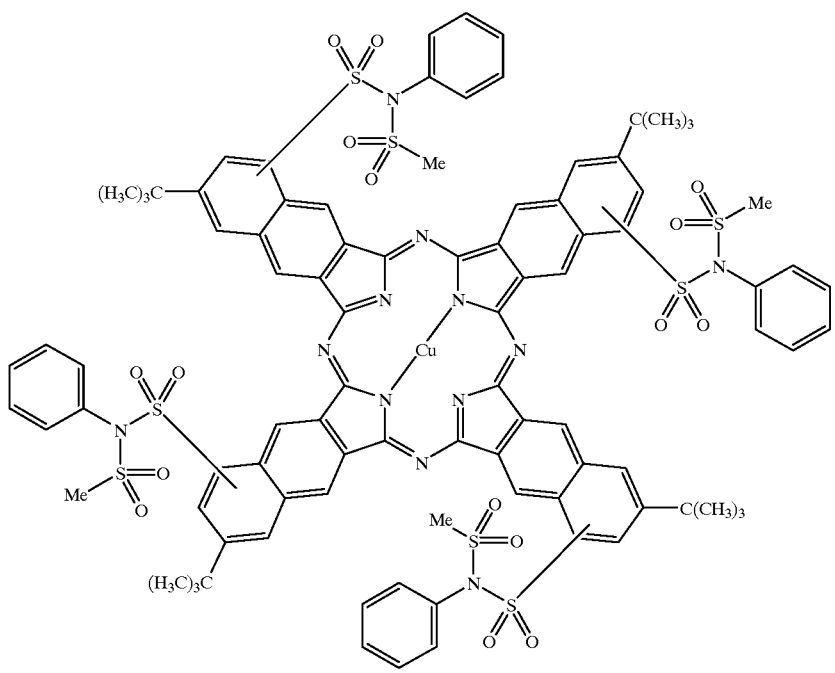
Compound 62
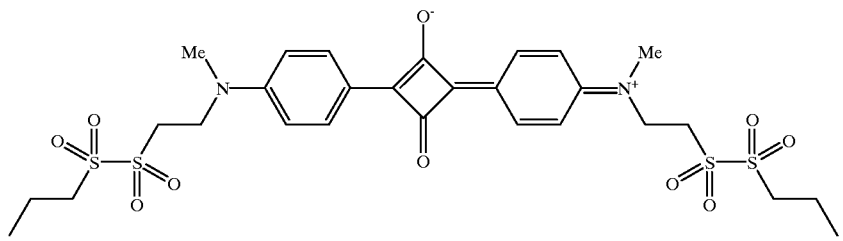
Compound 63
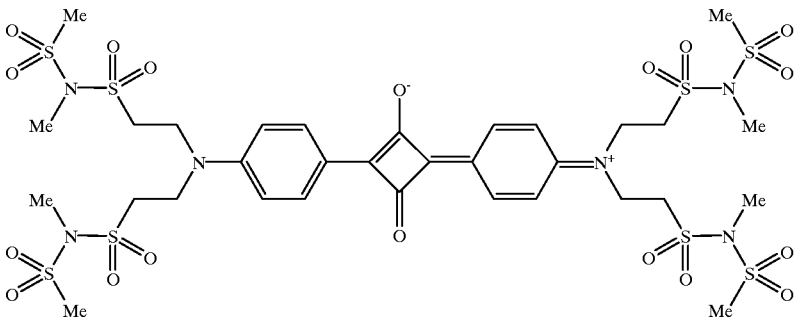

Compound 64
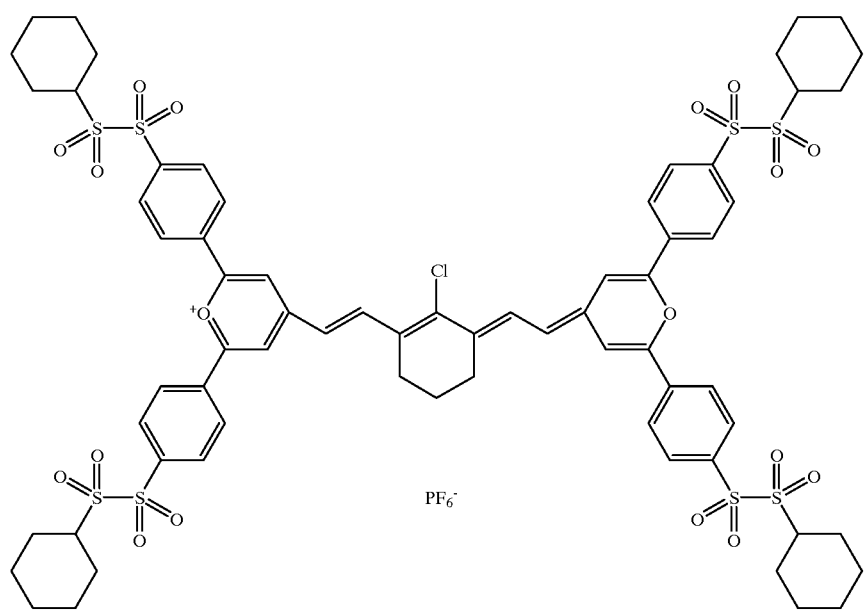
Compound 65
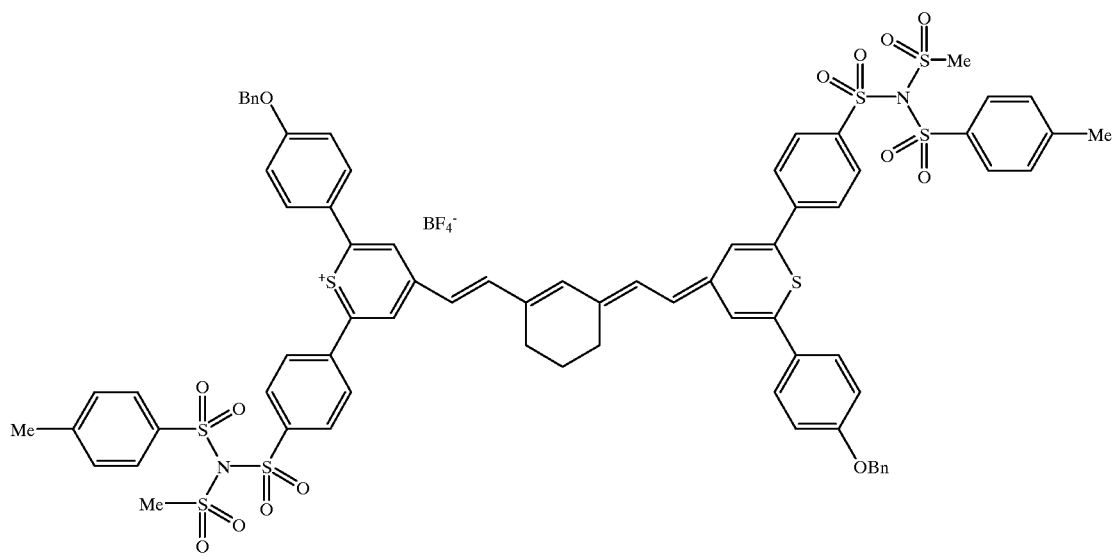

Compound 66
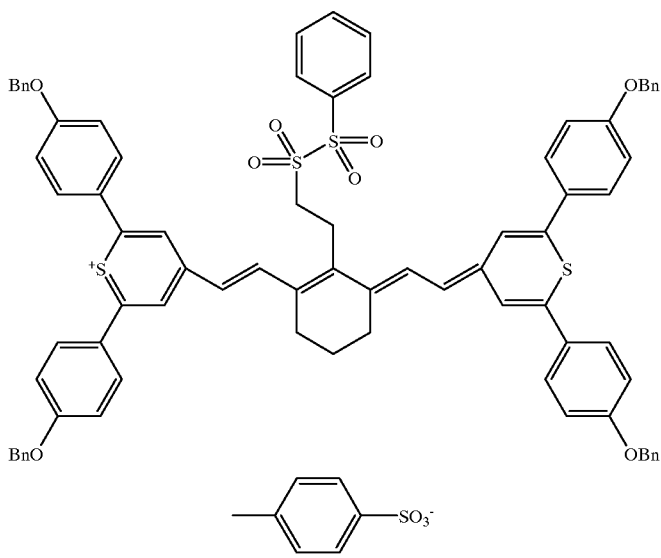
Compound 67
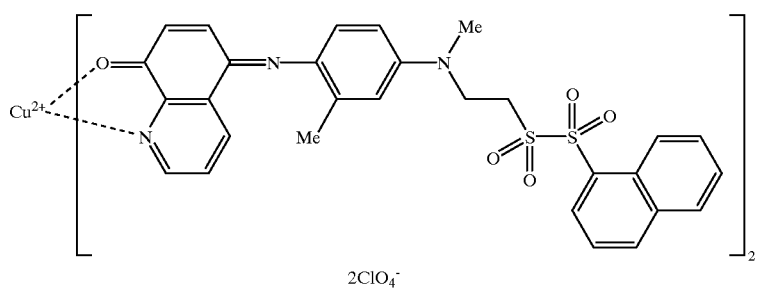
Compound 68
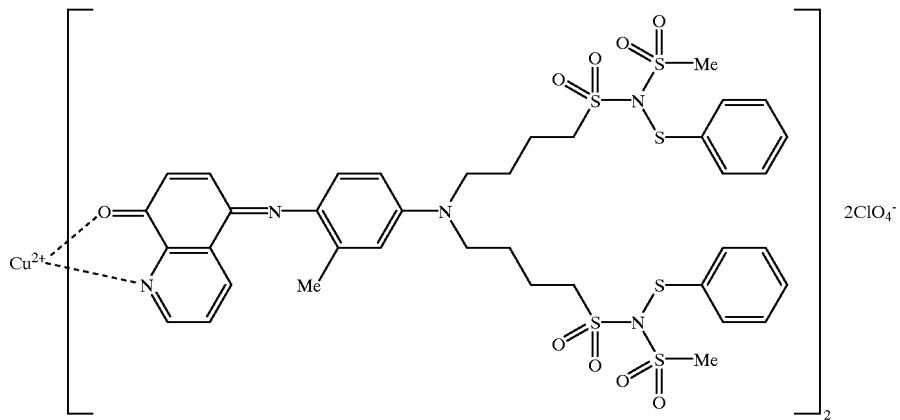
Compound 69
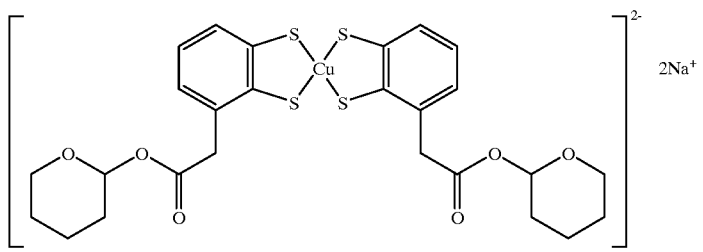

Compound 70
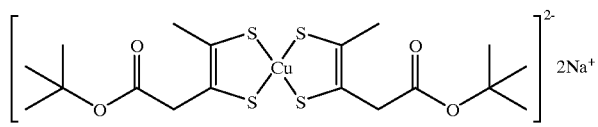
Compound 71
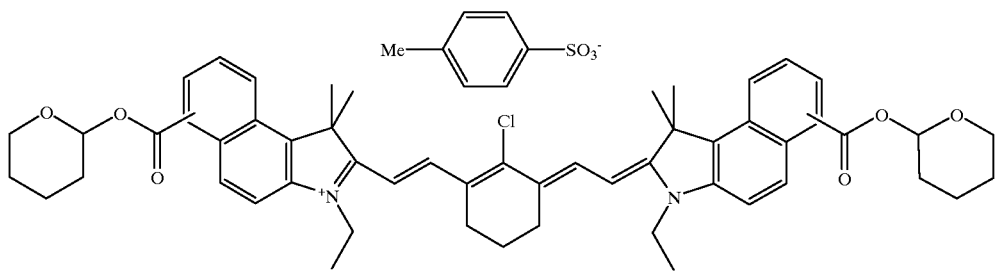
Compound 72
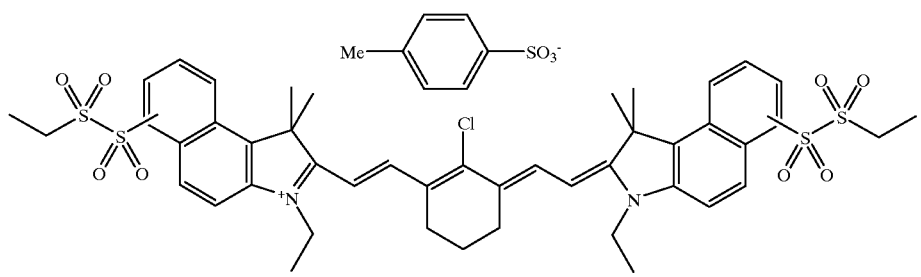
Compound 73
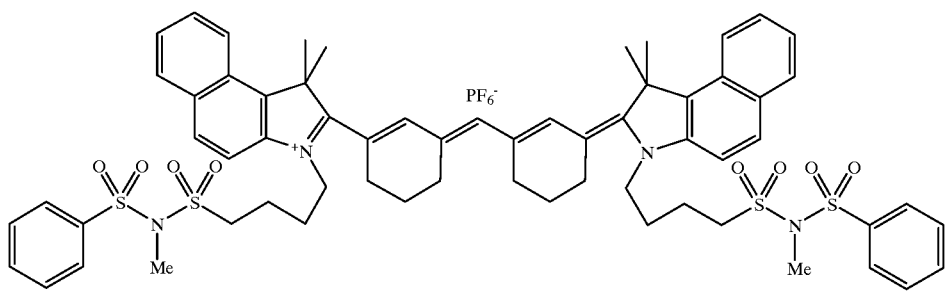
In the present embodiment, the infrared light absorbing agent having a hydrophobic functional group which changes to hydrophilic due to heat can be synthesized as shown in the following specific Synthesis Examples.
Synthesis Example of Compound 1
Synthesis scheme
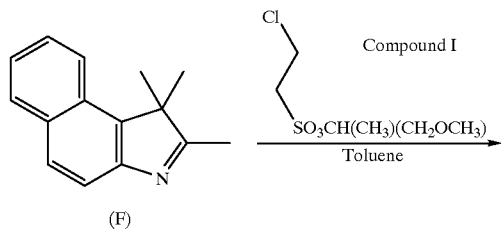

-continued

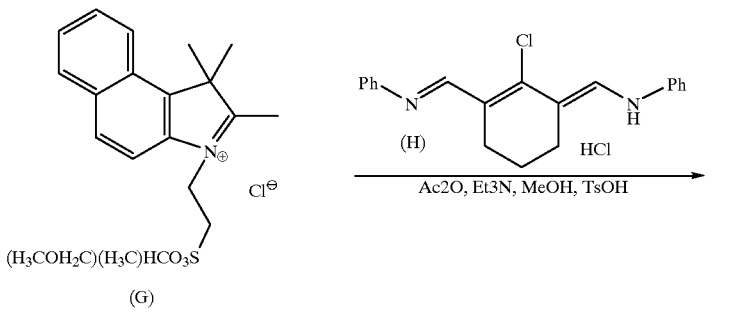

(G)

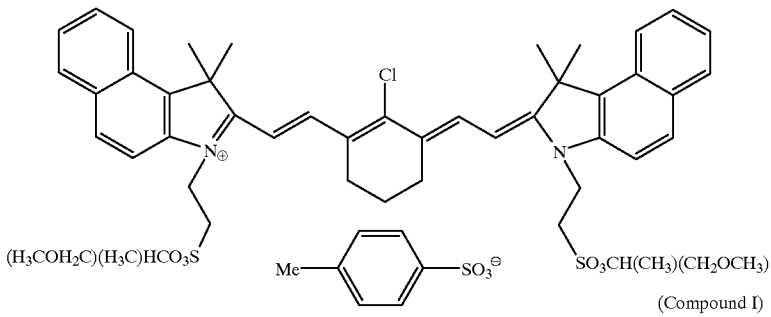

(Compound I)

Into a 300 ml three-necked flask, 20.7 g of Compound (F) (refer to the structural formula above), 50 ml of toluene and 21.6 g of 2-chloro-(1-methoxy-2-propyl) sulfonate were placed and the mixture was refluxed for 2 hours by heating with steam. After finishing the heating, the mixture was cooled to room temperature and 200 ml of acetone was added to the cooled mixture. The formed solid material was separated by filtration to obtain 30.4 g of Compound (G).

Compound (G) in an amount of 21 g and 8.9 g of Compound (H) (refer to the structural formula above) were dissolved in 100 ml of methanol. After adding 9.4 ml of acetic anhydride to the solution, the mixture was stirred at room temperature for 10 minutes and then 14.0 g of triethylamine was added dropwise over 20 minutes. After the mixture was further stirred at room temperature for 2 hours, 6.5 g of p-toluenesulfonic acid was added and the mixture was stirred at room temperature for 2 hours. The formed crystals were separated by filtration and Compound 1 was obtained (yield: 23 g; the structure was identified by element analysis and NMR).

The identification data of the obtained Compound 1 is as follows.

Molecular formula of Compound $1 = C_{57}H_{67}ClN_2O_{11}S_3$
Molecular weight=1087.81

| Element analysis | | | | |
|---|---|---|---|---|
| | C (%) | H (%) | N (%) | S (%) |
| Measured value | 62.80 | 6.50 | 2.33 | 8.92 |
| Calculated value | 62.94 | 6.21 | 2.57 | 8.84 |

$^1$H-NMR (300 MHz, DMSO-d6) of Compound 1
(1) 7.20–8.40 ppm (18H, m)
(2) 6.43 ppm (2H, d)
(3) 4.35 ppm (4H, t)
(4) 2.90 ppm (4H, t)
(5) 3.40 ppm (3H, s)
(6) 3.10 ppm (6H, s)
(7) 3.30 ppm (4H, m)
(8) 4.80 ppm (2H, m)
(9) 1.19 ppm (6H, d)
(10) 1.70–2.10 ppm (18H, m)

Ultraviolet absorption spectrum (methanol) of Compound 1
maximum absorption: 812 nm ($\epsilon=2.13\times10^5$)

Synthesis Example of Compound 10

Into a 500 ml three-necked flask, 230 g of chlorosulfuric acid was placed. While the content was kept at a temperature in a range of 20 to 50° C. and stirred, 25 g of vanadyl phthalocyanine was added into the flask over 0.5 hours. The mixture was then stirred for 3 hours while being heated at a temperature of 130 to 140° C. After the mixture was cooled to 60° C., 32 g of thionyl chloride was added dropwise over 20 minutes and then the temperature inside the flask was raised to 80° C. while the mixture was stirred. The mixture was cooled to a temperature of 0 to 3° C. and stirred for 15 minutes. The formed crystals were separated by filtration and washed with cold water. After the product was dried, 28 g of a sulfonyl chloride compound was obtained.

Into a 300 ml three-necked flask, 20 g of the above sulfonyl chloride compound was placed and 10 g of 1-methoxy-2-propanol was added. Then, 28 g of pyridine was added dropwise to the reaction mixture which was kept cool. When the addition was completed, cooling was discontinued and the reaction mixture was stirred at room temperature for 8 hours. The obtained reaction solution was added to 300 ml of a 3N aqueous solution of hydrochloric acid. The formed crystals were separated by filtration and washed with 500 ml of methanol. After the product was dried, Compound 10 was obtained (yield: 19 g; the structure was identified by element analysis and NMR).

Synthesis Example of Compound 27

Chlorosulfonic acid (58.3 g) was charged into a 300 ml three-necked flask and cooled to 0° C. Compound (A) (20.9 g) was added in small amounts over 30 minutes while stirring was carried out vigorously. After the addition of compound (A), the temperature was raised to room temperature, and after stirring was continued for an additional 10 hours, the reaction compound was placed 1 liter of ice water (vigorously stirred) which was in a three-liter beaker. To this aqueous solution, a sodium hydroxide aqueous solution (NaOH: 32 g/H$_2$O: 300 ml) was added by drops over 30 minutes, and thereafter, extraction was carried out with ethyl acetate. The obtained ethyl acetate solution was washed with a saturated sodium chloride aqueous solution, and thereafter was dried by anhydrous magnesium sulfate. The ethyl acetate solution obtained in this matter was concentrated by vacuum distillation such that 29 g of a compound (B) was obtained.

Compound (B) (18.5 g) and 1-methoxy-2-propanol (6.5 g) were placed in a 200 ml eggplant-type flask and cooled to 0° C. Pyridine (9.5 g) was added by drops over 10 minutes, and after this dropwise addition was completed, stirring of the solution was continued for six hours. The reaction compound diluted with ethyl acetate was washed with water and a saturated sodium chloride aqueous solution, and thereafter dried with anhydrous magnesium sulfate. The oily matter obtained by vacuum distillation of the ethyl sulfate was purified by a silica gel column to obtain 15 g of a compound (C).

Compound (C) (8.5 g) was placed in a 100 ml eggplant-type flask and was stirred vigorously at room temperature. Ethyl trifluoromethanesulfonate (5.1 g) was added dropwise over 10 minutes, and after dropwise addition was completed, the mixture was stirred for another one hour. To the obtained reaction compound were added 50 ml of methanol, 4.2 g of compound (D), and 2.8 g of acetic anhydride. While the mixture was stirred vigorously, 2.8 g of triethylamine was added dropwise over 10 minutes. When this dropwise addition was completed, the reaction compound was vacuum concentrated, and the obtained residual substance was purified by a silica gel column to obtain a dark green colored solid. This solid was dissolved in methanol, and when the solution was placed in water in which a largely excess amount of sodium p-toluenesulfonate was dissolved, green solids precipitated. These green solids were filtered out and washed with distilled water to obtain a compound (yield 7.8 g).

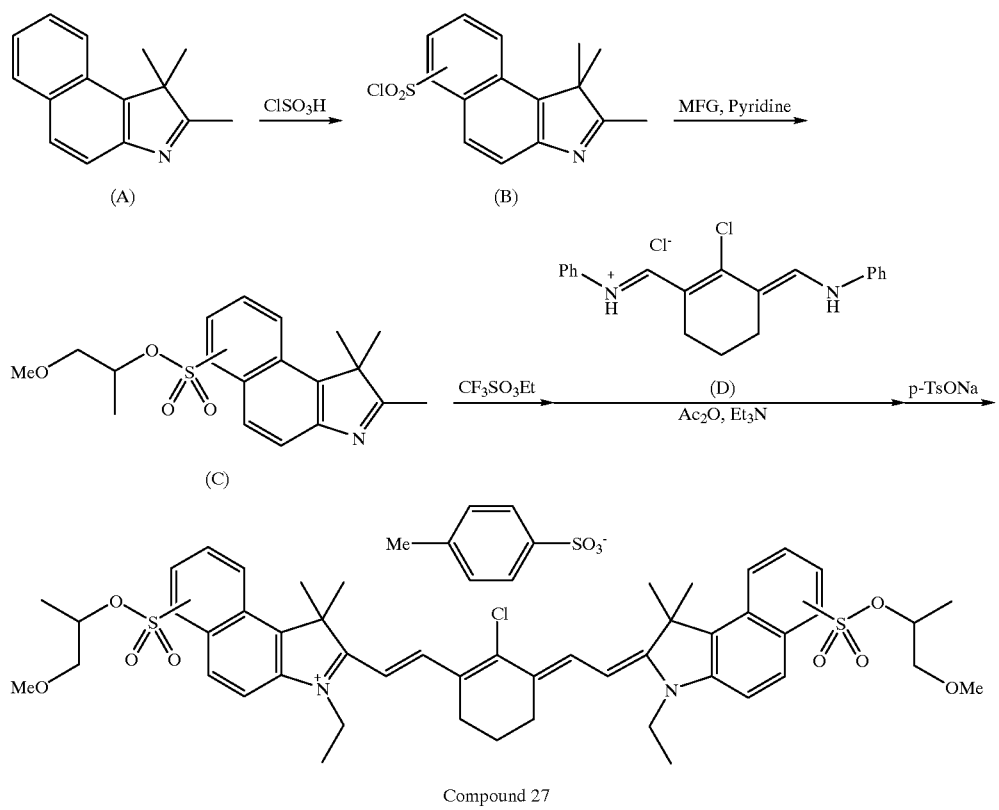

Compound 27

Molecular formula of Compound 27 (a mixture of a positional isomer and an optical isomer)=C$_{57}$H$_{67}$ClN$_2$O$_{11}$S$_3$ $^1$H-NMR (300 MHz, DMSO-d6) of Compound 27 (a mixture of a positional isomer and an optical isomer)
(1) 8.80–7.80 ppm (12H, m)
(2) 7.48 ppm (2H, d)
(3) 7.20 ppm (2H, d)
(4) 6.52–6.35 ppm (2H, m)
(5) 4.82–4.70 ppm (2H, m)
(6) 4.50–4.35 ppm (4H, m)
(7) 3.40–3.20 ppm (4H, m)
(8) 3.08 ppm (3.6H, s)
(9) 2.90 ppm (2.4H, s)
(10) 2.82–2.72 ppm (4H, m)
(11) 2.05–1.80 ppm (21H, m)
(12) 1.45–1.32 ppm (6H, m)
(13) 1.21–1.12 ppm (6H, m)

Ultraviolet absorption spectrum (methanol) of Compound 27 (a mixture of a positional isomer and an optical isomer)
maximum absorption: 813 nm ($\epsilon$=1.3×10$^5$)

Infrared absorption spectrum (reflective method) of Compound 27 (a mixture of a positional isomer and an optical isomer)

1510, 1490, 1390, 1330, 1120, 1090, 1040 cm$^{-1}$

Thermal decomposition temperature (TG-DTA) of Compound 27 (a mixture of a positional isomer and an optical isomer): 151.5° C.

High speed liquid chromatography of Compound 27 (a mixture of a positional isomer and an optical isomer)

Conditions: solvent: acetonitrile—buffer solution (9/1)

buffer solution: water/triethylamine/phosphoric acid= 1000/2/2 (vol/vol)

detection: 254 nm column: Shim-pack CLC-ODS (reversed phase chromatography)

Retention Time: 2.87, 3.02, 3.24, 3.43 (minutes)

In the present embodiment, the infrared light absorbing agent is used in an amount of about 0.1 to 40% by weight, preferably 1 to 25% by weight and more preferably 3 to 15% by weight, of the total amount of solid components of the photosensitive layer. When the amount of the infrared light absorbing agent having a thermally decomposable sulfonic ester group is less than 0.1%, sensitivity is low and stains tend to be formed during printing. When the amount exceeds 40% by weight, the infrared light absorbing agent tends to remain in the photosensitive layer and stains tend to be formed.

[(A) Macromolecular Binder Insoluble in Water and Soluble in an Aqueous Solution of an Alkali]

The macromolecular binder insoluble in water and soluble in an aqueous solution of an alkali, which is used in the first image-forming material of the present invention, is a compound or a mixture of compounds selected from macromolecular compounds having an acidic group in the structure of the main chain and/or the side chains. Among these compounds, compounds having one of the following acidic groups (a-1) to (a-6) in the structure of the main chain and/or the side chains are preferable from the standpoint of solubility in an alkaline developer:

(a-1) phenol group (—Ar—OH)

(a-2) sulfonamide group (—SO$_2$NH—R)

(a-3) an acid group derived from substituted sulfonamide (hereinafter referred to as the active imide group) (—SO$_2$NHCOR, —SO$_2$NHSO$_2$R, —CONHSO$_2$R)

(a-4) carboxylic acid group (—CO$_2$H)

(a-5) sulfonic acid group (—SO$_3$H)

(a-6) phosphoric acid group (—OPO$_3$H$_2$)

In the above (a-1) to (a-6), Ar represents a substituted or unsubstituted divalent aryl group and R represents a substituted or unsubstituted hydrocarbon group.

Among the macromolecular binders which have one of acidic groups (a-1) to (a-6) and are insoluble in water and soluble in an aqueous solution of an alkali, macromolecular binders which have the (a-1) phenol group, the (a-2) sulfonamide group or the (a-3) an active imide group and are insoluble in water and soluble in an aqueous solution of an alkali are preferable. Macromolecular binders which have the (a-1) phenol group and are insoluble in water and soluble in an aqueous alkali solution are more preferable from the standpoint of solubility in an alkaline developer, adhesion of ink and resistance to friction. Copolymers which have a (a-1) phenol group in the main chain and one of (a-1) to (a-3) in a portion of the main chain and/or in the side chains are also preferable from the standpoint of developing latitude.

As the macromolecular binder which has the (a-1) phenol group and is insoluble in water and soluble in an aqueous solution of an alkali, for example, novolak resins such as polycondensation products of phenol and formaldehyde (hereinafter referred to as phenol-formaldehyde resins), polycondensation products of m-cresol and formaldehyde (hereinafter referred to as m-cresol-formaldehyde resins), polycondensation products of p-cresol and formaldehyde, polycondensation products of a mixture of m-cresol and p-cresol and formaldehyde and polycondensation products of phenol, cresol (any of m-cresol, p-cresol and a mixture of m-cresol and p-cresol) and formaldehyde; and polycondensation products of pyrogallol and acetone, can be used. Copolymers obtained by copolymerization of monomers having the phenol group in the side chain may also be used. Examples of the monomer having the phenol group in the side chain include acrylamide, methacrylamide, acrylic esters, methacrylic esters and hydroxystyrene, each having the phenol group. Specifically, N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrne, p-hydroxystyrene, 2-(4-hydroxyphenyl)ethyl acrylate and 2-(4-hydroxyphenyl)ethyl methacrylate can be advantageously used.

From the standpoint of image-forming property, it is preferable that the macromolecular compound has a weight-average molecular weight of $5.0 \times 10^2$ to $2.0 \times 10^4$ and a number-average molecular weight of $2.0 \times 10^2$ to $1.0 \times 10^4$. The above resins may be used singly or as a combination of two or more types. When a combination of two or more types of the resins is used, the combination may contain condensation products of a phenol substituted with an alkyl group having 3 to 8 carbon atoms and formaldehyde such as polycondensation products of t-butylphenol and formaldehyde and polycondensation products of octylphenol and formaldehyde, as described in the specification of U.S. Pat. No. 4,123,279.

As the macromolecular binder which has the (a-2) sulfonamide group and is insoluble in water and soluble in an aqueous solution of an alkali, for example, polymers obtained by using a monomer having sulfonamide group as the main component of polymerization can be used. Examples of such a monomer include compounds having one or more sulfonamide groups in which at least one hydrogen atom is bonded to a nitrogen atom and one or more polymerizable unsaturated bonds in the molecule. Among such compounds, low molecular weight compounds having: the acryloyl group, the allyl group or the vinyloxy group; and either a substituted or monosubstituted aminosulfonyl group or a substituted sulfonylimino group, are preferable. Examples of such compounds include compounds represented by the following general formulae (8) to (12):

General formula (8)

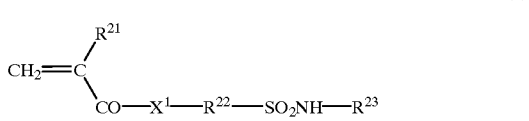

General formula (9)

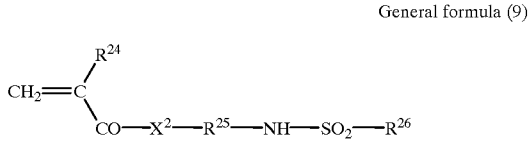

-continued

General formula (10)

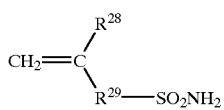

General formula (11)

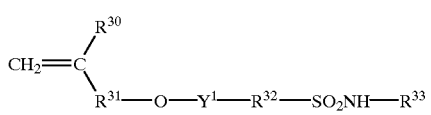

General formula (12)

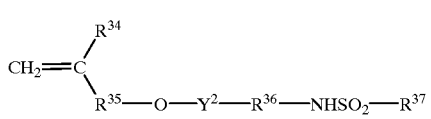

In the above formulae, $X^1$ and $X^2$ each independently represents —O— or —$NR^{27}$—; $R^{21}$ and $R^{24}$ each independently represents a hydrogen atom or —$CH_3$; $R^{22}$, $R^{25}$, $R^{29}$, $R^{32}$ and $R^{36}$ each independently represents a substituted or unsubstituted alkylene group, cycloalkylene group, arylene group or aralkylene group, each having 1 to 12 carbon atoms; $R^{23}$, $R^{27}$ and $R^{33}$ each independently represents a hydrogen atom or a substituted or unsubstituted alkyl group, cycloalkyl group, aryl group or aralkyl group, each having 1 to 12 carbon atoms; $R^{26}$ and $R^{37}$ each independently represents a substituted or unsubstituted alkyl group, cycloalkyl group, aryl group or aralkyl group, each having 1 to 12 carbon atoms; $R^{28}$, $R^{30}$ and $R^{34}$ each independently represents a hydrogen atom or —$CH_3$; $R^{31}$ and $R^{35}$ each independently represents a single bond or a substituted or unsubstituted alkylene group, cycloalkylene group, arylene group or aralkylene group, each having 1 to 12 carbon atoms; and $Y^1$ and $Y^2$ each independently represents a single bond or —CO—. Specifically, m-aminosulfonylphenyl methacrylate, N-(p-aminosulfonylphenyl)-methacrylamide and N-(p-aminosulfonylphenyl)acrylamide can be advantageously used.

As the macromolecular binder which has the (a-3) active imide group and is insoluble in water and soluble in an aqueous solution of an alkali, for example, polymers obtained by using a compound having an active imide group as the main monomer can be used. Examples of such a compound include compounds having in the molecule one or more polymerizable unsaturated bonds and one or more active imide groups expressed by the following formula:

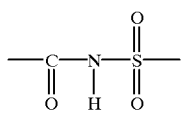

As specific examples of the above compound, N-(p-toluenesulfonyl)-methacrylamide or N-(p-toluenesulfonyl)acrylamide can be advantageously used.

As the macromolecular binder which has an (a-4) carboxylic acid group and is insoluble in water and soluble in an aqueous solution of an alkali, for example, polymers obtained by using a compound having one or more carboxylic acid groups and one or more polymerizable unsaturated bond in the molecule as the main component of polymerization can be used. As the macromolecular binder which has the (a-5) sulfonic acid group and is insoluble in water and soluble in an aqueous solution of an alkali, for example, polymers obtained by using a compound having one or more sulfonic acid groups and one or more polymerizable unsaturated bond in the molecule as the main component of polymerization can be used. As the macromolecular binder which has an (a-6) phosphoric acid group and is insoluble in water and soluble in an aqueous solution of an alkali, for example, polymers obtained by using a compound having one or more phosphoric acid groups and one or more polymerizable unsaturated bond in the molecule as the main component of polymerization can be used.

In the present embodiment, it is not necessary that a single type of the monomer having one of the acidic groups (a-1) to (a-6) alone is used in the macromolecular binder insoluble in water and soluble in an aqueous solution of an alkali. Polymers obtained by copolymerization of two or more types of the monomers having the same acidic group, or of two or more types of the monomers having different acidic groups, may also be used. For example, copolymers obtained by copolymerization of a monomer having one of the acidic groups (a-1) to (a-6) with a polymer having one of acidic groups (a-1) to (a-6) in the main chain can be used. As the monomer having one of the acidic groups (a-1) to (a-6) which is used for the copolymerization, the compounds described above as examples can be used. As described above, it is preferable that copolymers having a (a-1) phenol group in the main chain and one of the acidic groups (a-1) to (a-3) in a portion of the main chain and/or in the side chains is used because the developing latitude can be improved.

For example, a copolymer, obtained by copolymerization of a monomer having the phenol group with a phenol-formaldehyde resin having the (a-1) phenol group in the main chain or with a m-cresol-formaldehyde resin which has the (a-1) phenol in the main chain, can be used. As the monomer having the phenol group, for example, acrylamide, methacrylamide, an acrylic ester, a methacrylic ester or hydroxystyrene, each having the phenol group, can be used. Specifically, N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)-ethyl acrylate, 2-(4-hydroxyphenyl)ethyl acrylate, 2-(2-hydroxyphenyl)-ethyl methacrylate, 2-(3-hydroxyphenyl) ethyl methacrylate and 2-(4-hydroxyphenyl)ethyl methacrylate, can be advantageously used.

As the process of polymerization, a conventional process such as random copolymerization, graft copolymerization and block copolymerization can be used.

It is preferable that the above copolymer contains the above monomer having one of the acidic groups (a-1) to (a-6) in an amount of 10% by mol or more and more preferably 20% by mol or more. When the content is less than 10% by mol, the effect of improving developing latitude tends to become insufficient.

In the above copolymer, a monomer which contains none of the acidic groups (a-1) to (a-6) can also be used. Examples of the monomer which contains none of the acidic groups (a-1) to (a-6) include monomers shown in the following (1) to (12):

(1) Acrylic esters and methacrylic esters having an aliphatic hydroxyl group such as 2-hydroxyethyl acrylate and 2-hydroxyethyl methacrylate.

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate.

(4) Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butyrate and vinyl benzoate.

(7) Styrenes such as styrene, α-methylstyrene, methylstyrene and chloromethylstyrene.

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene.

(10) N-vinylpyrrolidone, N-vinylcarbazole, 4-vinylpyridine, acrylonitrile and methacrylonitrile.

(11) Unsaturated imides such as maleimide, N-acryloylacrylamide, N-acetylmethacrylamide, N-propionylmethacrylamide and N-(p-chlorobenzoyl) methacrylamide.

(12) Unsaturated carboxylic acids such as acrylic acid, methacrylic acid, maleic anhydride and itaconic acid.

In the present embodiment, it is preferable from the standpoint of friction resistance during printing that the macromolecular binder insoluble in water and soluble in an aqueous solution of an alkali has a weight-average molecular weight of $2.0 \times 10^3$ or more and a number-average molecular weight of $5.0 \times 10^2$ or more when the binder is a homopolymer and also when the binder is a copolymer. It is more preferable that the macromolecular binder has a weight-average molecular weight of $5.0 \times 10^3$ to $3.0 \times 10^5$, a number-average molecular weight of $8.0 \times 10^2$ to $2.5 \times 10^5$ and a dispersion (the weight-average molecular weight/the number-average molecular weight) of 1.1 to 10.

In the above copolymer, the ratio by weight of the monomer having one of the acidic groups (a-1) to (a-6) constituting the main chain to other monomers constituting a portion of the main chain and/or the side chains is preferably in the range of 50:50 to 5:95 and more preferably in the range of 40:60 to 10:90 from the standpoint of solubility in an alkali and adhesion of ink and friction resistance during printing.

The macromolecular binder insoluble in water and soluble in an aqueous solution of an alkali described above can be used singly or as a combination of two or more types. The macromolecular binder is used in an amount of 30 to 99% by weight, preferably 40 to 95% by weight and more preferably 50 to 90% by weight, of the total amount of the solid components in the image-forming material. When the amount of the macromolecular binder insoluble in water and soluble in an aqueous solution of an alkali is less than 30% by weight, durability of the recording layer tends to become inferior. When the amount exceeds 99% by weight, sensitivity and durability tend to become inferior.

[Other Components]

In the image-forming material of the present embodiment, other dyes and pigments may also be added to further improve the image-forming property. The dyes and pigments may be added into the layer that contains the infrared light absorbing agent having the thermally decomposable sulfonic ester group or into another layer formed separately. As the dye, generally known dyes such as those described above, commercially available dyes and dyes described in a reference, "SENRYO BINRAN", edited by YUKI GOSEI KAGAKU KYOKAI, published in 1970, can be used. Examples of the dye include azo dyes, metal complex azo dyes, pyrazolone azo dyes, anthraquinone dyes, phthalocyanine dyes, carbonium dyes, quinoneimine dyes, methine dyes, cyanine dyes, aminium dyes, diimmonium dyes and squalilium dyes. As the pigment, pigments which are generally known and commercially available and pigments described in the Color Index (C.I.) Handbook, "SAISHIN GANRYO BINRAN" (edited by NIPPON GANRYO GIJUTSU KYOKAI, published in 1977), "SAISHIN GANRYO OYOGIJUTSU" (published by CMC SHUPPAN in 1986), or "INSATSU INK GIJUTSU" (published by CMC SHUPPAN in 1984), can be used. Examples of the pigment include: black pigments, yellow pigments, orange pigments, brown pigments, red pigments, violet pigments, blue pigments, green pigments, fluorescent pigments, pigments of metal powder and coloring substances bound to polymers. Specific examples include: insoluble azo pigments, azo lake pigments, condensed azo pigments, chelate azo pigments, phthalocyanine pigments, anthraquinone pigments, perylene pigments, perynone pigments, thioindigo pigments, quinacridone pigments, dioxazine pigments, isoindolinone pigments, quinophthalone pigments, dyed lake pigments for inmold decoration, azine pigments, nitroso pigments, nitro pigments, natural pigments, fluorescent pigments, inorganic pigments and carbon black. Among these dyes and pigments, dyes and pigments that absorb infrared light or near infrared light are particularly preferable. The dyes and the pigments may be used singly or as a combination of two or more types.

To the first image-forming material of the present embodiment, various additives can be added. For example, quinonediazide compounds, onium salts, aromatic sulfonic compounds and esters of aromatic sulfonic acids work as thermally decomposable substances. Therefore, a property of suppressing dissolution of image-forming portions into a developer can be improved by addition of these substances.

As the onium compound, diazoium salts, ammonium salts, phosphonium salts, iodonium salts, sulfonium salts, selenonium salts and arsonium salts can be used. Examples of the onium salts that can be advantageously used in the present invention include: diazonium salts described in S. I. Schlesinger, *Photogr. Sci. Eng.*, 18, 387 (1974), T. S. Bal et al., *Polymer,* 21, 423 (1980) and JP-A 5-158230; ammonium salts described in U.S. Pat. Nos. 4,069,055 and 4,069,056 and JP-A 3-140140; phosphonium salts described in D. C. Necker et al., *Macromolecules,* 17, 2468 (1984), C. S. Wen et al., *Teh. Proc. Conf. Rad. Curing ASIA,* p. 478, Tokyo, October (1988) and U.S. Pat. Nos. 4,069,055 and 4,069,056; iodonium salts described in J. V. Crivello et al., *Macromolecules,* 10(6), 1307 (1977), *Chem. & Eng. News,* Nov. 28, p.31 (1988), European Patent No. 104,143, U.S. Pat. Nos. 339,049 and 410,201, JP-A 2-150848 and JP-A 2-296514; sulfonium salts described in J. V. Crivello et al., *Polymer J.* 17, 73 (1985), J. V. Crivello et al., *J. Org. Chem.,* 43, 3055 (1978), W. R. Watt et al., *J. Polymer Sci.,* Polymer Chem. Ed., 22, 1789 (1984), J. V. Crivello et al., *Polymer*

Bull., 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patent Nos. 370,693, 233,567, 297,443 and 297,442, U.S. Pat. Nos. 4,933,377, 3,902,114, 410,201, 339,049, 4,760,013, 4,734,444 and 2,833,827 and German Patent Nos. 2,904,626, 3,604,580 and 3,604,581; selenonium salts described in J. V. Crivello et al., *Macromolecules*, 10(6), 1307 (1977) and J. V. Crivello et al., *J. Polymer Sci.*, Polymer Chem. Ed., 17, 1047 (1979); and arsonium salts described in C. S. Wen et al., *Teh, Proc. Conf. Rad. Curing ASIA*, p. 478, Tokyo, October (1988).

As the counter ion of the onium salt, boric acid tetrafluoride, phosphoric acid hexafluoride, triisopropylnaphthalenesulfonic acid, 5-nitro-o-toluenesulfonic acid, 5-sulfosalicylic acid, 2,5-dimethylbenzene-sulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and p-toluenesulfonic acid, can be used. Among these counter ions, phosphoric acid hexafluoride and alkyl-substituted aromatic sulfonic acids such as triisopropylnaphthalene-sulfonic acid and 2,5-dimethylbenzene-sulfonic acid can be advantageously used.

The added amount of the onium salt used as the additive is preferably of 1 to 50% by weight, more preferably of 5 to 30% by weight and most preferably of 10 to 30% by weight.

In the present invention, it is preferable that the additives and the binding agents are contained in the same layer.

To further improve the sensitivity, cyclic acid anhydrides, phenols and organic acids may be added. As the cyclic acid anhydride, cyclic acid anhydrides which are described in the specification of U.S. Pat. No. 4,115,128, such as phthalic anhydride, tetrahydrophthalic anhydride, hexahydrophthalic anhydride, 3,6-endooxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride, can be used. As the phenol, bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxytriphenyl-methane and 4,4', 3",4"-tetrahydroxy-3,5,3', 5'-tetramethyltriphenyl-methane can be used. As the organic acid, sulfonic acids, sulfinic acids, alkylsulfuric acids, phosphonic acids, esters of phosphoric acid and carboxylic acids which are described in JP-A 60-88942 and JP-A 2-96755 can be used. Specific examples include: p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The amount of the above cyclic acid anhydrides, phenols and organic acid contained in the material of the form plate is preferably of 0.05 to 20% by weight, more preferably of 0.1 to 15% by weight and most preferably of 0.1 to 10% by weight, of the total weight of the material of the form plate.

To the image-forming material of the present embodiment, nonionic surfactants described in JP-A 62-251740 and JP-A 3-208514 and amphoteric surfactants described in JP-A 59-121044 and JP-A 4-13149 may further be added to improve stability of processing, with respect to developing conditions. Specific examples of the nonionic surfactant include sorbitan tristearate, sorbitan monopalmitate, sorbitan trioleate, stearic acid monoglyceride and polyoxyethylene nonylphenyl ether. Specific examples of the amphoteric surfactant include alkyldi(aminoethyl)glycine, alkylpolyaminoethyl-glycine hydrochloride, 2-alkyl-N-carboxyethyl-N-hydroxyethyl-imidazolinium betaine and N-tetradecyl-N,N-betaine (for example, AMOGEN K, a trade name; manufactured by DAIICHI KOGYO Co., Ltd.).

The contained amount of the above nonionic surfactants and amphoteric surfactants in the material of the form plate is preferably of 0.05 to 15% by weight and more preferably of 0.1 to 5% by weight, of the total weight of the material of the form plate.

The image-forming material of the present embodiment may further comprise a print-out agent, to obtain visible images immediately after heating by exposure to the light, and dyes and pigments, as agents for coloring images. Examples of the print-out agent include combinations of a compound that generates an acid by heating by exposure to the light (an agent generating an acid by light) and an organic dye that can form a salt. Specific examples of the above agent include combinations of o-naphthoquinonediazide-4-sulfonic acid halide and an organic dye which can form a salt, which are described in the specifications of JP-A 50-36209 and JP-A 53-8128 and combinations of a trihalomethyl compound and an organic dye which can form a salt, which are described in the specifications of JP-A 53-36223, JP-A 54-74728, JP-A 60-3626, JP-A 61-143748, JP-A 61-151644 and JP-A 63-58440. As the trihalomethyl compound, oxazole compounds and triazine compounds are used and both provide clear printed-out images having stable storage stability.

As the agent for coloring images, dyes other than the above organic dyes that can form salts can be used. Among various dyes including the organic dyes that can form salts, dyes soluble in oils and basic dyes are preferable. Specific examples of the preferable dye include OIL YELLOW #101, OIL YELLOW #103, OIL PINK #312, OIL GREEN BG, OIL BLUE BOS, OIL BLUE #603, OIL BLACK BY, OIL BLACK BS and OIL BLACK T-505 (all trade names; manufactured by ORIENT KAGAKUKOGYO Co., Ltd.); victoria pure blue, crystal violet (CI 42555), methyl violet (CI 42535), ethyl violet, rhodamine B (CI 145170B), Malachite green (CI 42000) and methylene blue (CI 52015). Dyes described in the specification of JP-A 62-293247 are particularly preferable. The dye may be added to the material of the form plate in an amount of 0.01 to 10% by weight and preferably of 0.1 to 3% by weight, of the total amount of solid components of the form plate.

Addition of an epoxy compound, a vinyl ether compound, a phenol compound having a hydroxymethyl group or an alkoxymethyl group described in Japanese Patent Application No. 7-18120 or a crosslinking compound increasing the to-alkali-dissolution-suppressing effect which is described in Japanese Patent Application No. 9-328937 is preferable because friction resistance increases due to a burning treatment after exposure to light and developing.

To the material of the image-forming material of the present embodiment, plasticizers may further be added to provide layers with flexibility, where necessary. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of acrylic acid or methacrylic acid.

To the material of the image-forming material of the present embodiment, a surfactant, such as a surfactant containing fluorine described in the specification of JP-A 62-170950, may further be added to improve coatability. The amount is preferably of 0.01 to 1% by weight and more preferably of 0.05 to 0.5% by weight, of the total amount of the material of the form plate.

In the present embodiment, an agent generating an acid is not particularly required. When a further increased sensitivity is desired, the use of an agent generating an acid is preferable. The agent generating an acid is a compound that generates an acid by heat or light. Examples of such a compound generally include: photoinitiators for photocationic polymerization, photoinitiators for photoradical polymerization, agents decoloring colorants by light, agents that change color by light, conventional compounds that generate an acid by light and are used for microresists, and mixtures of these compounds. These compounds may be suitably selected and used as the above agent.

Examples of the agent generating an acid include the following onium compounds: diazonium salts described in S. I. Schlesinger, *Photogr. Sci. Eng.*, 18, 387 (1974) and T. S. Bal et al., *Polymer*, 21, 423 (1980); ammonium salts described in U.S. Pat. Nos. 4,069,055 and 4,069,056 and JP-A 3-140,140; phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988) and U.S. Pat. Nos. 4,069,055 and 4,069,056; iodonium salts described in J. V. Crivello et al., *Macromolecules*, 10(6), 1307 (1977), *Chem. & Eng. News*, November 28, p. 31 (1988), European Patent No. 104,143, U.S. Pat. Nos. 339,049 and 410,201, JP-A 2-150848 and JP-A 2-296514; sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patent No. 370,693, U.S. Pat. No. 3,902,114, European Patent Nos. 233,567, 297,443 and 297,442, U.S. Pat. Nos. 4,933,377, 410,201, 339,049, 4,760,013, 4,734,444 and 2,833,827 and German Patent Nos. 2,904,626, 3,604,580 and 3,604,581; selenonium salts described in J. V. Crivello et al., *Macromolecules*, 10(6), 1307 (1977) and J. V. Crivello et al., *J. Polymer Sci.* Polymer Chem. Ed., 17, 1047 (1979); and arsonium salts described in C. S. Wen et al., *Teh. Proc. Conf Rad. Curing ASIA*, p. 478, Tokyo, October (1988).

The above examples also include the following compounds: organic halogen compounds described in U.S. Pat. No. 3,905,815, Japanese Patent Publication No. 46-4605, JP-A 48-36281, JP-A 55-32070, JP-A 60-239736, JP-A 61-169835, JP-A 61-169837, JP-A 62-58241, JP-A 62-212401, JP-A 63-70243 and JP-A 63-298339; organometallic/organohalogen compounds described in K Meier et al., *J. Rad. Curing*, 13(4), 26 (1986), T. P. Gill et al., *Inorg. Chem.*, 19, 3007 (1980), D. Astruc, Acc. Chem. Res., 19(12), 377 (1896) and JP-A 2-161445; agents generating an acid by light and having a protective group of an o-nitrobenzyl type which are described in S. Hayase et al., *J. Polymer Sci.*, 25, 753 (1987), E. Reichman et al., *J. Polymer Sci.*, Polymer Chem. Ed., 23, 1 (1985), Q. Q. Zhu et al., J. Photochem., 36, 85, 39, 317 (1987), B. Amit et al., *Tetrahedron Lett.*, (24) 2205 (1973), D. H. R. Barton et al., *J. Chem. Soc.*, 3571 (1956), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., Imaging Technol., 11(4), (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patent Nos. 0290,750, 046,083, 156,535, 271,851 and 0,388, 343, U.S. Pat. Nos. 3,901,710 and 4,181,531, JP-A 60-198538 and JP-A 53-133022; compounds which are decomposed by light to generate a sulfonic acid, typical examples of which are iminosulfonates described in Tunooka et al., *Polymer Preprints Japan*, 35(8), G. Berner et al., *J. Rad. Curing*, 13(4), W. J. Mijs et al., *Coating Technol.*, 55(697), 45 (1983), Akzo, H. Adachi et al., *Polymer Preprints*, Japan, 37(3), European Patent Nos. 0199, 672, 84515, 199,672, 044,115 and 0101,122, U.S. Pat. Nos. 4,618,554, 4,371,605 and 4,431,774, JP-A 64-18143, JP-A 2-245756 and JP-A 3-140109; and disulfonic compounds described in JP-A 61-166544.

Compounds obtained by introducing an agent generating an acid by light into the main chain or the side chain of a polymer can also be used. Examples of such compounds include compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Macromol. Chem. Rapid Commun.*, 9, 625 (1988), Y. Yamada et al., *Macromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent No. 3914407, JP-A 63-26653, JP-A 55-164824, JP-A 62-69263, JP-A 63-14603, JP-A 63-163452, JP-A 62-153853 and JP-A 63-146029.

Compounds generating an acid by light which are described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779, 778 and European Patent No. 126,712 can also be used.

In the present embodiment, the agent generating an acid by light is used generally in an amount of about 40% by weight or less, preferably in an amount of 20% by weight or less and more preferably in an amount of 5% by weight or less, of the total amount of the solid components in the photosensitive layer. When the amount of the acid generating agent exceeds 40% by weight, the property to prevent staining deteriorates and such an amount is not preferable.

[Lithographic form Plate]

When the above first image-forming material is used for a lithographic form plate, the lithographic form plate is prepared in accordance with the following general process. The above first image-forming material is suited for application to a lithographic form plate but the application of this material is not limited to the lithographic form plate.

The lithographic form plate is generally prepared by dissolving components described above in a solvent and applying the result to a suitable substrate. Examples of the solvent used in this step include: ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone and toluene. However, the solvent is not limited to these examples. The solvent can be used singly or as a mixture of two or more types. The concentration of the above components, i.e., the total solid components including the additives, in the solvent is preferably of 1 to 50% by weight. The amount of the material coated on the substrate after application and drying, i.e., the amount of the solid components, is different depending on the application. When the product is used as a photosensitive form plate, it is generally preferable that the amount is 0.5 to 5.0 g/m$^2$. Various methods may be used to apply the solution to the substrate. For example, coating by a bar coater, rotation coating, spray coating, curtain coating, dip coating, coating by an air knife, coating by a blade or coating by a roll can be used. The smaller the coated amount, the better the apparent sensitivity but the more inferior the film characteristic of the photosensitive layer. This coating layer forms the photosensitive layer in the lithographic form plate.

The substrate is dimensionally stable with a plate shape. Examples of the substrate include paper, paper laminated with plastics (such as polyethylene, polypropylene and polystyrene), metal plates such as plates of aluminum, zinc and copper, plastic films such as films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal, and paper and plastic films laminated or deposited with the above metal. As the substrate in the present invention, polyester films and aluminum plates are preferable and aluminum plates are more preferable because aluminum plates have excellent dimensional stability and are relatively inexpensive. Preferable aluminum plates are plates of pure aluminum and plates of alloys containing aluminum as the main component and small amounts of other elements. The substrate may be a plastic film laminated or deposited with aluminum. The other elements contained in the aluminum alloy are silicon, iron, manganese, copper, magnesium, chromium, zinc, bismuth, nickel and titanium. The contained amount of the other elements in the alloy is to be 10% by weight or less. It is particularly preferable in the present invention that pure aluminum is used. However, a small amount of other metals may be contained because producing completely pure aluminum is technically difficult. The aluminum plate used in the present invention is not required to have a specific composition but conventionally available aluminum plates can be suitably used. The thickness of the aluminum plate used in the present invention is about of 0.1 mm to 0.6 mm, preferably of 0.15 to 0.4 mm and more preferably of 0.2 to 0.3 mm.

The aluminum plate is used after the surface has been made rough. Before making the surface rough, the degreasing treatment using, for example, a surfactant, an organic solvent or an alkaline aqueous solution may be conducted to remove oil used in rolling from the plate surface, where necessary.

The surface-roughening treatment for the aluminum plate can be conducted in accordance with various methods, such as a mechanical method in which the surface is mechanically made rough, an electrochemical method in which the surface is made rough by electrochemically dissolving the surface and a chemical method in which the surface is chemically dissolved selectively. As the mechanical method, a conventional method such as abrading by balls, abrading by brushes, abrading by blasting and abrading by buffing can be used. As the electrochemical method, an aluminum plate may be treated by an alternating electric current or a direct electric current in an electrolyte containing hydrochloric acid or nitric acid. A combination of these methods can also be conducted as shown in the specification of JP-A 54-63902.

The aluminum plate the surface of which has been made rough is treated by an alkali etching treatment and a neutralization treatment and then treated by anode oxidation to improve a property of the surface to hold water and to increase wear resistance, where necessary. As the electrolyte used for anode oxidation of the aluminum plate, various electrolytes that can form porous oxide films can be used. In general, sulfuric acid, phosphoric acid, oxalic acid, chromic acid or a mixture of these acids is used. The concentration of the electrolyte is suitably selected in accordance with the type of the electrolyte.

The conditions for anode oxidation varies depending on the used electrolyte and may be generally decided. In general, a concentration of the electrolyte of 1 to 80% by weight, a temperature of the liquid of 5 to 70° C., a current density of 5 to 60 A/dm$^2$, a voltage of 1 to 100 V and a time of electrolysis of 10 seconds to 5 minutes are suitable. When the amount of the film formed by anode oxidation is less than 1.0 g/m$^2$, resistance to printing stress is occasionally insufficient. Moreover, non-image portions of the lithographic form plate tend to have scratches and this tends to cause so-called scratch stains due to ink attaching to the scratches during printing.

The aluminum plate, which has been treated by anode oxidation, may have a hydrophilizing treatment carried out on the surface, where necessary. As the hydrophilizing treatment used in the present invention, an alkali metal silicate process such as a process using an aqueous solution of sodium silicate, which is disclosed in U.S. Pat. Nos. 2,714,066, 3,181,461, 3,280,734 and 3,902,734, can be used. In this process, the substrate is treated with an aqueous solution of sodium silicate by dipping the substrate into the solution or by electrolysis. Alternatively, the substrate may be treated with potassium fluorozirconate as disclosed in the specification of Japanese Patent Application Publication 36-22063 or with polyvinylphosphonic acid as disclosed in U.S. Pat. Nos. 3,276,868, 4,153,461 and 4,689,272.

An undercoat layer (a primer) may be formed between the substrate and the photosensitive layer, where necessary. As the component of the undercoat layer, various organic compounds can be used. The component may be selected, for example, from among the following carboxymethylcellulose; dextrin; gum arabic; organophosophonic acids such as a phosphonic acid having the amino group such as 2-aminoethylphosphonic acid, substituted and unsubstituted phenylphosphonic acids, naphthylphosphonic acids, alkylphosphonic acids, glycerophosphonic acids, methylenediphosphonic acids and ethylenediphosphonic acids; organophosphoric acids such as substituted and unsubstituted phenylpohosphoric acids, naphthyl-phosphoric acids, alkylphospohoric acids and glycerophosphoric acids; organophosphinic acids such as substituted and unsubstituted phenylphosphinic acids, naphthylphosphinic acids, alkylphosphinic acids and glycerophosphinic acid; amino acids such as glycine and β-alanine; and amine hydrochlorides having a hydroxyl group such as triethanolamine hydrochlorides. The above compounds may be used singly or as a mixture of two or more types.

The organic undercoat layer can be formed in accordance with one of the following processes. In one process, a solution prepared by dissolving the above organic compound in water, an organic solvent such as methanol, ethanol or methyl ethyl ketone, or a mixture of water and such an organic solvent, is applied to the aluminum plate and dried. In another process, the aluminum plate is dipped into a solution prepared by dissolving the above organic compound in water, an organic solvent such as methanol, ethanol or methyl ethyl ketone, or a mixture of water and such an organic solvent, so that the above compound is sorbed onto the aluminum plate and the treated aluminum plate is then washed with water or the like and dried to form the organic undercoat layer. In the first process, a solution of the above organic compound having a concentration of 0.005 to 10% by weight can be applied by various methods. In the second process, the concentration of the organic compound in the solution is of 0.01 to 20% by weight and preferably of 0.05 to 5% by weight, the temperature of dipping is of 20 to 90° C. and preferably of 25 to 50° C. and the time period for dipping is 0.1 seconds to 20 minutes and preferably 2 seconds to 1 minute. The solution used in these processes can be adjusted to a pH of 1 to 12 using a basic substance such as ammonia, triethylamine and potassium hydroxide or an acidic substance such as hydrochloric acid or phosphoric acid. A yellow dye may be added to improve the color-tone-reproduction property of the image-forming material.

It is suitable that the applied amount of the organic primer layer is of 2 to 200 mg/m$^2$ and preferably of 5 to 100 mg/m$^2$. When the applied amount is less than 2 mg/m$^2$, sufficient resistance to printing stress cannot be obtained. Similarly, when the amount exceeds 200 mg/m$^2$, sufficient resistance to printing stress cannot be obtained.

The prepared lithographic form plate is generally exposed to imagewise exposure, developing processing is applied, and the images are formed on the form plate. As a light source of an active light used for imagewise exposure, a mercury lamp, a metal halide lamp, a xenon lamp, a chemical lamp or a carbon arc lamp, for example, can be used. Other irradiations such as an electron beam, X-ray, ion beam, far infrared light, g-ray, i-ray, deep-UV light and high density energy beam (laser beam) can also be used. As the laser beam, beams from helium-neon lasers, argon lasers, krypton lasers, helium-cadmium lasers, Kr-F excimer lasers, solid lasers and semiconductor lasers can be used. In the present invention, a light source emitting light of a wavelength in the near infrared to infrared region is preferable and light from a solid laser and a semiconductor laser is more preferable.

As the developer and a replenisher used for processing, conventionally used aqueous solutions of an alkali can be used. Examples of the alkali include: inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogen-carbonate, sodium borate, potassium borate, ammonium borate, sodium hydroxide, potassium hydroxide, ammonium hydroxide and lithium hydroxide. Other examples of the alkali include: organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali may be used singly or as a combination of two or more types.

Among the above solutions of an alkali, solutions of silicates such as sodium silicate and potassium silicate are particularly preferably used as the developer because the property for developing can be adjusted by changing the ratio of silicon dioxides $SiO_2$ the components of the silicate to the oxide of the alkali metal $M_2O$ and by changing the concentrations of these components. For example, alkali metal silicates described in JP-A 54-62004 and Japanese Application Patent Publication No. 57-7427 are effectively used.

When developing is conducted using an automatic processer, it is known that a large number of PS plates can be processed without exchanging the developer in the developer tank for a long time if an aqueous solution having a higher alkali strength than that of the developer (a replenisher) is added to the developer. In the present invention, this method of replenishing can be advantageously adopted. To the developer and the replenisher, various surfactants and organic solvents can be added in accordance with necessity to promote or suppress developing, to disperse waste substances formed by developing or to increase affinity of the formed image portion of the form plate to ink. Examples of preferable surfactants include: anionic surfactants, cationic surfactants, nonionic surfactants and amphoteric surfactants. Moreover, reducing agents such as hydroquinone, resorcinol and sodium salts, and potassium salts of inorganic acids such as sulfurous acid and hydrogensulfurous acid; organic carboxylic acids; defoaming agents; and softeners for hard water may be added to the developer and the replenisher, where necessary. The lithographic form plate to which developing processing has been applied with the developer and the replenisher is then subjected to posttreatments such as with washing water, with a rinsing liquid containing a surfactant or with a desensitization liquid containing gum arabic and a starch derivative. As the posttreatment of the form plate using the image-forming material of the present invention, various combinations of the above posttreatments can be applied.

Recently, automatic processor for form plates are widely used in the form-plate manufacturing and printing industries, to rationalize and standardize operations of making form (machine) plates. The lithographic form plate of the present invention can be processed by such automatic processor. Automatic processor are generally composed of a developing portion and a posttreatment portion and contain apparatuses for transferring form plates, tanks of various processing solutions and spraying apparatuses. While form plates which have been exposed to light are transferred in a horizontal direction, various processing solutions pumped up from tanks are sprayed through nozzles for developing treatment. In some recent machines, form plates are processed by dipping into processing solutions in tanks filled with the processing solutions and transferred through the solutions by guide rolls. In these automatic treatments, processing can be conducted while the replenisher is supplied in accordance with the amount of processing and the time of operation. The so-called single-use method in which processing is conducted using substantially fresh processing solutions can also be used.

After imagewise exposure, developing, washing with water and/or rinsing and/or coating with gum, unnecessary images on the lithographic form plate such as film edges of the original plate, if any, may be eliminated. As a method of elimination, a method described in Japanese Patent Publication No. 2-13293, in which an elimination liquid is applied to an unnecessary image portion and, after being left standing for a prescribed time, the portion is washed with water, is preferable. A method described in JP-A 59-174842, in which the unnecessary image portion is irradiated with an active light through optical fibers and then developed, may also be used.

The lithographic form plate which has been treated as described above is coated with desensitizing gum, where necessary, and used in a printing step. The form plate may be subjected to a burning treatment to improve resistance to printing stress. When a lithographic form plate is subjected to the burning treatment, it is preferable that, before the burning treatment, the lithographic form plate is treated with an affinitizing liquid such as those described in the specifications of Japanese Patent Application Publication Nos. 61-2518 and 55-28062, JP-A 62-31859 and JP-A 61-159655. In the treatment, the affinitizing liquid is applied to the surface of the lithographic form plate using a sponge or absorbent cotton impregnated with the affinitizing liquid or the lithographic form plate is dipped into a vat filled with the affinitizing liquid. An automatic coater may also be used for this purpose. It is more preferable that the coating is made uniform by a squeegee or a squeegee roller. It is generally suitable that the applied amount of the affinitizing liquid is of 0.03 to 0.8 g/m² (weight after being dried).

The lithographic form plate which has been treated with the affinitizing liquid and dried may be heated to a high temperature by a burning processor such as a burning processor BP-1300, a trade name, marketed by FUJI PHOTO FILM Co., Ltd. The temperature and the time of heating are varied depending on the type of components forming the images. It is preferable that heating is conducted at a temperature in the range of 180 to 300° C. for 1 to 20 minutes.

The lithographic form plate which has been subjected to burning processing may suitably be subjected to conventional treatments such as washing with water or coating with gum. When an affinitizing liquid containing a macromolecular compound soluble in water is used, the so-called desensitizing processing such as coating with gum may be omitted.

The lithographic form plate obtained after the above treatments is set in an offset printer or the like and used for printing.

EXAMPLES

Photosensitive lithographic form plates using the first image-forming material of the present embodiment will be described more specifically with reference to the following examples. However, the present invention is not limited by the examples.

Example 1
Preparation of a Substrate

An aluminum plate (material 1050) having a thickness of 0.3 mm was degreased by washing with trichloroethylene. The washed aluminum plate was treated with a nylon brush and with pumice-water suspension of 400 mesh in water to roughen the surface and then washed well with water. The treated plate was dipped into a 25% aqueous solution of sodium hydroxide at 45° C. for 9 seconds for etching, washed with water, then dipped into a 2% nitric acid for 20 seconds and washed with water. The amount of etching of the roughened surface was about 3 g/m². An oxide coating layer of 3 g/m² was formed on the plate by direct current anode oxidation using a 7% sulfuric acid as the electrolyte at a density of electric current of 15 A/dm² and then the plate was washed with water and dried. The following undercoat liquid was applied to the plate and the undercoat layer was dried at 90° C. for 1 minute. The amount of the dried undercoat layer was 10 mg/m².

| Composition of the undercoat liquid | |
|---|---|
| β-alanine | 0.5 g |
| methanol | 95 g |
| water | 5 g |

Photosensitive Liquid 1 shown in the following was applied to the obtained substrate in such an amount that the amount of coating was 1.8 g/m² and a lithographic form plate of Example 1 was obtained.

| Composition of Photosensitive Liquid 1 | |
|---|---|
| m-, p-cresol novolak (a macromolecular binder soluble in water and insoluble in an aqueous solution of an alkali) m/p ratio = 6/4; weight-average molecular weight, 3500; contained amount of unreacted cresol, 0.5% by weight; | 1.0 g |
| infrared light absorbing agent (Compound 3) | 0.2 g |
| a dye obtained by converting the counter anion of VICTORIA PURE BLUE BOH to 1-naphthalenesulfonate anion | 0.02 g |
| surfactant containing fluorine (MEGAFAC F-177, a trade name; manufactured by DAINIPPON INK KAGAKU KOGYO Co., Ltd.) | 0.05 g |
| γ-butyrolactone | 3 g |
| methyl ethyl ketone | 8 g |
| 1-methoxy-2-propanol | 7 g |

Example 2

In accordance with the same procedures as those conducted in Example 1 except that another infrared light absorbing agent (Compound 12) was used in place of Compound 3, a lithographic form plate of Example 2 was obtained.

Comparative Example 1

In accordance with the same procedures as those conducted in Example 1 except that another infrared light absorbing agent (Reference Compound 1 shown in the following) was used in place of Compound 3, a lithographic form plate of Comparative Example 1 was obtained.

Reference Compound 1

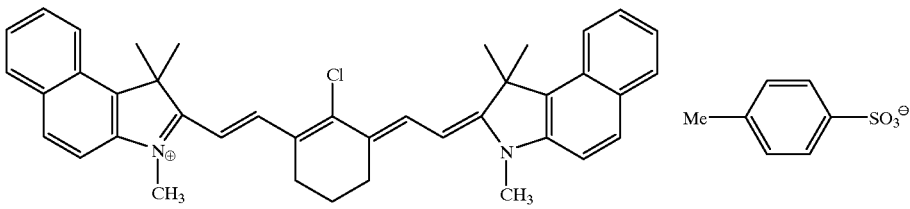

Comparative Example 2

In accordance with the same procedures as those conducted in Example 1 except that another infrared light absorbing agent (Reference Compound 2 shown in the following) was used in place of Compound 3, a lithographic form plate of Comparative Example 2 was obtained.

Reference Compound 2

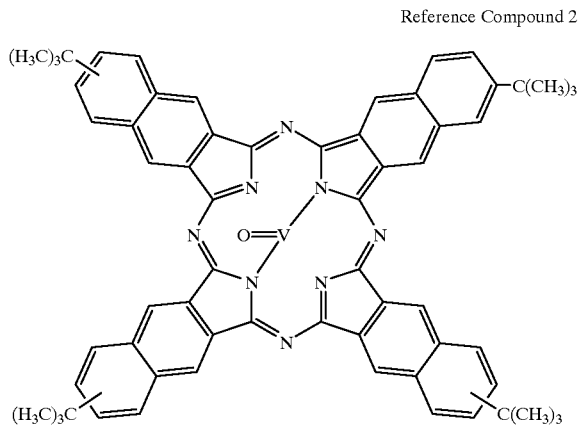

Example 3

Into a 100 ml three-necked flask equipped with a stirrer, a cooler and a dropping funnel, 5.04 g (0.0210 mol) of N-(p-aminosulfonylphenyl)-methacrylamide, 2.05 g (0.0180 mol) of ethyl methacrylate, 1.11 g (0.021 mol) of acrylonitrile and 20 g of N,N-dimethylacetoamide were placed and the mixture was stirred while being heated at 65° C. in a hot water bath. To this mixture, 0.15 g of V-65 (a trade name, manufactured by WAKO JUN'YAKU Co., Ltd.) was added and the resultant mixture was stirred for 2 hours under a nitrogen stream while the temperature was kept at 65° C. To this reaction mixture, a mixture of 5.04 g of N-(p-aminosulfonylphenyl)methacrylamide, 2.05 g of ethyl methacrylate, 1.11 g of acrylonitrile, 20 g of N,N-dimethylacetoamide and 0.15 g of V-65 was added dropwise from the dropping funnel over 2 hours. After the addition was completed, the reaction mixture was further stirred at 65° C. for 2 hours. After the reaction was completed, 40 g of methanol was added to the reaction mixture and the mixture was cooled. The obtained mixture was added into 2 liters of water which was kept being stirred. After the mixture was stirred for 30 minutes, the formed precipitate was separated by filtration and dried to obtain 15 g of a white solid (Copolymer 1). The weight-average molecular weight of Copolymer 1 was measured by the gel permeation chromatography using polystyrene as the reference and was found to be 53,000.

On a substrate which was similar to the substrate obtained in Example 1, a Photosensitive Liquid 2 shown in the following was applied so that a film of 1.8 g/m² was formed and a lithographic form plate of Example 3 was obtained.

| Composition of Photosensitive Liquid 2 | |
|---|---|
| Copolymer 1 prepared above | 1.0 g |
| infrared light absorbing agent (Compound 1) | 0.1 g |
| a dye obtained by converting the counter anion of VICTORIA PURE BLUE BOH to 1-naphthalenesulfonate anion | 0.02 g |
| surfactant containing fluorine (MEGAFAC F-177, a trade name; manufactured by DAINIPPON INK KAGAKU KOGYO Co., Ltd.) | 0.05 g |
| γ-butyrolactone | 8 g |
| methyl ethyl ketone | 8 g |
| 1-methoxy-2-propanol | 4 g |

Example 4

In accordance with the same procedures as those conducted in Example 1 except that another infrared light absorbing agent (Compound 8) was used in place of Compound 3, a lithographic form plate of Example 4 was obtained.

Example 5

In accordance with the same procedures as those conducted in Example 1 except that another infrared light absorbing agent (Compound 9) was used in place of Compound 3, a lithographic form plate of Example 5 was obtained.

Example 6

In accordance with the same procedures as those conducted in Example 1 except that another infrared light absorbing agent (Compound 13) was used in place of Compound 3, a lithographic form plate of Example 6 was obtained.

[Evaluation of Lithographic form Plates]

Properties of the lithographic form plates of Examples 1 to 6 and Comparative Examples 1 and 2 were evaluated in accordance with the following methods. The results are shown in Table 1.

(Evaluation of the Sensitivity and the Developing Latitude (the Image-Forming Properties)

The obtained lithographic form plate was exposed to light using a semiconductor laser emitting light of a wavelength of 830 nm. After exposure, developing was conducted using an automatic processor (PS PROCESSOR 900 VR, manufactured by FUJI PHOTO FILM Co., Ltd.) with a developer DP-4 and a rinsing solution FR-3 (diluted at a ratio of 1:7), both manufactured by FUJI PHOTO FILM Co., Ltd. The developer DP-4 was diluted to prepare two solutions, i.e., one solution diluted at a ratio of 1:6 and another solution diluted at a ratio of 1:12. The line width in the portion which did not have images was measured in each case in which each developer was used. Then, the energy of laser irradiation corresponding to the line width was obtained and the obtained value was regarded as the sensitivity ($mJ/cm^2$). Difference between the sensitivity obtained by using the developer diluted by the ratio of 1:6, which was used as the reference, and the sensitivity obtained by using the developer diluted by the ratio of 1:12 was obtained. The smaller the difference, the better the developing latitude. A developing latitude of 20 $mJ/cm^2$ or less indicates a practically useful level.

TABLE 1

| | | image-forming properties | |
|---|---|---|---|
| | infrared light absorbing agent | sensitivity ($mJ/cm^2$) | developing latitude |
| Example 1 | Compound 3 | 120 | 5 |
| Example 2 | Compound 12 | 115 | 5 |
| Comparative Example 1 | Reference Compound 1 | 180 | 25 |
| Comparative Example 2 | Reference Compound 2 | 200 | 30 |
| Example 3 | Compound 1 | 130 | 10 |
| Example 4 | Compound 8 | 110 | 10 |
| Example 5 | Compound 9 | 100 | 15 |
| Example 6 | Compound 13 | 140 | 10 |

Evaluation of Storage Stability

After the obtained lithographic form plate was stored at 60° C. for 3 days, the lithographic form plate was exposed to laser light and developed in accordance with the same procedures as those described above for the evaluation of the sensitivity and the developing latitude (the image-forming properties). The sensitivity of the developed form plate was measured and the obtained value was compared with the value obtained before the storage. All lithographic form plates showed a change in the sensitivity of 20 $mJ/cm^2$ or less.

The results in Table 1 show that the lithographic form plates of Examples 1 to 6 showed higher sensitivities to the infrared laser light and better developing latitudes, i.e., more excellent image-forming properties, than those of the lithographic form plates of Comparative Examples 1 and 2. The lithographic form plates each showed a small change in sensitivity after storage and thus have excellent storage stability.

In summary, in accordance with the present embodiment, the lithographic form plate onto which digital data of computers can be directly inscribed by a solid laser and a semiconductor laser that emits infrared light and shows excellent image-forming properties (sensitivity and developing latitude) and storage stability can be obtained by using the above first image-forming material.

The photosensitive lithographic form plate in which the second image-forming material of the present invention is used will be described as the second embodiment.

The composition of the second image-forming material will be first described in detail.

The second image-forming material described in the present embodiment comprises (C) a macromolecular compound which is decomposed by heating or with an acid and becomes soluble in water or an alkali and (B) an infrared light absorbing agent having a hydrophobic functional group which changes to hydrophilic due to heat.

The infrared light absorbing agent having a hydrophobic functional group which changes to hydrophilic due to heat as component (B) is the same as the infrared light absorbing agent having a hydrophobic functional group which changes to hydrophilic due to heat of component (B) contained in the first image-forming material described in the first embodiment and a detailed description of component (B) is omitted.

The second image-forming material used in the present embodiment may further comprise an agent generating an acid and other substances in addition to components (B) and (C) described above in accordance with the object.

[(C) Macromolecular Compound which is Decomposed by Heating or with an Acid and Becomes Soluble in Water or an Alkali]

In the present embodiment, the macromolecular compound which is decomposed by heating or with an acid and becomes soluble in water or an alkali means a macromolecular compound which becomes soluble in water or an alkali under heating and/or by the action of an acid. Examples of the compound which becomes soluble in water or an alkali under heating or by the action of an acid include polymers of sulfonic esters and polymers of carboxylic esters.

As the polymer of sulfonic ester of the present embodiment, polymers described in Japanese Patent Application Nos. 9-26878, 9-89451, 9-85328 and 9-89816 can be used. As the polymer of carboxylic ester, polymers of alkoxyalkylesters described in Japanese Patent Application No. 9-248994 and t-alkylcarboxylic esters and benzyl carboxylates described in JP-A 7-186562 can be used. Among these compounds, sulfonic esters represented by General Formula (1) described in claim 1 of Japanese Patent Application No. 9-26878, sulfonic esters described in claims of Japanese Patent Application No. 9-85328 and t-alkylcarboxylic esters, benzyl carboxylates and pyranyl carboxylates described in claim 3 of JP-A 7-186562 are preferably used.

Specific examples of the macromolecular compound which is decomposed by heating or with an acid and becomes soluble in water or an alkali, which is used in the present embodiment, are shown in the following. Examples of the polymer of sulfonic ester are shown as 1p-1 to 1p-8 and examples of the polymer of carboxylic ester are shown as al to a10. However, the present invention is not limited to these examples.

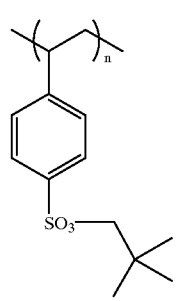

(1p-1)

(1p-2) 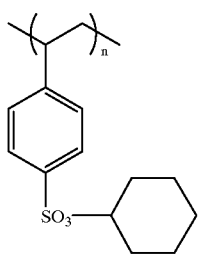
(1p-3) 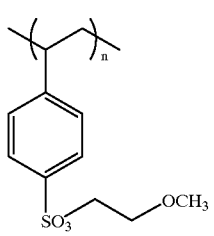
(1p-4) 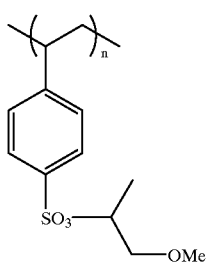
(1p-5) 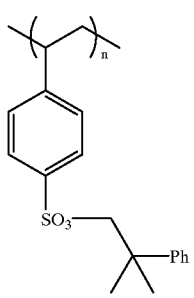
(1p-6) 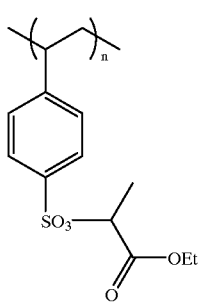
(1p-7) 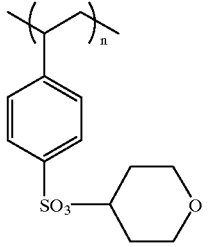
(1p-8) 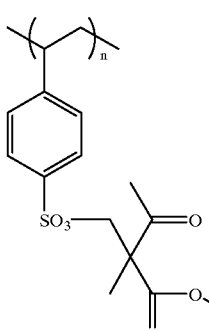
(a1) 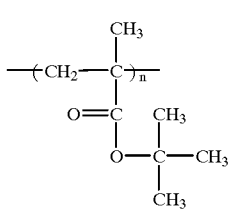
(a2) 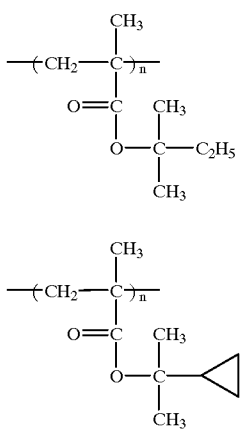
(a3) 
(a4) 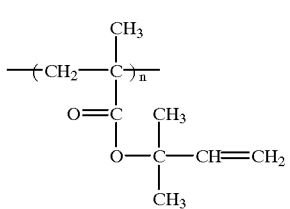

-continued (a5) 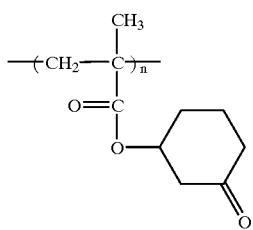

(a6) 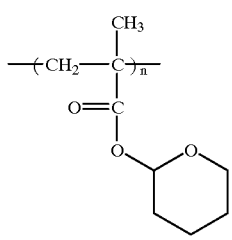

(a7) 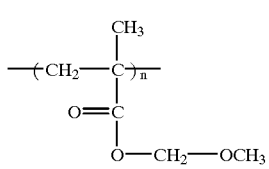

(a8) 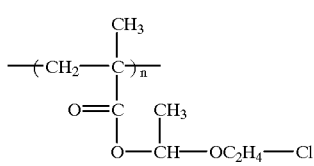

(a9) 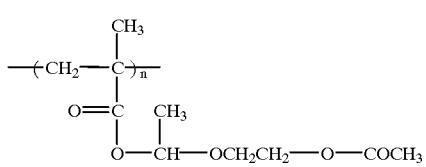

(a10) 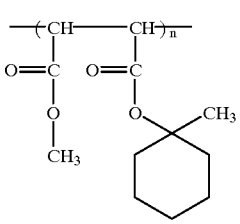

In the present embodiment, when the macromolecular compound which is decomposed by heating or with an acid and becomes soluble in water or an alkali is used, the compound is used in an amount of about 3 to 98% by weight, preferably 5 to 80% by weight and more preferably 10 to 60% by weight, of the total amount of the solid components in the photosensitive layer. An amount of the macromolecular compound which is decomposed by heating or with an acid and becomes soluble in water or an alkali less than 3% by weight is not preferable from the standpoint of the image-forming properties and an amount exceeding 98% by weight is not preferable from the standpoint of sensitivity.

[The Agent Generating an Acid]

In the present embodiment, the agent generating an acid is not particularly required because the infrared absorbing agent having a thermally decomposable ester group plays the role of the agent generating an acid. When further increased sensitivity is desired, it is preferable that the agent generating an acid is used.

The agent generating an acid is a compound that generates an acid by heat or light. Examples of such a compound generally include photoinitiators used in photocationic polymerization, photoinitiators used in photoradical polymerization, agents for decoloring colorants by light, agents that change color by light, conventional compounds that generate acid by light and are used for microresists, and mixtures of these compounds. These compounds may be suitably selected and used as the above agent.

The agents generating an acid that are described above in the first embodiment may be used as the agent generating an acid. Therefore, a detailed description of this agent is omitted.

[Other Components]

In the second image-forming material used in the present embodiment for forming a photosensitive layer of the photosensitive lithographic form plate, various other additives may also be added, where necessary, in addition to the above components to obtain various properties of the lithographic form plate.

For example, a dye having a large absorption in the visible region can be used as the coloring agent of images.

Specific examples of the preferable dye include: OIL YELLOW #101, OIL YELLOW #103, OIL PINK #312, OIL GREEN BG, OIL BLUE BOS, OIL BLUE #603, OIL BLACK BY, OIL BLACK BS and OIL BLACK T-505 (all trade names; manufactured by ORIENT KAGAKUKOGYO Co., Ltd.); victoria pure blue, crystal violet (CI 42555), methyl violet (CI 42535), ethyl violet, rhodamine B (CI 145170B), Malachite green (CI 42000), methylene blue (CI 52015); and dyes described in the specification of JP-A 62-293247.

It is preferable that the dye is added because difference between the image portions and non-image portions can be made clearer after the images are formed. The amount of the dye is of 0.01 to 10% by weight, of the total amount of the solid components in the photosensitive layer.

It is advantageous in the present embodiment that an additive such as a silane coupling agent is added to the liquid used for forming the photosensitive layer of the lithographic form plate so that the macromolecular compound which becomes soluble in water or in an alkali is used in a cured condition.

In the photosensitive layer of the lithographic form plate prepared by using the second image-forming material of the present embodiment, nonionic surfactants described in JP-A 62-251740 and JP-A 3-208514 and amphoteric surfactants described in JP-A 59-121044 and JP-A 4-13149 may be further used to improve stability of processing with respect to developing conditions.

Specific examples of the nonionic surfactant include sorbitan tristearate, sorbitan monopalmitate, sorbitan trioleate, stearic acid monoglyceride and polyoxyethylene nonylphenyl ether.

Specific examples of the amphoteric surfactant include: alkyldi(aminoethyl)glycines, alkylpolyaminoethylglycine hydrochlorides, 2-alkyl-N-carboxyethyl-N-hydroxyethylimidazolinium betaine and N-tetradecyl-N,N-betaine (for example, AMOGEN K, a trade name; manufactured by DAIICHI KOGYO Co., Ltd.). The contained amount of the above nonionic surfactants and amphoteric surfactants is preferably of 0.05 to 15% by weight and more preferably of 0.1 to 5% by weight, of the photosensitive layer of the photosensitive lithographic form plate.

To the photosensitive layer of the lithographic form plate prepared by using the second image-forming material of the present embodiment, a plasticizer may further be added to impart flexibility to the coating layer, where necessary. Examples of the plasticizer include: butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of acrylic acid or methacrylic acid.

To the photosensitive layer of the lithographic form plate of the present embodiment, the above onium salts, s-triazine and substituted with a haloalkyl group, epoxy compounds, vinyl ethers, phenol compounds having a hydroxymethyl group and phenol compounds having an alkoxymethyl group which are described in Japanese Patent Application No. 7-18120, and phenol novolak resins and cresol novolak resins may be further added.

[Lithographic form Plate]

The above second image-forming material is suited for application to a photosensitive lithographic form plate but application of this material is not limited to the lithographic form plate. The general process for preparation of the photosensitive lithographic form plate in the present embodiment will be described in the following.

The photosensitive lithographic form plate of the present embodiment is generally prepared by dissolving components described above in a solvent and applying the result to a suitable substrate to form the coating layer. Examples of the solvent used in this step include: ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and water. However, the solvent is not limited to these examples. The solvent can be used singly or as a mixture of two or more types. The concentration of the above components in the solution, i.e., the total solid components including the additives in the solution is preferably of 1 to 50% by weight. The amount of the material coating the substrate after applying and drying the solution, i.e., the amount of the solid components of the coating, is different depending on the application. When the product is used as the photosensitive lithographic form plate, it is generally preferable that the amount is of 0.5 to 5.0 $g/m^2$. Various methods may be used to apply the solution to the substrate. For example, the following can be used: coating by a bar coater, rotation coating, spray coating, curtain coating, dip coating, coating by an air knife, coating by a blade or coating by a roll. The smaller the amount of the coating, the better the apparent sensitivity but the more inferior the properties of the layer.

To the photosensitive layer of the photosensitive lithographic form plate of the present embodiment, a surfactant such as a surfactant containing fluorine, which is described in the specification of JP-A 62-170950, may be added to improve coatability. The amount is preferably of 0.01 to 1% by weight and more preferably of 0.05 to 0.5% by weight, of the total amount of the solid components in the photosensitive layer.

The substrate used in the present embodiment is dimensionally stable with a plate shape. Examples of the substrate include: paper; paper laminated with plastics such as polyethylene, polypropylene and polystyrene; metal plates such as plates of aluminum, zinc and copper; plastic films such as films of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal; and paper and plastic films, which are laminated or deposited with the above metals.

As the substrate in the present invention, polyester films and aluminum plates are preferable and aluminum plates are more preferable because aluminum plates have excellent dimensional stability and are relatively inexpensive. Preferable aluminum plates are plates of pure aluminum and plates of alloys containing aluminum as the main component and small amounts of other elements. The substrate may be a plastic film laminated or deposited with aluminum. The other elements contained in the aluminum alloy may be silicon, iron, manganese, copper, magnesium, chromium, zinc, bismuth, nickel and titanium. The contained amount of the other elements is to be 10% by weight or less.

It is particularly preferable in the present invention that pure aluminum is used. However, small amounts of other metals may be contained because producing completely pure aluminum is technically difficult. The aluminum plate used in the present invention is not required to have a specific composition but conventionally available aluminum plates can be suitably used. The thickness of the aluminum plate used in the present invention is about 0.1 mm to 0.6 mm, preferably 0.15 to 0.4 mm and more preferably 0.2 to 0.8 mm.

Before the surface of the aluminum plate is made rough, a treatment for degreasing using, for example, a surfactant, an organic solvent or an alkaline aqueous solution may be conducted, to remove oil used in rolling, where necessary.

The aluminum plate used in the present embodiment may have the above degreasing treatment, the surface-roughening treatment, the etching treatment with an alkali, the neutralization treatment, anode oxidation treatment and the hydrophilizing treatment in the same manner as the aluminum plate used in the above first embodiment. These treatments are essentially the same as the corresponding treatments of the aluminum plate described in the first embodiment. Therefore, detailed descriptions on these treatments are omitted.

An undercoat (primer) layer may be formed on the substrate of the photosensitive lithographic form plate of the present embodiment, where necessary.

As the component of the undercoat layer, various organic compounds can be used. The component is selected, for example, from: carboxymethylcellulose; dextrin; gum arabic; organophosphonic acids such as a phosphonic acid having the amino group such as 2-aminoethylphosphonic acid, substituted and unsubstituted phenylphosphonic acids, naphthylphosphonic acids, alkylphosphonic acids, glycerophosphonic acids, methylenediphosphonic acids and ethylenediphosphonic acids; organophosphoric acids such as substituted and unsubstituted phenylpohosphoric acids, naphthylphosphoric acids, alkylphospohoric acids and glycerophosphoric acids; organophosphinic acids such as substituted and unsubstituted phenylphosphinic acids, naphthylphosphinic acids, alkylphosphinic acids and glycerophosphinic acids; amino acids such as glycine and β-alanine; and amine hydrochlorides having a hydroxyl group such as triethanolamine hydrochloride. The above compounds may be used singly or as a mixture of two or more types.

It is suitable that the applied amount of the organic undercoat layer is 2 to 200 $mg/m^2$.

The photosensitive lithographic form plate of the present embodiment can be prepared as described above. The prepared photosensitive lithographic form plate is exposed to light from a solid laser or a semiconductor laser emitting infrared light of a wavelength of 760 to 1200 mm and images are formed. In the case of the photosensitive lithographic form plate of the present embodiment, the plate can be set in an offset printer or the like immediately after being exposed to light and used to print many sheets.

EXAMPLES

The present embodiment will be described more specifically with reference to following examples. However, the present embodiment is not limited by the examples.

Example 1
Preparation of a Lithographic form Plate that can be Directly Used

An aluminum plate (material 1050) having a thickness of 0.3 mm was degreased by washing with trichloroethylene. The washed aluminum plate was surface-roughened with a nylon brush and with pumice-water suspension of 400 mesh and then washed well with water. The processed plate was dipped into a 25% aqueous solution of sodium hydroxide at 45° C. for 9 seconds for etching, washed with water, then dipped into a 2% nitric acid for 20 seconds and washed with water. The amount of etching of the roughened surface was about 3 g/m². An oxide coating layer of 3 g/m² was formed on the plate by direct current anode oxidation using a 7% sulfuric acid as the electrolyte at a density of electric current of 15 A/dm² and then the plate was washed with water and dried.

Then, a photosensitive liquid having the following composition was prepared and applied to the aluminum plate treated above. The coated aluminum plate was dried at 100° C. for 2 minutes to obtain the lithographic original plate. The dried weight of the layer was 1.2 g/m².

| Composition of photosensitive liquid | |
|---|---|
| thermally decomposable polymer (1p-4) (molecular weight, 20,000) | 1.00 g |
| infrared light absorbing agent (Compound 1) | 0.15 g |
| a dye obtained by converting the counter anion of VICTORIA PURE BLUE BOH to 1-naphthalenesulfonate anion | 0.05 g |
| surfactant containing fluorine (MEGAFAC F-177, a trade name; manufactured by DAINIPPON INK KAGAKU KOGYO Co., Ltd.) | 0.06 g |
| methyl ethyl ketone | 20 g |
| methanol | 7 g |

The obtained lithographic original form plate was exposed to light from an IR laser emitting infrared light of a wavelength of 830 nm (diameter of beam: 28 µm). After exposure, the plate was heated at 110° C. for 1 minute and then used directly for printing with a LITHRON printer. Formation of stains in non-image portions during printing was examined by visual observation. Forty thousand excellent printed sheets without stains in the non-image portions were obtained.

The lines generated by scanning of the laser lights in the obtained form plates were observed by a microscope. The sensitivity of the form plate was evaluated from the measured line width. The nearer the line width to the beam of irradiation diameter of 28 µm, the higher the sensitivity.

Example 2

A lithographic original form plate was prepared and evaluated in accordance with the same procedures as those conducted in Example 1 except that Compound 2 was used as the infrared light absorbing agent in place of Compound 1.

Example 3

A lithographic original form plate was prepared and evaluated in accordance with the same procedures as those conducted in Example 1 except that Compound 3 was used as the infrared light absorbing agent in place of Compound 1.

Example 4

A lithographic original form plate was prepared and evaluated in accordance with the same procedures as those conducted in Example 1 except that Compound 8 was used as the infrared light absorbing agent in place of Compound 1.

Example 5

A lithographic original form plate was prepared and evaluated in accordance with the same procedures as those conducted in Example 1 except that Compound 11 was used as the infrared light absorbing agent in place of Compound 1.

Comparative Example 1

A lithographic original form plate was prepared and evaluated in accordance with the same procedures as those conducted in Example 1 except that Reference Compound 3 shown in the following was used as the infrared light absorbing agent in place of Compound 1.

Reference Compound 3

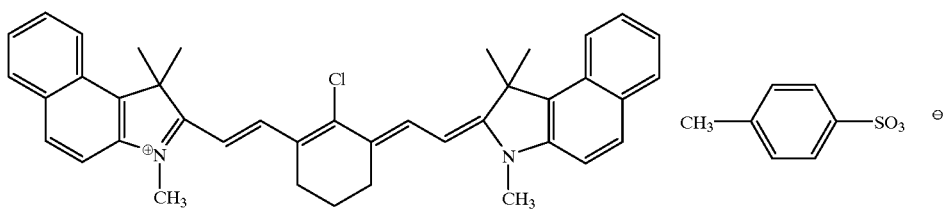

The results of the evaluation of the lithographic original form plates of Examples 1 to 5 and Comparative Example 1 are shown in Table 2.

TABLE 2

|  | infrared light absorbing agent | sensitivity ($\mu$m) | stain |
|---|---|---|---|
| Example 1 | Compound 1 | 25 | none |
| Example 2 | Compound 2 | 25 | none |
| Example 3 | Compound 3 | 25 | none |
| Example 4 | Compound 8 | 25 | none |
| Example 5 | Compound 11 | 25 | none |
| Comparative Example 1 | Reference Compound 3 | 18 | found |

The results in Table 2 show that the lithographic form plates of the present embodiment demonstrate high sensitivity and do not form stains.

Next, a radiation-sensitive lithographic form plate in which the third image-forming material of the present invention is used will be described as the third embodiment.

The composition of the third image-forming material will be first described in detail.

The third image-forming material described in the present embodiment comprises in its photosensitive layer a binder of cross-linked structure which contains a functional group that changes from hydrophobic to hydrophilic due to the action caused by at least one of heat, radiation and an acid, and an infrared absorption agent which has an hydrophobic functional group that changes to hydrophilic due heat.

The present embodiment is basically the same as the second embodiment, except that the present embodiment makes more detailed description on the binder and includes a plurality of water-insoluble solid particles as a unique component.

Accordingly, a detailed description of the components which has been already described in the second embodiment will be omitted. For example, as the structure of the infrared light absorbing agent having a hydrophobic functional group which changes to hydrophilic due to heat of the present embodiment is the same as that used in the second embodiment as component (B), a detailed description thereof is omitted.

The structure and characteristics of the binder will be first described hereinafter.

In the present embodiment, the binder is a crosslinked compound having a functional group which is changed from hydrophobic to hydrophilic by acid, radiation, or heat.

Here, "changing from hydrophobic to hydrophilic" means clearly changing to hydrophilic to the extent that the function of the printing surface of the lithographic form plate can be exhibited. To this end, it is preferable that the compound can reduce the in-atmosphere water droplet contact angle by 15° or more. Namely, it is preferable that the angle at which a water droplet contacts the compound in the ambient environment is reduced by 15° or more due to the action of acid, radiation, or heat, such that the compound which was originally hydrophobic becomes hydrophilic. Further, it is more preferable that the in-atmosphere water droplet contact angle of the compound is reduced by 40° or more. Concretely, it is preferable that a compound whose in-atmosphere water droplet contact angle is originally 60° or more is reduced by the action of acid, radiation or heat to become 20° or less.

In the present invention, if the compound is a compound which has the above property and is crosslinked, the compound can be preferably used as a binder. Specific examples of the group which changes from hydrophobic to hydrophilic due to heat are preferably at least one of sulfonic ester group and alkoxyalkylester group (hereinafter referred to as the functional group X).

Specific examples of the functional group X will be described in detail hereinafter.

The sulfonic ester group can be represented by following general formula (13).

$$—L^2—SO_2—O—R_{11} \qquad \text{General Formula (13)}$$

In the above general formula (13), $L^2$ represents an organic group formed from polyvalent nonmetal atoms which are necessary in order to bind the functional group represented by general formula (13) to the polymer skeleton, and $R_{11}$ represents a substituted or unsubstituted aryl group, a substituted or unsubstituted alkyl group, or a cyclic imide group.

When $R_{11}$ is an aryl group or a substituted aryl group, $R_{11}$ may include a carbocyclic aryl group and a heterocyclic (hetero) aryl group. Examples of the carbocyclic aryl group are groups having from 6 to 19 carbon atoms such as phenyl group, naphthyl group, anthracenyl group, pyrenyl group, and the like. Examples of the heterocyclic aryl group are groups having from 3 to 20 carbon atoms and from 1 to 5 hetero atoms such as pyridyl group, furyl group, and groups in which a benzene ring is condensed such as the quinolyl group, benzofuryl group, thioxanthone group, and carbazole group. When $R_{11}$ represents an alkyl group or a substituted alkyl group, the alkyl group may be a straight, branched, or cyclic alkyl group having from 1 to 25 carbon atoms such as methyl group, ethyl group, isopropyl group, t-butyl group, cyclohexyl group, and the like.

Among the above, especially preferred examples of $R_{11}$ are aryl groups substituted with an electron-withdrawing group such as a halogen group, a cyano group, or a nitro group; alkyl groups substituted with an electron-withdrawing group such as a halogen group, a cyano group, or a nitro group; a secondary or tertiary branched alkyl group; a cyclic alkyl group; and cyclic imides.

The polyvalent binding group formed from nonmetal atoms and represented by $L^2$ is formed from 1 to 60 carbon atoms, 0 to 10 nitrogen atoms, 0 to 50 oxygen atoms, 1 to 100 hydrogen atoms, and 0 to 20 sulfur atoms.

The alkoxyalkylester group can be represented by following general formula (14).

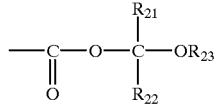

General Formula (14)

In general formula (14), $R_{21}$ represents a hydrogen atom, $R_{22}$ represents a hydrogen atom or an alkyl group having 18 or fewer carbon atoms, and $R_{23}$ represents an alkyl group having 18 or fewer carbon atoms. Of $R_{21}$, $R_{22}$, and $R_{23}$, two may be bonded together. In particular, it is preferable to bond $R_{22}$ and $R_{23}$ so as to form a 5- or 6-member ring.

In the present invention, the groups represented by above general formula (13) and general formula (14) are given as examples of the functional group X. However, it is particularly preferable that the functional group X is the sulfonic ester group represented by general formula (13).

It is preferable that the binder is a compound formed by crosslinking by some method macromolecular compounds obtained by radical polymerization of monomers selected from those having the functional group represented by general formula (13) or (14). The macromolecular compound may be a homopolymer using only one type of monomer having the functional group represented by general formula (13) or (14). Or, the macromolecular compound may be a copolymer of two or more types of monomers having the functional group represented by general formula (13) or (14), or may be a copolymer of a monomer having the functional group represented by general formula (13) or (14) and other monomer(s).

Preferable examples of such an other monomer include crosslinkable monomers such as glycidylmethacrylate, N-methylolmethacrylamide, 2-isocyanate ethylacrylate, or the like.

Particularly optimal examples of such an other monomer which is used for the copolymer are acrylic esters, methacrylic esters, acrylamides, methacrylamides, vinyl esters, styrenes, acrylic acids, methacrylic acids, and acrylonitriles, all having 20 or fewer carbon atoms.

The ratio of the monomer having the functional group represented by general formula (13) or (14), which monomer is used in synthesizing the copolymer, is preferably 5 to 99 wt %, and more preferably 10 to 95 wt %, with respect to the entire amount of monomer.

Next, a compound, which is used in the radiation-sensitive lithographic form plate of the present invention and which is a particularly preferable example of the binder, will be described. Hereinafter, this compound will be referred to as "compound A".

Compound A is a compound of a cross-linked structure which contains, in the same molecule, the above-described functional group X as well as at least one functional group Y which is a functional group selected from —OH, —NH$_2$, —COOH, —NH—CO—Q$^3$, —Si(OQ$^4$)$_3$, wherein Q$^3$ and Q$^4$ each represent an alkyl group or an aryl group, and in a case in which both Q$^3$ and Q$^4$ exist in the compound having these functional groups, Q$^3$ and Q$^4$ may be the same or different. Here, the functional group Y is a group used for crosslinking.

Specific examples of —NH—CO—Q$^3$ are —NH—CO—CH$_3$, —NH—CO—C$_2$H$_5$, and the like. Specific examples of —Si(OQ$^4$)$_3$ are —Si(OCH$_3$)$_3$, —Si(OC$_2$H$_5$)$_3$, and the like.

Compound A which is used in the present invention is a compound formed by crosslinking macromolecular compounds obtained by radical polymerization of the monomer having the functional group Y and the monomer having the functional group X (preferably, selected from the functional group represented by general formula (13) or (14)).

The mixing ratio of the monomer having the functional group X and the monomer having the functional group Y, which are used in synthesizing the copolymer, is, as a weight ratio, preferably 10:90 to 99:1, and more preferably 30:70 to 97:3.

Further, when a copolymer formed by using the other monomer(s) is used as the macromolecular compound, the ratio of the other monomer to the total amount of the monomer having the functional group X and the monomer having the functional group Y which are used in synthesizing the copolymer is preferably 5 to 99 wt % and more preferably 10 to 95 wt %.

Specific examples of the copolymer used in the present invention are given hereinafter. The numbers to the lower right of the parentheses in the chemical formulas denote the copolymer ratios.

(I-1) Through (I-17)

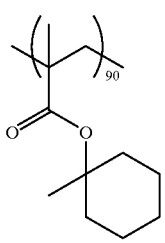
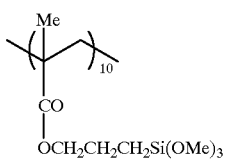
(1-1)

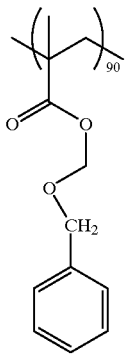
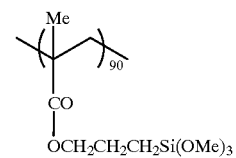
(1-2)

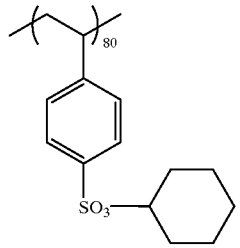
(1-3)

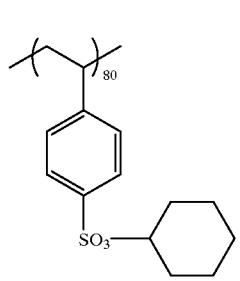
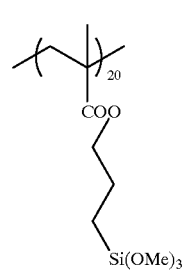
(1-4)

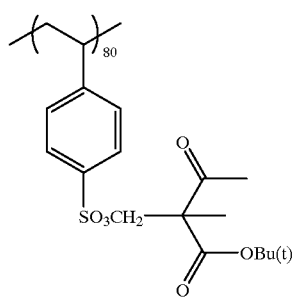
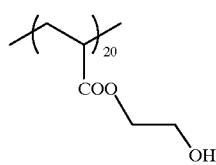
(1-5)

(1-6) 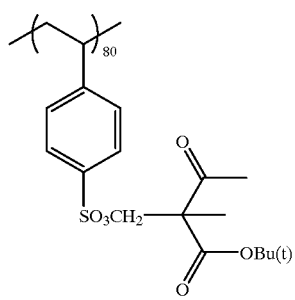
(1-7) 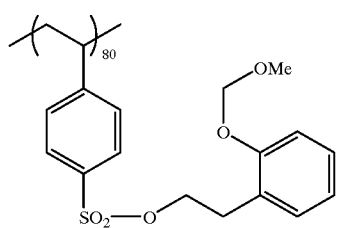
(1-8) 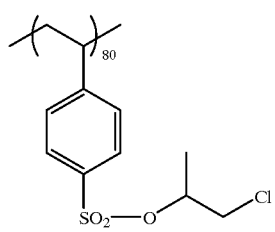 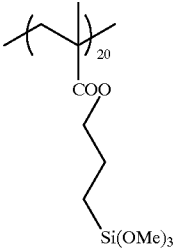
(1-9) 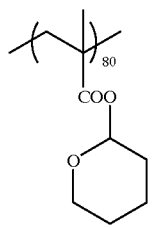 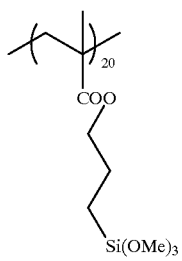
(1-10) 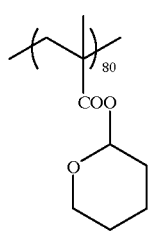 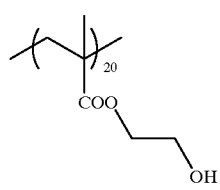
 
(1-11) 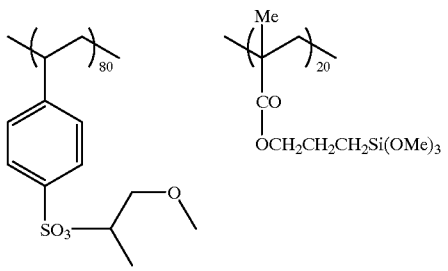
(1-12) 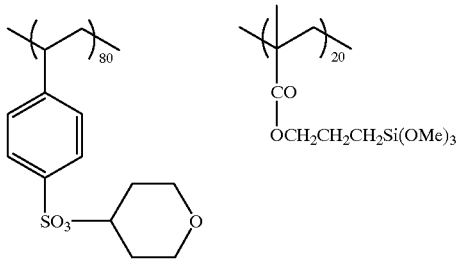
(1-13) 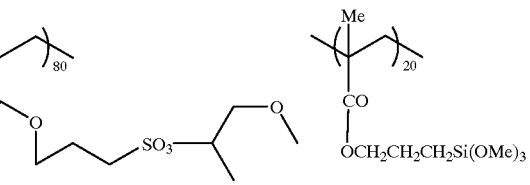
(1-14) 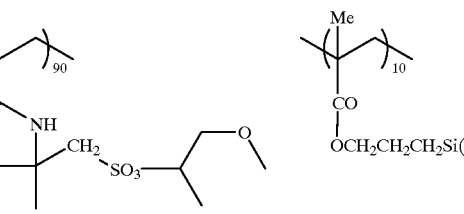
(1-15) 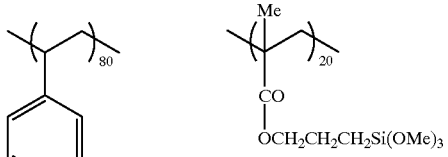
(1-16) 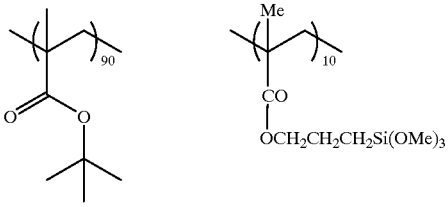

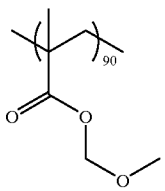 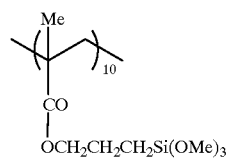

(1-17)

[Hydrolysis Polymerizible Compound]

Next, the hydrolysis polymerizible compound of the eighteenth aspect of the present invention will be described. This hydrolysis polymerizible compound is a compound which crosslinks the above-described copolymer.

The hydrolysis polymerizible compound used in the present invention is a compound represented by following general formula (15).

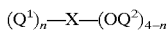

$(Q^1)_n$—X—$(OQ^2)_{4-n}$  General Formula (15)

In general formula (15), $Q^1$ and $Q^2$ each represent an alkyl group or an aryl group, and may be the same or different. X represents Si, Al, Ti, or Zr, and n is an integer of from 0 to 2. When $R_1$ or $R_2$ represents an alkyl group, the number of carbon atoms is preferably 1 to 4. Further, the alkyl group and the aryl group may have a substituent group. It is preferable that the compound is a low molecular weight compound having a molecular weight of 1000 or less.

Examples of the hydrolysis polymerizible compound which contains aluminum are trimethoxyaluminate, triethoxyaluminate, tripropoxyaluminate, tetraethoxyaluminate, and the like. Examples of the hydrolysis polymerizible compound which contains titanium are trimethoxytitanate, tetramethoxytitanate, triethoxytitanate, tetraethoxytitanate, tetrapropoxytitanate, chlorotrimethoxytitanate, chlorotriethoxytitanate, ethyltrimethoxytitanate, methyltriethoxytitanate, ethyltriethoxytitanate, diethyldiethoxytitanate, phenyltrimethoxytitanate, phenyltriethoxytitanate, and the like. Examples of the hydrolysis polymerizible compound which contains zirconium are the same as those compounds listed above for titanium, except that they contain zirconate rather than titanate.

Examples of the hydrolysis polymerizible compound which contains silicon are trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, diphenyldiethoxysilane, and the like. Particularly preferred among these are tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, diphenyldiethoxysilane, and the like.

A single type of hydrolysis polymerizible compound may be used, or two or more types of hydrolysis polymerizible compounds may be used. Further, after partial hydrolysis, dehydration condensation may be carried out.

In the eighteenth aspect of the present invention, the amount of the hydrolysis polymerizible compound is preferably 3 to 95 wt %, and more preferably 10 to 80 wt % with respect to the total amount of solids in the photosensitive layer.

[Water-Insoluble Solid Particles]

Next, the water-insoluble solid particles as the aforementioned fourth and fifth aspects of the present invention will be described. These water-insoluble solid particles are at least one type of solid particles selected from the group consisting of inorganic particles, organic particles, and metal particles.

The average particle diameter of each of the particles is about 10 μm or less, preferably 0.01 to 10 μm, and more preferably 0.1 to 5 μm. When the average particle diameter is less than 0.01 μm, the water holding property of the portions irradiated by laser light is insufficient, and it is easy for stains to form. When the average particle diameter exceeds 10 μm, the resolution of the printed matter deteriorates, adhesion to the substrate deteriorates, and it becomes easy for the particles in the vicinity of the surface to be removed.

Examples of the inorganic particles include metal oxides such as iron oxide, zinc oxide, titanium dioxide, zirconia, and the like; silicon-containing oxides (also called white carbons) such as silicic acid anhydride, calcium silicate hydrate, aluminum silicate hydrate and the like which themselves do not absorb light in the visible range; clay mineral particles such as clay, talc, kaolin, zeolite, and the like; and the like.

Examples of metal particles are particles of iron, aluminum, copper, nickel, silver, and the like.

The contained amount of inorganic particles or metal particles is about 2 to 90 volume %, preferably 5 to 80 volume %, and more preferably 10 to 50 volume %, with respect to the entire amount of solids in the photosensitive layer. When the contained amount is less than 2 volume %, the water holding property at the laser light illuminated portions of the surface of the radiation sensitive lithographic form plate is insufficient, and it becomes easy for stains to form. When the contained amount exceeds 90 volume %, the strength of the coated film deteriorates, the durability deteriorates, and the adhesion between the coated film layer and the substrate deteriorates.

The contained amount of organic particles is about 3 to 70 volume %, preferably 5 to 60 volume %, and more preferably 10 to 50 volume %, with respect to the entire amount of solids in the photosensitive layer. When the contained amount is less than 3 volume %, the water holding property is insufficient, and it becomes easy for stains to form. When the contained amount exceeds 70 volume %, the strength of the photosensitive layer deteriorates, the durability deteriorates, and it becomes easy for the adhesion between the photosensitive layer and the substrate to deteriorate.

Examples of the organic particles are polystyrene particles (particle diameter: 4 to 10 μm), silicone resin particles (particle diameter: 2 to 4 μm), and the like. Examples of crosslinked resin particles include microgel (particle diameter: 0.01 to 1 μm) formed from two or more ethylene unsaturated monomers, crosslinked resin particles (particle diameter: 4 to 10 μm) formed from styrene and divinylbenzene, crosslinked resin particles (particle diameter: 4 to 10 μm) formed from methylmethacrylate and diethyleneglycoldimethacrylate, and the like. Namely, acrylic resin microgels, crosslinked polystyrenes, crosslinked methylmethacrylates, and the like are examples of the crosslinked resin particles. These organic particles are prepared by any of general methods such as emulsion polymerization, soap-free emulsion polymerization, seed emulsion polymerization, dispersion polymerization, suspension polymerization, or the like.

The inorganic particles may be prepared from a solution. For example, a metal lower alkoxide may be added to a solvent such as ethanol so as to obtain inorganic particles containing metal in the presence of water and an acid or an alkali. An inorganic particle dispersed solution may be prepared by adding the obtained inorganic particle solution to a thermoplastic polymer solution which is soluble in solvent. Or, inorganic particles containing metal may be obtained by first adding a metal lower alkoxide to a thermoplastic polymer solution, and thereafter, adding water and an acid or an alkali.

In a case in which inorganic particles are prepared by adding a metal lower alkoxide to a thermoplastic polymer precursor solution, a complex of the metal and the polymer is obtained when the thermoplastic polymer precursor is made to be to a thermoplastic polymer by heat. Tetraethoxysilane, tetraethoxytitanium and the like may be used as the metal lower alkoxide.

Before discussing the Examples of the present invention, several path schemes for forming the photosensitive layer, which is a water insoluble structure, will be given hereinafter by using schematic diagrams.

SCHEME 1

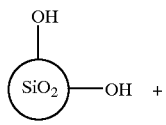
silicic anhydride

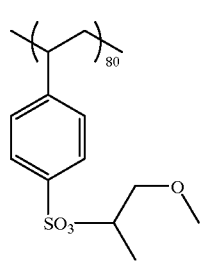

SCHEME 2

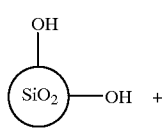

SCHEME 3

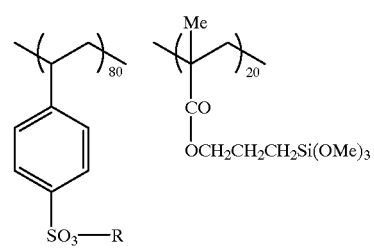

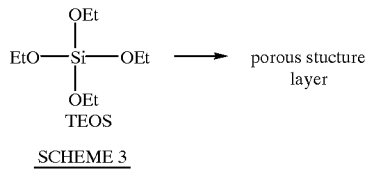

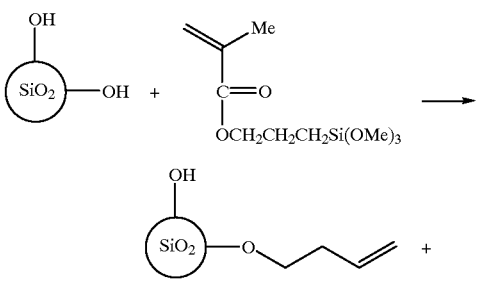

SCHEME 4

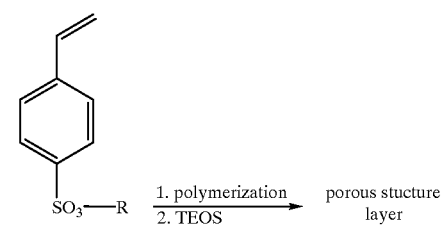

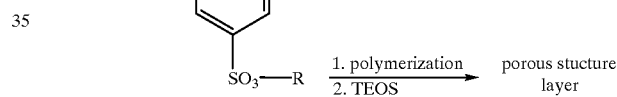

SCHEME 5

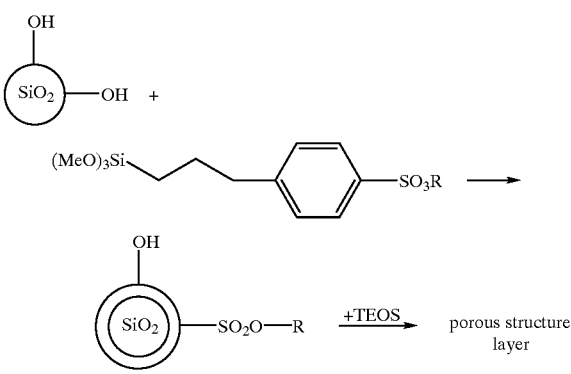

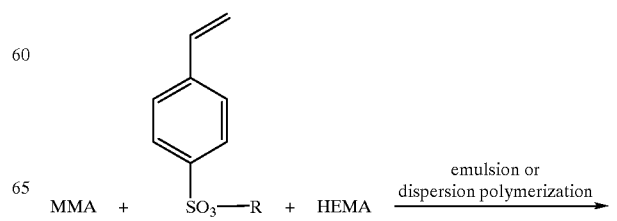

-continued

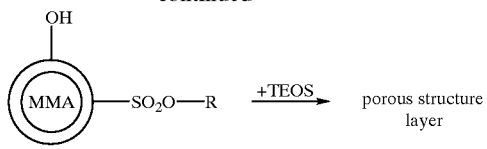

Note:
MMA : methylmethacrylate
HEMA : hydroxyethylmethacrylate

In the above schematic diagrams, schemes 1 and 2 are examples in which the photosensitive layer, which is a porous structure, is prepared by mixing compound A, a hydrolysis polymerization reaction product and water-insoluble solid particles. In scheme 1, silica particles are used as the water-insoluble solid particles, and in scheme 2, silica particles which are surface-modified in advance are used as the water-insoluble solid particles. In the schematic diagrams, R is a substituent group such as a modifier group for each compound or solid, or the like. The respective Rs may be the same or different.

In schemes 3 and 4, after a silane coupling agent (hydrolysis polymerization reaction product) is made to act on the silica particles in advance, a hydrolysis polymerization reaction product, which may be different than that mentioned above, is added such that a reaction takes place to form the porous structure. In scheme 3, the surfaces of the particles have been modified with a polymerizible monomer.

In scheme 5, organic polymer particles are first formed by emulsion polymerization or dispersion polymerization.

More specifically, in scheme 3, particle surfaces having polymerizible groups are formed by using a silane coupling agent as the hydrolysis polymerization reaction product. Thereafter, a compound having a sensitive group and particles having reactive groups are prepared, and then the porous structure is prepared by using the hydrolysis polymerization reaction product.

In scheme 4, particles having the intended sensitivity are directly prepared by using a silane coupling agent. Thereafter, the porous structure is prepared by using the hydrolysis polymerization reaction product.

EXAMPLES

The present invention will be described in further detail hereinafter in accordance with the following Examples. However, it is to be understood that the present invention is not limited to these Examples.

Examples 1–8

40 mg of a 50% phosphoric acid aqueous solution was added to a solution containing 0.4 g of above compound I-11 as compound A (the binder), 0.4 g of tetraethoxysilane as the hydrolysis polymerizible compound, 40 mg of one of the infrared light absorbing agents listed in following Table 3, and 1.6 g of methylethylketone, and the resultant mixture was stirred for 10 minutes. Thereafter, to this dispersion liquid was added 4 g of a 10% methylethylketone dispersion liquid of silica gel particles (trade name: Silicia #445, manufactured by: Fuji Silicia Kagaku Co., particle diameter as measured by the Coulter counter method: 3.5 µm) dispersed in a paint shaker by using glass beads, so as to form a coating liquid. The coating liquid was applied by using a rod bar #20 onto the surface of a PET substrate which had been subjected to corona charging processing.

The obtained radiation-sensitive lithographic form plate was subjected to image formation by using a semiconductor laser (wavelength: 830 nm; beam diameter: 14 µm) which was adjusted to a linear velocity of 10 m/sec and a plate surface output of 200 mW. The lithographic form plate was not subjected to any processings thereafter. Printing was then carried out on a Heidelberg printer. After printing 3000 copies, the 3000th copy was observed to determine whether there were stains in the non-image portions. The results are listed in following Table 3.

Comparative Examples 1–2

Radiation-sensitive lithographic form plates were prepared in the same manner as in Examples 1–8, except that the infrared light absorbing agents used in Examples 1–8 were replaced by the following Reference Compound 4 (for Comparative Example 1) and Comparative Example Compound 5 (for Comparative Example 2). Printing was carried out in the same manner as for Examples 1–8, and the 3000th copy was observed to determine whether there were stains in the non-image portions. The results are listed in following Table 3.

Reference Compound 4

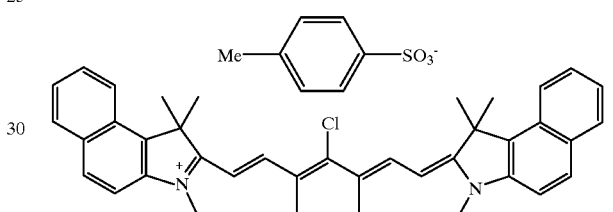

Reference Compound 5

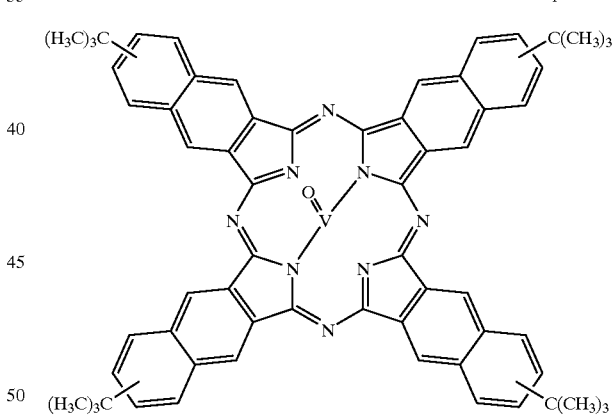

TABLE 3

| Example/<br>Comp. Ex.<br>Number | Infrared Light<br>Absorbing Agent | Stains in Non-Image Portions<br>after Printing 3000 Copies |
| --- | --- | --- |
| Example 1 | Compound 3 | None |
| Example 2 | Compound 12 | None |
| Example 3 | Compound 4 | None |
| Example 4 | Compound 6 | None |
| Example 5 | Compound 10 | None |
| Example 6 | Compound 19 | None |
| Example 7 | Compound 22 | None |
| Example 8 | Compound 25 | None |
| Comp. Ex. 1 | Reference<br>Compound 4 | Some stains |

TABLE 3-continued

| Example/Comp. Ex. Number | Infrared Light Absorbing Agent | Stains in Non-Image Portions after Printing 3000 Copies |
|---|---|---|
| Comp. Ex. 2 | Reference Compound 5 | Some stains |

As can be seen from Table 3, in accordance with the present invention, good printed matter, in which there were no stains in the exposed portions up through the 3000th copy, was obtained. However, in the radiation-sensitive lithographic form plate of each Comparative Example, there were stains in the exposed portions which is unsatisfactory.

Examples 9–11 and Comparative Examples 3–4

Radiation-sensitive lithographic form plates were obtained in the same manner as in Examples 1–8, except that no silica gel was added, and the infrared light absorbing agents listed in Table 4 were used in place of those listed in Table 3. Printing was carried out in the same manner as in Examples 1–8, and staining of the non-image portions of the 1000th copy and the 3000th copy was observed. The results are listed in following Table 4.

TABLE 4

| Example/Comp. Ex. Number | Infrared Light Absorbing Agent | Stains in Non-Image Portions after Printing | |
|---|---|---|---|
| | | 1000th Copy | 3000th Copy |
| Example 9 | Compound 1 | None | Very few stains |
| Example 10 | Compound 23 | None | Very few stains |
| Example 11 | Compound 26 | None | Very few stains |
| Comp. Ex. 3 | Reference Compound 4 | Stains | Stains |
| Comp. Ex. 4 | Carbon black* | Stains | Stains |

*Carbon black: MH-1 Black #5257m manufactured by Mikuni Kagaku Co.

As can be seen from Table 4, even if silica gel particles are not added, by using the infrared light absorbing agent of the present invention which has a thermally decomposable sulfonic ester group, good printed matter, in which there were no stains in the exposed portions up through the 1000th copy, was obtained. In contrast, in the radiation-sensitive lithographic form plate of each Comparative Example, there were stains in the exposed portions which is unsatisfactory.

Examples 12–19 and Comparative Examples 5–6

Radiation-sensitive lithographic form plates were obtained in the same manner as in Examples 1–8, except that the infrared light absorbing agents listed in Table 5 were used in place of those listed in Table 3. Printing was carried out in the same manner as in Examples 1–8, and staining of the non-image portions of the 5000th copy was observed. The results are listed in following Table 5.

TABLE 5

| Example/Comp. Ex. Number | Infrared Light Absorbing Agent | Stains in Non-Image Portions after Printing 5000 Copies |
|---|---|---|
| Example 12 | Compound 27 | None |
| Example 13 | Compound 28 | None |

TABLE 5-continued

| Example/Comp. Ex. Number | Infrared Light Absorbing Agent | Stains in Non-Image Portions after Printing 5000 Copies |
|---|---|---|
| Example 14 | Compound 29 | None |
| Example 15 | Compound 30 | None |
| Example 16 | Compound 31 | None |
| Example 17 | Compound 32 | None |
| Example 18 | Compound 33 | None |
| Example 19 | Compound 34 | None |
| Comp. Ex. 5 | Reference Compound 4 | Some stains |
| Comp. Ex. 6 | Reference Compound 5 | Some stains |

As can be seen from Table 5, in accordance with the present invention, good printed matter, in which there were no stains in the exposed portions up through the 5000th copy, was obtained. However, in the radiation-sensitive lithographic form plate of each Comparative Example, there were stains in the exposed portions which is unsatisfactory.

Examples 19–21 and Comparative Examples 7–8

Radiation-sensitive lithographic form plates were obtained in the same manner as in Examples 1–8, except that no silica gel was added, and the infrared light absorbing agents listed in Table 4 were used in place of those listed in Table 3. Printing was carried out in the same manner as in Examples 1–8, and staining of the non-image portions of the 3000th copy and the 5000th copy was observed. The results are listed in following Table 6.

TABLE 6

| Example/Comp. Ex. Number | Infrared Light Absorbing Agent | Stains in Non-Image Portions after Printing | |
|---|---|---|---|
| | | 3000th Copy | 5000th Copy |
| Example 20 | Compound 27 | None | Very few stains |
| Example 21 | Compound 36 | None | Very few stains |
| Example 22 | Compound 30 | None | Very few stains |
| Comp. Ex. 7 | Reference Compound 4 | Stains | Stains |
| Comp. Ex. 8 | Carbon black* | Stains | Stains |

*Carbon black: MH-1 Black #5257m manufactured by Mikuni Kagaku Co.

The infrared light absorbing agents of the present invention in above Table 6 have on an aromatic ring, either directly or via a binding group, a hydrophobic functional group which changes to hydrophilic due to heat. As can be seen from Table 6, even if silica gel particles are not added, by using these infrared light absorbing agents of the present invention, good printed matter, in which there were no stains in the exposed portions up through the 3000th copy, were obtained. In contrast, in the radiation-sensitive lithographic form plate of each Comparative Example, there were stains in the exposed portions which is unsatisfactory.

What is claimed is:

1. An infrared light absorbing agent represented by following general formula (1):

General Formula (1)

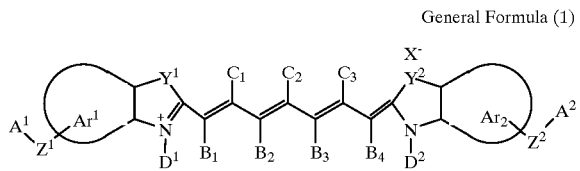

wherein $A^1$ and $A^2$ each independently represents a hydrophobic functional group which changes to hydrophilic due to heat; $Ar^1$ and $Ar^2$ each independently represents an aryl group; $B^1$, $B^2$, $B^3$, $B^4$, $C^1$, $C^2$, $C^3$ each independently represents hydrogen, a halogen, an alkyl group, an aryl group, an alkenyl group or an alkynyl group, and any two of $B^1$, $B^2$, $B^3$, $B^4$, $C^1$, $C^2$, $C^3$ may form a ring; $D^1$ and $D^2$ each independently represents an alkyl group, an aryl group, an alkenyl group, or an alkynyl group; $X^-$ represents a counter anion; and $Y^1$, $Y^2$, $Z^1$, $Z^2$ each independently represent a divalent binding group formed from nonmental atoms.

2. An infrared light absorbing agent of claim 1, wherein $A^1$ is represented by following general formula (3):

General formula (3)

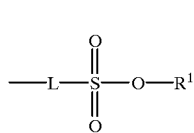

wherein L represents a polyvalent binding group formed from nonmetal atoms; and $R^1$ represents an alkyl group, an aryl group, an alkenyl group, an alkynyl group, or a cyclic imide group.

3. An infrared light absorbing agent of claim 1, wherein $A^2$ is represented by following general formula (3):

General formula (3)

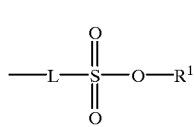

wherein L represents a polyvalent binding group formed from nonmetal atoms; and $R^1$ represents an alkyl group, an aryl group, an alkenyl group, an alkynyl group, or a cyclic imide group.

4. An infrared light absorbing agent of claim 2, wherein $R^1$ especially represents an alkyl group.

5. An infrared light absorbing agent of claim 3, wherein $R^1$ especially represents an alkyl group.

6. An infrared light absorbing agent represented by following general formula (16):

General Formula (16)

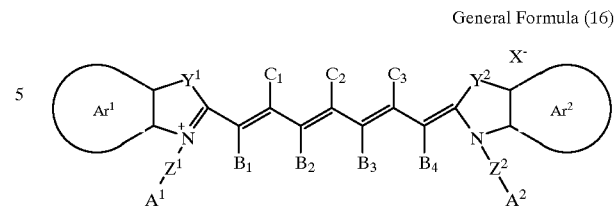

wherein $A^1$ and $A^2$ each independently represents a hydrophobic functional group which changes to hydrophilic due to heat; $Ar^1$ and $Ar^2$ each independently represents an aryl group; $B^1$, $B^2$, $B^3$, $B^4$, $C^1$, $C^2$, $C^3$ each independently represents hydrogen, a halogen, an alkyl group, an aryl group, an alkenyl group or an alkynyl group, and any two of $B^1$, $B^2$, $B^3$, $B^4$, $C^1$, $C^2$, $C^3$ may form a ring; $X^-$ represents a counter anion; and $Y^1$, $Y^2$, $Z^1$, $Z^2$ each independently represents a divalent binding group formed from nonmetal atoms.

7. An infrared light absorbing agent of claim 6, wherein $A^1$ is represented by following general formula (3):

General formula (3)

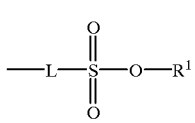

wherein L represents a polyvalent binding group formed from nonmetal atoms; and $R^1$ represents an alkyl group, an aryl group, an alkenyl group, an alkynyl group, or a cyclic imide group.

8. An infrared light absorbing agent of claim 6, wherein $A^2$ is represented by following general formula (3):

General formula (3)

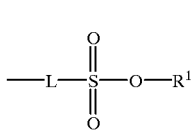

wherein L represents a polyvalent binding group formed from nonmetal atoms; and $R^1$ represents an alkyl group, an aryl group, an alkenyl group, an alkynyl group, or a cyclic imide group.

9. An infrared light absorbing agent of claim 7, wherein $R^1$ especially represents an alkyl group.

10. An infrared light absorbing agent of claim 8, wherein $R^1$ especially represents an alkyl group.

* * * * *